United States Patent
Nakashiba et al.

(10) Patent No.: US 7,330,612 B2
(45) Date of Patent: Feb. 12, 2008

(54) MATERIAL FOR SUBSTRATE MOUNTING OPTICAL CIRCUIT-ELECTRIC CIRCUIT MIXEDLY AND SUBSTRATE MOUNTING OPTICAL CIRCUIT-ELECTRIC CIRCUIT MIXEDLY

(75) Inventors: Tooru Nakashiba, Osaka (JP); Kouhei Kotera, Osaka (JP); Tomoaki Matsushima, Osaka (JP); Yukio Matsushita, Osaka (JP); Hideo Nakanishi, Osaka (JP); Shinji Hashimoto, Osaka (JP); Tomoaki Nemoto, Osaka (JP); Hiroyuki Yagyu, Osaka (JP); Yuuki Kasai, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 119 days.

(21) Appl. No.: 10/515,175

(22) PCT Filed: May 27, 2003

(86) PCT No.: PCT/JP03/06569

§ 371 (c)(1),
(2), (4) Date: Dec. 23, 2004

(87) PCT Pub. No.: WO03/100486

PCT Pub. Date: Dec. 4, 2003

(65) Prior Publication Data
US 2005/0238278 A1     Oct. 27, 2005

(30) Foreign Application Priority Data
May 28, 2002 (JP) .............................. 2002-154809
May 28, 2002 (JP) .............................. 2002-154810

(51) Int. Cl.
*G02B 6/12* (2006.01)

(52) U.S. Cl. ......................... 385/14; 385/129; 385/131
(58) Field of Classification Search .................. 385/14, 385/129–132
See application file for complete search history.

(56) References Cited

U.S. PATENT DOCUMENTS 4,376,160 A     3/1983 Evanchuk (Continued)

FOREIGN PATENT DOCUMENTS

EP     0687925     12/1995

(Continued)

OTHER PUBLICATIONS

K. Imoto et al., The Institute of Electronics, Information and Communication Engineers Sogo Taikai, pp. 519, together with a partial English language translation of the same.

(Continued)

*Primary Examiner*—Kevin S Wood
(74) *Attorney, Agent, or Firm*—Greenblum & Bernstein, P.L.C.

(57) ABSTRACT

A material for an optical circuit-electrical circuit mixedly mounting substrate comprises a light permeable resin layer, and an optical circuit forming layer that is made of a light permeable resin of which refractive index increases (or decreases) when irradiated with an activating energy beam and is disposed adjacent to the light permeable resin layer, wherein a refractive index of a portion of the optical circuit forming layer is higher (or lower) than that of the light permeable resin layer when the material for the optical circuit-electrical circuit mixedly mounting substrate is irradiated with an activating energy beam so that said portion is irradiated.

4 Claims, 33 Drawing Sheets

U.S. PATENT DOCUMENTS

| | | |
|---|---|---|
| 4,472,020 A | 9/1984 | Evanchuk |
| 5,054,872 A | 10/1991 | Fan et al. |
| 5,572,619 A | 11/1996 | Maruo et al. |
| 5,699,461 A | 12/1997 | Minemoto et al. |
| 6,438,281 B1 | 8/2002 | Tsukamoto et al. |
| 6,537,723 B1 | 3/2003 | Toyoda et al. |
| 2002/0051599 A1 | 5/2002 | Tsukamoto et al. |
| 2003/0148228 A1 | 8/2003 | Toyoda et al. |
| 2004/0175650 A1 | 9/2004 | Toyoda et al. |
| 2004/0175651 A1 | 9/2004 | Toyoda et al. |
| 2004/0175655 A1 | 9/2004 | Toyoda et al. |

FOREIGN PATENT DOCUMENTS

| | | |
|---|---|---|
| EP | 0717294 | 6/1996 |
| EP | 1041418 | 10/2000 |
| GB | 2191603 | 12/1987 |
| JP | 6-281831 | 10/1994 |
| JP | 9-281352 | 10/1997 |
| JP | 10-232323 | 9/1998 |
| JP | 2000-180643 | 6/2000 |
| JP | 2000-298217 | 10/2000 |
| JP | 2000-321455 | 11/2000 |
| JP | 2000-340957 | 12/2000 |
| JP | 2001-015889 | 1/2001 |
| JP | 2001-166165 | 6/2001 |
| JP | 2001-196494 | 7/2001 |
| JP | 2002-006161 | 1/2002 |
| JP | 2002-053667 | 2/2002 |
| JP | 2003-057478 | 2/2003 |

OTHER PUBLICATIONS

K. Imoto et al., The Institute of Electronics, Information and Communication Engineers Gijutsu Kenkyu Hokoku, vol. 102, No. 47, pp. 25-30, together with an English language abstract of the same.

English Language Abstract of JP2001-15889.
English Language Abstract of JP 2003-57478.
English Language Abstract of JP2002-053667.
English Language Abstract of JP10-232323.
English Language Abstract of JP6-281831.
English Language Abstract of JP 2000-340957.
English Language Abstract of JP2001-166165.
English Language Abstract of JP 2002/6161.
English Language Abstract of JP2001-196494.
English Language Abstract of JP 2000-298217.
English Language Abstract of JP2000-321455.
English Language Abstract of JP 9-281352.
English Language Abstract of JP 6-281831.

(a)

(b)

(c)

(d)

(e)

(a)

(b)

(a)

(b)

(a)

(b)

(a)

(b)

MATERIAL FOR SUBSTRATE MOUNTING OPTICAL CIRCUIT-ELECTRIC CIRCUIT MIXEDLY AND SUBSTRATE MOUNTING OPTICAL CIRCUIT-ELECTRIC CIRCUIT MIXEDLY

TECHNICAL FIELD

The present invention relates to a material which can be used as a raw material for manufacturing a substrate including an optical circuit (a circuit that transmits light) and an electrical circuit (or electrical wiring) together, that is a substrate which mounts an optical circuit and an electrical circuit mixedly (or together) (hereinafter which substrate is also referred to as an "optical circuit-electrical circuit mixedly mounting substrate"), and a method for manufacturing the optical circuit-electrical circuit mixedly mounting substrate. According to the present invention, the optical circuit and the electrical circuit may respectively be a part thereof, and in this respect the optical circuit and the electrical circuit may be an optical line or an optical waveguide and an electrical wiring, respectively. The optical circuit-electrical circuit mixedly mounting substrate is also referred to as an "electrical-optical circuit board."

BACKGROUND ART

Recently, as the adoption of broadband technology in the communication infrastructure proceeds in an explosive pace and the information processing capacity of computers and other hardware increases at a dramatic pace, there are increasing needs for an information processing circuit that has a very fast information transmission line. Thus as a means for breaking through the limit of transmission speed of electrical signals, transmission of information in the form of optical signals has been studied and various attempts have been made on the technology to mount an optical circuit on a substrate that has an electrical circuit formed thereon.

The basic idea of mounting the electrical circuit and the optical circuit together is to form in addition to the existing electrical circuit the optical circuit on the conventional printed circuit board. For the manufacture of the optical circuit-electrical circuit mixedly mounting substrate where the optical circuit and the electrical circuit are stacked in multiple layers, the following two methods have mainly been proposed:

With one method, a cladding layer, a core layer and a cladding layer that constitute an optical waveguide of the optical circuit are stacked one on another on a substrate whereon an electrical circuit has been formed, and an electrical wiring layer is further formed thereon by plating or the like.

With the other method, a cladding layer, a core layer and a cladding layer are stacked one on another on a dummy circuit board to form an optical waveguide that constitutes an optical circuit, then the optical waveguide is bonded onto a printed circuit board followed by removing the dummy circuit board, and an electrical circuit is formed on the optical waveguide by plating or the like. Reference may be made for this method to, for example, Japanese Unexamined Patent Publication No. 2001-15889.

The methods mentioned above have such problems that a number of steps is large which are required for stacking by forming the optical circuit and the electrical circuit successively. The accuracy of wiring is low when forming the electrical circuit by plating as is the common practice in the prior art. Thus it is difficult to manufacture high-quality optical circuit-electrical circuit mixedly mounting substrates stably on a industrial basis.

DISCLOSURE OF THE INVENTION

Considering the above described problems, the present invention has an object of providing a material for an optical circuit-electrical circuit mixedly mounting substrate which allows the production of the optical circuit-electrical circuit mixedly mounting substrate of a high quality with a simple method by using the conventional printed circuit board manufacturing technology, and providing a method for manufacturing the optical circuit-electrical circuit mixedly mounting substrate.

In this specification, the material for the optical circuit-electrical circuit mixedly mounting substrate has an "optical circuit forming layer" as a constituent layer thereof. The "optical circuit forming layer" refers to a layer in which at least a core of a light propagating waveguide can be formed. The core is the portion through which the light is transmitted, and corresponds to the abovementioned optical circuit.

"Activating energy beam" refers to electromagnetic radiation that has energy enough to change a solubility to solvent or a refractive index of a resin that constitutes the optical circuit forming layer (that is, to activate the resin so as to change the property for that purpose) when forming such a waveguide. The activating energy beam may be for example ultraviolet ray, laser beam of various wavelengths, electron beam, X-ray or the like. These various activating energy beam may be regarded as a kind of light in its broad sense.

When the solubility to solvent or the refractive index of the optical circuit forming layer changes with the irradiation of the activating energy beam, it is desirable that the solubility to solvent or the refractive index of the other components (for example, a light permeable resin layer) that constitute the material for optical circuit-electrical circuit mixedly mounting substrate does not substantially change. However, in the case wherein it does change, the refractive index of the core that constitutes the optical waveguide is higher than those of portions around the core after the irradiation.

In a first aspect, the present invention provides a material for an optical circuit-electrical circuit mixedly (or together) mounting substrate comprising:

a light permeable (or transparent) resin layer, and an optical circuit forming layer that is made of a light permeable resin of which refractive index increases when irradiated with an activating energy beam and is disposed adjacent to the light permeable resin layer, wherein a refractive index of a portion of the optical circuit forming layer is higher than that of the light permeable resin layer after the material for the optical circuit-electrical circuit mixedly mounting substrate is irradiated with an activating energy beam so that said portion is irradiated. The material for the optical circuit-electrical circuit mixedly mounting substrate is a composite material wherein at least two layers are stacked, namely a laminate structure.

The material according to the first aspect has the light permeable resin layer (or a transparent resin layer) and the optical circuit forming layer adjoining thereto, and the optical circuit forming layer is made of the light transparent resin of which refractive index increases when irradiated with the activating energy beam. When the activating energy beam is applied to the material for the optical circuit-electrical circuit mixedly mounting substrate so that a portion of the optical circuit forming layer is irradiated with the activating energy beam, a refractive index of the irradiated portion increases to be higher than that of the non-irradiated portion in the optical circuit forming layer. Since the portion irradiated with the activating energy beam and the portion not irradiated are located adjacently to each other, the irradiated portion functions as a core of the optical waveguide, while the non-irradiated portions located on both sides thereof (for example, on the right and left sides thereof; refer to a higher refractive index portion 3a and a lower refractive index portion 3b in FIG. 4(b) which will be explained later) can function as cladding portions of the optical waveguide.

Therefore, when layers made of a resin that has a lower refractive index or layers that can reflect light (for example, metal layers) formed on the remaining sides (for example, an upper and lower sides) of the core, those layers can function as cladding layers, so that light can propagate within the core of the optical circuit forming layer, thereby resulting in the formation of an optical waveguide. In the first aspect, the light permeable resin layer can provide a cladding member on one (for example, a top side) side of the remaining sides of the core. Therefore, the refractive index of the light permeable resin layer must be lower than the refractive index of the optical circuit forming layer that has increased when irradiated with the activating energy beam. This relative relationship of the refractive indexes is not essential at a time before the irradiation of the activating energy beam. For example, at a time before the irradiation, the refractive index of the light permeable resin layer may be higher than the refractive index of the optical circuit forming layer. It is generally preferable that the refractive index of the light permeable resin layer does not substantially change by the irradiation, and is lower than the refractive index of the optical circuit forming layer.

In the material for the optical circuit-electrical circuit mixedly mounting substrate of the present invention according to the first aspect, a core layer of the optical waveguide can be formed with the irradiated portion of the optical circuit forming layer and cladding layers can be formed with the non-irradiated portion of the optical circuit forming layer and with the light permeable resin layer by irradiating the optical circuit forming layer with the activating energy beam, while an electrical wiring can be formed by of metal layer processing (or a wiring pattern forming process), so that an optical circuit and an electrical circuit can be carried together by the same substrate, thus making it possible to manufacture the optical circuit-electrical circuit mixedly mounting substrate with the high quality in a simple method by using the conventional printed circuit board manufacturing technology.

In a second aspect, the present invention provides a material for an optical circuit-electrical circuit mixedly mounting substrate comprising:

a light permeable resin layer, and an optical circuit forming layer that is made of a light permeable resin of which refractive index decreases when irradiated with an activating energy beam and is disposed adjacent to the light permeable resin layer, wherein after the material for the optical circuit-electrical circuit mixedly mounting substrate with an activating energy beam so as to irradiate a portion of the optical circuit forming layer is irradiated, the refractive index of said portion is lower than that of the remaining non-irradiated portion of the optical circuit forming layer. The material for the optical circuit-electrical circuit mixedly mounting substrate is again a composite material as in the above wherein at least two layers are stacked, namely a laminate structure.

The material according to the second aspect has the light permeable resin layer and the optical circuit forming layer disposed adjacent thereto, while the optical circuit forming layer has a refractive index essentially higher than that of the light permeable resin layer and the optical circuit forming layer is made of a light permeable resin that decreases its refractive index when irradiated with the activating energy beam. When the activating energy beam is applied to the material for the optical circuit-electrical circuit mixedly mounting substrate so that a portion of the optical circuit forming layer is irradiated with the activating energy beam, the refractive index of the said portion of the optical circuit forming layer decreases to become lower than that of the rest of the optical circuit forming layer that has not been irradiated with the activating energy beam. Since the portion irradiated with the activating energy beam and the portion not irradiated are adjacent to each other, the non-irradiated portion can function as a core of the optical waveguide, while the irradiated portions located on both sides thereof (for example, on the right and left sides thereof; refer to a higher refractive index portion 4a and a lower refractive index portion 4b in FIG. 6(b) which will be explained later) can function as cladding layers of the optical waveguide.

Therefore, layers made of a resin that has a low refractive index or layers that can reflect light (for example, metal layers) formed on the remaining sides (for example, the upper and lower sides) of the core can function as cladding layers, similarly to the material for the optical circuit-electrical circuit mixedly mounting substrate of the first aspect, so that light can propagate within the core of the optical circuit forming layer, thereby resulting in the formation of an optical circuit. In the second aspect, the light permeable resin layer has a refractive index lower than that of the optical circuit forming layer (even after the irradiation with the activating energy beam), and therefore can provide a cladding member on one (for example, a top side) of the remaining sides of the core.

In the material for the optical circuit-electrical circuit mixedly mounting substrate of the present invention according to the second aspect, the core layer of the optical waveguide can be formed with the non-irradiated portion of the optical circuit forming layer and the cladding layers can be formed with the irradiated portion of the optical circuit forming layer and with the light permeable resin layer by irradiating the optical circuit forming layer with the activating energy beam, while an electrical wiring can be formed by metal layer processing so that an optical circuit and an electrical circuit can be formed together in the same substrate, thus making it possible to manufacture the optical circuit-electrical circuit-mixedly mounting substrate with the high quality in a simple method by using the conventional printed circuit board manufacturing technology.

In a third aspect, the present invention provides a material for the optical circuit-electrical circuit mixedly mounting substrate characterized as follows:

In addition to the light permeable resin layer (referred to also as the first light permeable resin layer in order to distinguish it from a second light permeable resin layer described just below), the second light permeable resin layer is provided in the material for the optical circuit-electrical circuit mixedly mounting substrate of the first aspect as described above wherein the optical circuit forming layer is disposed between the first light permeable resin layer and the second light permeable resin layer, and after the activating energy beam is applied to the material for the optical circuit-electrical circuit mixedly mounting substrate so that a portion of the optical circuit forming layer is irradiated with the activating energy beam, a refractive index of said portion of the optical circuit forming layer is higher than that of the second light permeable resin layer.

The material for the optical circuit-electrical circuit mixedly mounting substrate is a composite material wherein at least three layers are stacked one on another, namely a laminate structure.

In the material according to the third aspect, the optical circuit forming layer is interposed between the first light permeable resin layer and the second light permeable resin layer. After the irradiation with the activating energy beam, since refractive index of the portion of the optical circuit forming layer irradiated with the activating energy beam is higher than those of the two light permeable resin layers, these resin layers can provide cladding portions for the portion of the optical circuit forming layer as the core which portion is irradiated with the activating energy beam.

As described above, after the irradiation of the activating energy beam, the refractive index of the second light permeable resin layer must be lower than the refractive index of the irradiated portion of the optical circuit forming layer that has been increased by the irradiation of the material for the optical circuit-electrical circuit mixedly mounting substrate with the activating energy beam. This relative relationship between the refractive indexes is not essential before the irradiation of the activating energy beam. For example, at a time before the irradiation, the refractive index of the second light permeable resin layer may be higher than the refractive index of the optical circuit forming layer. It is generally preferable that the refractive index of the second light permeable resin layer does not substantially change by the irradiation, and is lower than the refractive index of the optical circuit forming layer.

In the material for the optical circuit-electrical circuit mixedly mounting substrate of the present invention according to the third aspect, the core layer of the optical waveguide can be formed with the irradiated portion of the optical circuit forming layer and the cladding layers can be formed with the non-irradiated portion of the optical circuit forming layer, the light permeable resin layer and with the second light permeable resin layer by irradiating the optical circuit forming layer with the activating energy beam, while an electrical wiring can be formed by metal layer processing so that an optical circuit and an electrical circuit can be formed together in the same substrate, thus making it possible to manufacture the optical circuit-electrical circuit mixedly mounting substrate with the high quality in a simple method by using the conventional printed circuit board manufacturing technology.

In a fourth aspect, the present invention provides a material for the optical circuit-electrical circuit mixedly mounting substrate characterized as follows:

In addition to the light permeable resin layer (referred to also as the first light permeable resin layer in order to distinguish it from a second light permeable resin layer described just below), the second light permeable resin layer is provided in the material for the optical circuit-electrical circuit mixedly mounting substrate of the second aspect as described above wherein the optical circuit forming layer is disposed between the first light permeable resin layer and the second light permeable resin layer, and after the activating energy beam is applied to the material for the optical circuit-electrical circuit mixedly mounting substrate so that a portion of the optical circuit forming layer is irradiated with the activating energy beam, a refractive index of the rest of the optical circuit forming layer is higher than that of the second light permeable resin layer.

The material for the optical circuit-electrical circuit mixedly mounting substrate is a composite material wherein at least three layers are stacked one on another, namely a laminate structure.

In the material according to the fourth aspect, the optical circuit forming layer is interposed between the first light permeable resin layer and the second light permeable resin layer. After the irradiation with the activating energy beam, since the refractive index of the portion of the optical circuit forming layer not irradiated with the activating energy beam is higher than those of the two light permeable resin layers, these resin layers can provide cladding portions for the portion of the optical circuit forming layer as the core which portion is not irradiated with the activating energy beam.

As described above, after the irradiation of the activating energy beam, the refractive index of the second light permeable resin layer must be lower than the refractive index of the portion of the optical circuit forming layer which portion has not been irradiated when the material for the optical circuit-electrical circuit mixedly mounting substrate is irradiated with the activating energy beam. This relative relationship between the refractive indexes is not essential before the irradiation of the activating energy beam. For example, upon the irradiation, the refractive index of the second light permeable resin layer may be decreased. It is generally preferable that the refractive index of the second light permeable resin layer does not substantially change by the irradiation, and is lower than the refractive index of the optical circuit forming layer.

In the material for the optical circuit-electrical circuit mixedly mounting substrate of the present invention according to the fourth aspect, the core layer of the optical waveguide can be formed with the non-irradiated portion of the optical circuit forming layer and the cladding layers can be formed with the irradiated portion of the optical circuit forming layer, the light permeable resin layer and with the second light permeable resin layer by irradiating the optical circuit forming layer with the activating energy beam, while an electrical wiring can be formed by metal layer processing so that an optical circuit and an electrical circuit can be formed together in the same substrate, thus making it possible to manufacture the optical circuit-electrical circuit mixedly mounting substrate with the high quality in a simple method by using the conventional printed circuit board manufacturing technology.

In a fifth aspect, the present invention provides a material for the optical circuit-electrical circuit mixedly mounting substrate comprising:

a light permeable resin layer, and an optical circuit forming layer that is made of a light permeable resin of which solubility to a solvent changes when irradiated with an activating energy beam and is disposed adjacent to the light permeable resin layer, wherein after the activating energy beam is applied to the material for the optical circuit-electrical circuit mixedly mounting substrate so that a portion of the optical circuit forming layer is irradiated with the activating energy beam, a refractive index of the optical circuit forming layer is higher than that of the light permeable resin layer;

said portion of the optical circuit forming layer irradiated with the activating energy beam changes from a state of being removable by dissolving into a solvent to a state of being insoluble; and the rest of the optical circuit forming layer that is not irradiated with the activating energy beam remains in the state of being removable by dissolving into the solvent.

The material according to the fifth aspect has the light permeable resin layer and the optical circuit forming layer disposed adjacent thereto, while the optical circuit forming layer is made of a light permeable resin of which solubility to the solvent changes when irradiated with the activating energy beam. When the activating energy beam is applied to the material for the optical circuit-electrical circuit mixedly mounting substrate so that a portion of the optical circuit forming layer is irradiated with the activating energy beam, the irradiated portion of the optical circuit forming layer changes to the state of being insoluble into the solvent so that it is not removable by the solvent, and the rest of the optical circuit forming layer remains in the state of being removable by dissolving into a solvent.

In the fifth aspect, the expression that "solubility to solvent changes when irradiated with the activating energy beam" means that the resin that constitutes the optical circuit forming layer changes from the state of being soluble in a particular solvent to the state of being insoluble to the solvent when irradiated with the activating energy beam. Namely, it is meant that by irradiating a portion of the optical circuit forming layer with the activating energy beam, the particular portion is changed from the state of being removable by dissolving into a particular solvent to the state of being insoluble in the solvent and therefore cannot be removed (the portion that has not been irradiated is removable by dissolving into the solvent).

In the fifth aspect, at least after being irradiated with the activating energy beam, the refractive index of the optical circuit forming layer is higher than the refractive index of the light permeable resin layer, and these layers are disposed adjacently to each other. Thus when a portion of the optical circuit forming layer is left to remain as a core, the light permeable resin layer can provide a cladding member for the core. When a layer having a refractive index lower than the refractive index of the core is disposed on side(s) of the rest of the core (for example, on a right, left and lower sides thereof; refer to FIG. 2(b) to be explained later), an optical waveguide surrounded by the materials each having lower refractive index can be formed.

According to the fifth aspect, a relative relationship between the refractive index of the optical circuit forming layer and the refractive index of the light permeable resin layer is not essential before the irradiation with the activating energy beam. For example, at a time before the irradiation, the refractive index of the light permeable resin layer may be higher than the refractive index of the optical circuit forming layer. It is generally preferable that the refractive indices of the optical circuit forming layer and the light permeable resin layer do not substantially change upon irradiation, and the refractive index of the optical circuit forming layer is higher than the refractive index of the light permeable resin layer.

In a sixth aspect, the present invention provides a material for the optical circuit-electrical circuit mixedly mounting substrate comprising:

a light permeable resin layer; and an optical circuit forming layer that is made of a light permeable resin of which solubility to a solvent changes when irradiated with an activating energy beam and is disposed adjacent to the light permeable resin layer, wherein, a refractive index of the optical circuit forming layer is higher than a refractive index of the light permeable resin layer; and after the activating energy beam is applied to the material for the optical circuit-electrical circuit mixedly mounting substrate so that a portion of the optical circuit forming layer is irradiated with the activating energy beam, said portion of the optical circuit forming layer irradiated with the activating energy beam changes from the state of not being removable by dissolving into a solvent to the state of being removable; and the rest of the optical circuit forming layer that has not been irradiated with the activating energy beam remains in the state of not being removable by dissolving into the solvent.

The material according to the sixth aspect has the light permeable resin layer and the optical circuit forming layer disposed adjacent thereto, while the optical circuit forming layer is made of a light permeable resin of which solubility to solvent changes when irradiated with the activating energy beam. When the activating energy beam is applied to the material for the optical circuit-electrical circuit mixedly mounting substrate so that a portion of the optical circuit forming layer is irradiated with the activating energy beam, the irradiated portion of the optical circuit forming layer changes to the state of being soluble in the solvent and removable, and the rest of the optical circuit forming layer remains in the state of not being removable by dissolving into the solvent.

In the sixth aspect, the expression that "solubility to solvent changes when irradiated with the activating energy beam" means that the resin that constitutes the optical circuit forming layer changes from the state of being not soluble in a particular solvent to the state of being soluble in the solvent when irradiated with the activating energy beam. Namely, it is meant that by irradiating a portion of the optical circuit forming layer with the activating energy beam, the particular portion is changed from the state of being not soluble in the particular solvent to the state of being soluble in the solvent and therefore can be removed (a portion that has not been irradiated is not removable by dissolving into the solvent).

In the sixth aspect, the refractive index of the optical circuit forming layer is intrinsically higher than the refractive index of the light permeable resin layer, and these layers are disposed adjacently to each other. Thus when a portion of the optical circuit forming layer is left to remain as a core by not dissolving into the solvent and not removing thereby, the light permeable resin layer can provide a cladding portion for the core. When a layer having refractive index lower than the refractive index of the core is disposed on the side of the rest of the core (for example, on a right side, a left side and a lower side thereof), an optical waveguide surrounded by the materials having a lower refractive index can be formed.

In the material for the optical circuit-electrical circuit mixedly mounting substrate of the present invention according to the fifth and sixth aspects, the core layer of the optical waveguide can be formed with the optical circuit forming layer and the cladding layer of the optical waveguide can be formed with the light permeable resin layer by irradiating the optical circuit forming layer with the activating energy beam followed by developing, while electrical wiring can be formed by metal layer processing so that an optical circuit and an electrical circuit can be formed together on the same circuit board, thus making it possible to manufacture the optical circuit-electrical circuit mixedly mounting substrate of the high quality with a simple method by using the conventional printed circuit board manufacturing technology.

In a seventh aspect, the present invention provides the following material for the optical circuit-electrical circuit mixedly mounting substrate:

In the material for the optical circuit-electrical circuit mixedly mounting substrate according to any one of the first to sixth aspects, it further comprises a metal layer, and the light permeable resin layer is disposed between the metal layer and the optical circuit forming layer.

The material for the optical circuit-electrical circuit mixedly mounting substrate of the seventh aspect is further provided with the metal layer. The metal layer is disposed on the side of the light permeable resin layer (namely, the first light permeable resin layer) which side is opposite to the side thereof to which the optical circuit forming layer is adjacent. The metal layer can constitute an electric circuit (including an electronic circuit) or an electric wiring layer by leaving a predetermined portion thereof to remain by an appropriate process. The metal layer can be of any proper form, such as foil, film, sheet or the like.

In an eighth aspect, the present invention provides a material for an optical circuit-electrical circuit mixedly mounting substrate comprising:

a metal layer, and an optical circuit forming layer that is made of a light permeable resin of which refractive index increases when irradiated with an activating energy beam and is disposed adjacent to the metal layer, wherein the refractive index of a portion of the optical circuit forming layer is higher than that of the rest of the optical circuit forming layer that is not irradiated with the activating energy beam after the material for the optical circuit-electrical circuit mixedly mounting substrate is irradiated with an activating energy beam so that said portion of the optical circuit forming layer is irradiated.

The material for the optical circuit-electrical circuit mixedly mounting substrate is a composite material wherein at least two layers are stacked, namely a laminate structure.

The material for the optical circuit-electrical circuit mixedly mounting substrate according to the eighth aspect is different from the material for the optical circuit-electrical circuit mixedly mounting substrate of the first aspect in that the metal layer is used instead of the light permeable resin layer. The optical circuit forming layer may be the same as the optical circuit forming layer in the material for the optical circuit-electrical circuit mixedly mounting substrate of the first aspect.

The material according to the eighth aspect has the light permeable resin layer and the metal layer adjoining thereto, and the optical circuit forming layer is made of a light permeable resin of which refractive index increases when irradiated with the activating energy beam. When the activating energy beam is applied to the material for the optical circuit-electrical circuit mixedly mounting substrate so that a portion of the optical circuit forming layer is irradiated with the activating energy beam, the refractive index of the irradiated portion of the optical circuit forming layer increases to be higher than that of the non-irradiated portion. Since the portion irradiated with the activating energy beam and the portion not irradiated are adjacent to each other, the irradiated portion can function as the core of the optical waveguide, while the non-irradiated portions located on both sides thereof (for example, on a right and left sides thereof) can function as cladding layers of the optical waveguide, similarly to the case of the material for the optical circuit-electrical circuit mixedly mounting substrate of the first aspect.

Therefore, layers made of a resin that has a lower refractive index or layers that reflects light (for example, metal layers) formed on the remaining surfaces (for example, an upper side and a lower side) of the core can function as cladding layers or reflectors, so that light can propagate within the core of the optical circuit forming layer. In the eighth aspect, the metal layer can provide a reflector layer on one (for example, a top side) of the remaining sides of the core.

In a ninth aspect, the present invention provides a material for an optical circuit-electrical circuit mixedly mounting substrate comprising:

a metal layer, and an optical circuit forming layer that is made of a light permeable resin of which refractive index decreases when irradiated with an activating energy beam and is disposed adjacently to the metal layer, wherein after the material for the optical circuit-electrical circuit mixedly mounting substrate is irradiated with the activating energy beam on a portion of the optical circuit forming layer, the refractive index of said portion of the optical circuit forming layer irradiated with the activating energy beam is lower than that of the rest of the optical circuit forming layer that is not irradiated with the activating energy beam.

The material for the optical circuit-electrical circuit mixedly mounting substrate is a composite material wherein at least two layers stacked one on another, namely a laminate structure.

The material for the optical circuit-electrical circuit mixedly mounting substrate according to the ninth aspect is different from the material for the optical circuit-electrical circuit mixedly mounting substrate of the second aspect in that the metal layer is used instead of the light permeable resin layer. The optical circuit forming layer itself may be the same as the optical circuit forming layer of the material for the optical circuit-electrical circuit mixedly mounting substrate of the second aspect.

The material according to the ninth aspect has the light permeable resin layer and the metal layer adjoining thereto, and the optical circuit forming layer is made of a light permeable resin of which refractive index increases when irradiated with the activating energy beam. When the activating energy beam is applied to the material for the optical circuit-electrical circuit mixedly mounting substrate so that a portion of the optical circuit forming layer is irradiated with the activating energy beam, the refractive index of the irradiated portion of the optical circuit forming layer decreases to be lower than that of the non-irradiated portion. Since the portion irradiated with the activating energy beam and the portion not irradiated are adjacent to each other, the irradiated portion can function as the core of the optical waveguide, while the non-irradiated portions located on both sides of the core (for example, on a right and left sides thereof; refer to a higher refractive index portion 5a and a lower refractive index portion 5b in FIG. 8(b) to be explained later) can function as cladding layers of the optical waveguide.

Therefore, layers made of a resin that has a lower refractive index or layers that can reflect light (for example, metal layers) formed on the remaining sides (for example, an upper side and a lower side) of the core can function as cladding layers or reflectors, so that light can propagate within the core of the optical circuit forming layer. In the ninth aspect, the metal layer can provide a reflector layer on one (for example, a top side) of the remaining sides of the core.

In the material for the optical circuit-electrical circuit mixedly mounting substrate of the present invention according to the eighth and ninth aspects, the core layer of the optical waveguide can be formed with one of the irradiated portion and the non-irradiated portion of the optical circuit forming layer, and the cladding layer can be formed with the other one of the irradiated portion and non-irradiated portion of the optical circuit forming layer by irradiating the optical circuit forming layer with the activating energy beam, while electrical wiring can be formed by processing of the metal layer so that an optical circuit and an electrical circuit can be formed together on the same circuit board, thus making it possible to manufacture the optical circuit-electrical circuit mixedly mounting substrate with the high quality with a simple method by using the conventional printed circuit board manufacturing technology.

In a tenth aspect, the present invention provides a material for the optical circuit-electrical circuit mixedly mounting substrate characterized as follows:

In the material for the optical circuit-electrical circuit mixedly mounting substrate of the eighth aspect, a light permeable resin layer is further provided, and the optical circuit forming layer is disposed between the metal layer and the light permeable resin layer and, when the activating energy beam is applied to the material for the optical circuit-electrical circuit mixedly mounting substrate so that a portion of the optical circuit forming layer is irradiated with the activating energy beam, the refractive index of said portion of the optical circuit forming layer is higher than that of the second light permeable resin layer after the irradiation.

In the material for the optical circuit-electrical circuit mixedly mounting substrate of the tenth aspect, similarly to the material for the optical circuit-electrical circuit mixedly mounting substrate of the eighth aspect, the metal layer provides a reflector layer, while the light permeable resin layer has a refractive index lower than that of the said portion at least after the irradiation with the activating energy beam or preferably regardless of whether before or after the irradiation, and is disposed to oppose the metal layer via the optical circuit forming layer. Therefore, the light permeable resin layer can provide a cladding member for said portion of the optical circuit forming layer which portion serves as the core.

In the material for the optical circuit-electrical circuit mixedly mounting substrate of the present invention according to the tenth aspect, the core layer of the optical waveguide can be formed with the irradiated portion of the optical circuit forming layer and the cladding layers can be formed with the non-irradiated portion of the optical circuit forming layer and with the light permeable resin layer by irradiating the optical circuit forming layer with the activating energy beam, while an electrical wiring can be formed by metal layer processing so that an optical circuit and an electrical circuit can be formed together on the same circuit board, thus making it possible to manufacture the optical circuit-electrical circuit mixedly mounting substrate with the high quality with a simple method by using the conventional printed circuit board manufacturing technology.

In an eleventh aspect, the present invention provides a material for the optical circuit-electrical circuit mixedly mounting substrate characterized as follows:

In the material for the optical circuit-electrical circuit mixedly mounting substrate according to the ninth aspect, the material for the optical circuit-electrical circuit mixedly mounting substrate, a light permeable resin layer is further provided, and the optical circuit forming layer is disposed between the metal layer and the light permeable resin layer and, when the activating energy beam is applied to the material for the optical circuit-electrical circuit mixedly mounting substrate so that a portion of the optical circuit forming layer is irradiated with the activating energy beam, the refractive index of the rest of the optical circuit forming layer that has not been irradiated with the activating energy is higher than that of the light permeable resin layer after the irradiation.

In the material for the optical circuit-electrical circuit mixedly mounting substrate of the eleventh aspect, similarly to the material for the optical circuit-electrical circuit mixedly mounting substrate of the ninth aspect, the metal layer can provide a reflector layer while the light permeable resin layer has refractive index lower than that of the rest of the optical circuit forming layer at least after the irradiation with the activating energy beam or preferably regardless of whether before or after the irradiation, and is disposed to oppose the metal layer via the optical circuit forming layer. Therefore, the light permeable resin layer provides cladding portions for the remaining portion that serves as the core.

In the material for the optical circuit-electrical circuit mixedly mounting substrate of the present invention according to the eleventh aspect, the core layer of the optical waveguide can be formed with the non-irradiated portion of the optical circuit forming layer and the cladding layers can be formed with the irradiated portion of the optical circuit forming layer and with the light permeable resin layer by irradiating the optical circuit forming layer with the activating energy beam, while electrical wiring can be formed by metal layer processing so that an optical circuit and an electrical circuit can be formed together on the same substrate, thus making it possible to manufacture the optical circuit-electrical circuit mixedly mounting substrate of the high quality with a simple method by using the conventional printed circuit board manufacturing technology.

In a twelfth aspect, the present invention provides the following material for the optical circuit-electrical circuit mixedly mounting substrate:

the material for the optical circuit-electrical circuit mixedly mounting substrate of any one of the seventh to the eleventh aspects wherein an adhesive layer is provided adjacent to the metal layer and the adhesive layer is disposed between the metal layer and the optical circuit forming layer.

In the material for the optical circuit-electrical circuit mixedly mounting substrate of this aspect, the metal layer is provided on the optical circuit forming layer or the light permeable resin layer by using the adhesive layer interposed therebetween. This constitution improves the bonding between the metal layer and the optical circuit forming layer or the light permeable resin layer. The adhesive layer adjoins the metal layer on one side thereof, and adjoins the optical circuit forming layer or the light permeable resin layer on the other side.

In the material for the optical circuit-electrical circuit mixedly mounting substrate of the present invention according to the twelfth aspect, bonding strength of the electrical wiring to be formed can be increased by the adhesive layer, thereby improving the reliability of the electrical wiring.

In a thirteenth aspect, the present invention provides the following material for the optical circuit-electrical circuit mixedly mounting substrate:

The material for the optical circuit-electrical circuit mixedly mounting substrate of any one of the seventh to twelfth aspects wherein a supporting member is further provided, the supporting member constituting an exposed surface of the material for the optical circuit-electrical circuit mixedly mounting substrate on the side thereof nearer to the metal layer.

In this specification, the phrase "nearer to (or farther from)" is used to mean that the number of layers interposed between the layers in question is smaller (or larger), and does not based on the actual distance between those layers.

The supporting member is preferably stacked on the metal layer, so as to provide mechanical strength to the material for the optical circuit-electrical circuit mixedly mounting substrate thereby making it easier to handle the material for the optical circuit-electrical circuit mixedly mounting substrate. The supporting member is preferably processed on one side thereof to be readily peeled off (namely a releasable supporting member), so as to be detached from the material for the optical circuit-electrical circuit mixedly mounting substrate thereby exposing the metal layer as required. The supporting member may be made of any material as long as it can provide the mechanical strength, and it may be for example a plastic or metal sheet.

In the material for the optical circuit-electrical circuit mixedly mounting substrate of the present invention according to the thirteenth aspect, the metal layer can be reinforced by the supporting member, so as to improve the ease of handling during the process such as providing a resin layer on the metal layer.

In a fourteenth aspect, the present invention provides the following material for the optical circuit-electrical circuit mixedly mounting substrate:

The material for the optical circuit-electrical circuit mixedly mounting substrate of any one of the seventh through thirteenth aspects wherein a cover film is further provided, the cover film constituting a surface of the material for the optical circuit-electrical circuit mixedly mounting substrate on the side thereof farther from the metal layer.

The cover film constitutes at least one of the exposed surfaces of the material for the optical circuit-electrical circuit mixedly mounting substrate, and preferably constitutes the exposed surface of the material for the optical circuit-electrical circuit mixedly mounting substrate on the side thereof farer from the metal layer. In other words, the cover film constitutes the surface of the material for the optical circuit-electrical circuit mixedly mounting substrate opposite to the surface constituted by the supporting member. The cover film may or may not be permeable to light. In the case wherein the cover film is permeable to light, the material for the optical circuit-electrical circuit mixedly mounting substrate can be irradiated with the activating energy beam even when the cover film is present. The cover film is preferably made of a resin, and a transparent film such as a polyester film, a polypropylene film, a polyethylene film or a polyacetate film can be used. While there is no limitation as to the thickness of the cover film, the thickness in the range from 5 to 100 µm is preferably employed. A surface of the cover film may be processed so as to allow easy release.

In the material for the optical circuit-electrical circuit mixedly mounting substrate of the present invention according to the fourteenth aspect, the resin layer can be protected by the cover film, so as to improve the ease of handling of the material for the optical circuit-electrical circuit mixedly mounting substrate.

In the material for the optical circuit-electrical circuit mixedly mounting substrate of any of the aspects described above, it is preferable that the optical circuit forming layer can minimize the light that escapes from the core formed therein to the outside, namely minimize the optical loss. For that purpose, a light transmissivity of the optical circuit forming layer is preferably 0.2 dB/cm or lower, and more preferably 0.1 dB/cm or lower. While this value of the light transmissivity is for the state after being irradiated with the activating energy beam, the light transmissivity is preferably at a similar level also before the irradiation.

In the material for the optical circuit-electrical circuit mixedly mounting substrate of the present invention described above, the resin that can be used to form the light permeable resin layer (namely the first light permeable resin layer) may be any proper light permeable resin (or transparent resin) known to those skilled in the art in the formation of the optical waveguide, particularly the formation of the cladding member of the optical waveguide. Preferable materials of such light permeable resin may be exemplified by the following:

Photocurable resin that is cured by light or UV (for example, Optodyne UV-3100 manufactured by Daikin Industries, Ltd.); and Thermosetting resin (for example, epoxy resin, polyimide resin, unsaturated polyester resin, epoxy acrylate resin, etc.)

For the purpose of flame resistance and/or absorbency for the activating energy beam, such a resin may contain an additive or reactive flame retardant and/or an ultraviolet absorber based on halogen, phosphorus or silicon compound. Those resins may be used also to form other light permeable resin layer such as the second light permeable resin layer.

For the resin of which refractive index changes when irradiated with the activating energy beam (which will be also referred to as a "photosensitive resin" for convenience in this specification since the refractive index of such a resin changes when exposed to light in its broader sense of the word), any proper resin known to those skilled in the art that can be used, exemplified by the following preferable materials:

(i) Resin of which refractive index increases when irradiated with the activating energy beam:

"Polyguide" manufactured by DuPont, acrylic resin containing a photopolymerizable monomer, etc.; and (ii) Resin of which refractive index decreases when irradiated with the activating energy beam:

Polysilane (for example, polymethylphenylsilane), a composite resin in which a photopolymerizable acrylic monomer is contained in a polycarbonate resin dissolved in a solvent (a film made of this resin is irradiated and then acrylic monomer is removed by evaporation in vacuum), etc.

For the resin of which solubility to solvent changes when irradiated with the activating energy beam (which will be also referred to as a "photosensitive resin" for convenience in this specification since the solubility of such a resin to the solvent changes when exposed to light in its broader sense of the word), any proper resin known to those skilled in the art that can be used, exemplified by the following preferable materials:

(i) Resin which becomes substantially soluble in a solvent when irradiated with the activating energy beam:

Photolytic resin (naphthoquinone-based resin, etc.)

(ii) Resin which becomes substantially insoluble in a solvent when irradiated with the activating energy beam:

Photocurable resin (acrylic resin, epoxy resin, polyimide resin, silicon-based resin), and electron radiation curable resin (acrylic resin, epoxy resin, polyimide resin, etc.)

These resins must be selected so that the layer formed therewith satisfies the relationship of the refractive index described previously at least after being irradiated with the activating energy beam. The selection may be done by those skilled in the art in accordance to such factors as the dimensions (length, width, etc.) of the waveguide to be formed (with the core and the cladding portion or the reflector), and a type of a optical signal to propagate therein (especially its wavelength, transmission rate, etc.). With regard to the refractive index, for example, the resins that constitute the layers are selected so that the refractive index of the core is higher than the refractive index of the cladding portion by at least about 0.1%, preferably at least about 0.2% and more preferably at least about 1%.

The layers may be formed from the selected resins by any proper method, and a method commonly employed in the field of manufacturing printed circuit boards may be used.

In the material for the optical circuit-electrical circuit mixedly mounting substrate of the present invention described above, the adhesive that can be preferably used to form the adhesive layer may be thermosetting resins such as epoxy resin, polyimide resin, unsaturated polyester resin and epoxy acrylate resin. The adhesive may contain a flame retardant based on halogen, phosphorus or silicon compound so as to make it flame resistant, and may also contain an ultraviolet absorber.

In the material for the optical circuit-electrical circuit mixedly mounting substrate of the present invention described above, the metal layer may be formed from any metal commonly used to form a wiring layer in the manufacture of the printed circuit boards, such as copper, aluminum, or nickel. For example, a copper foil may be used. The metal layer may be formed by plating, vapor deposition, sputtering or the like.

When irradiating the material for the optical circuit-electrical circuit mixedly mounting substrate of the present invention with the activating energy beam, the activating energy beam may be applied on either side of the material for the optical circuit-electrical circuit mixedly mounting substrate as long as the optical circuit forming layer can be irradiated with the activating energy beam and the relationship of refractive indices is satisfied. In the case wherein the material for the optical circuit-electrical circuit mixedly mounting substrate has the metal layer, the optical circuit forming layer is irradiated on the side thereof opposite to the metal layer, since the metal layer reflects the activating energy beam.

In a fifteenth aspect, the present invention provides a method for manufacturing an optical circuit-electrical circuit mixedly mounting substrate comprising the steps of:

(1) applying an activating energy beam to the material for the optical circuit-electrical circuit mixedly mounting substrate that comprises at least an optical circuit forming layer so as to form a core of an optical waveguide in the optical circuit forming layer, wherein the optical circuit forming layer is made of a light permeable resin of which solubility to solvent changes or of which refractive index changes when irradiated with the activating energy beam;

(2) forming a light deflecting portion in the core;

(3) bonding a metal layer onto the material for the optical circuit-electrical circuit mixedly mounting substrate; and (4) processing the metal layer to form an electrical circuit.

In the method for manufacturing the optical circuit-electrical circuit mixedly mounting substrate of the present invention according to the fifteenth aspect, such a material for the optical circuit-electrical circuit mixedly mounting substrate is used in the process (1) which material has at least the optical circuit forming layer made of a light permeable resin of which solubility to solvent changes or of which refractive index changes when irradiated with the activating energy beam. In the material for the optical circuit-electrical circuit mixedly mounting substrate, the optical circuit forming layer made of the light permeable resin of which solubility to solvent changes when irradiated with the activating energy beam and the optical circuit forming layer made of the light permeable resin of which refractive index changes when irradiated with the activating energy beam are those described previously in conjunction with the material for the optical circuit-electrical circuit mixedly mounting substrate of the present invention, and those optical circuit forming layers allow to form the core in the irradiated portion or in the non-irradiated portion, depending on the material used to constitute the optical circuit forming layer, when the optical circuit forming layer is irradiated by applying the activating energy beam to the material for the optical circuit-electrical circuit mixedly mounting substrate.

Thus the core of the waveguide through which light propagates is formed in a predetermined portion of the optical circuit forming layer, by irradiating the predetermined portion of the optical circuit forming layer with the activating energy beam. In the case of the optical circuit forming layer of which solubility to solvent changes, it is necessary to remove the portions other than that where the core is to be formed, by dissolving to the solvent.

In step (2), the light deflecting portion is formed in the core that has been formed. The "light deflecting portion" refers to a component that changes a propagating direction of at least a portion of light propagating through the core so that said portion of light propagates in a different direction so as to emerge out of the core, or changes a propagating direction of at least a portion of light injected into the core from its outside in a different direction so that said portion of light propagates through the core. Such "light deflecting portion" is referred to as a deflector or coupler. In other words, the light deflecting section is a component that causes light propagating in an optical waveguide having the core to emerge out of the waveguide, or causes light to enter from the outside of the optical waveguide into the optical waveguide. The light deflecting portion may be formed in any appropriate position in the core, and is formed in, for example, at an end of the core (that is usually elongated), at an intermediate position or the like. The light deflecting section may extend over at least a portion or over the entire of thickness (in the direction perpendicular to the light propagating direction) of the core. The light deflecting portion may also extend outside the thickness and/or width of the core, as required.

Then, in the step (3), the metal layer is bonded onto the material for the optical circuit-electrical circuit mixedly mounting substrate in which the core has been formed. The metal layer may be the same as the metal layer described previously in conjunction with the material for the optical circuit-electrical circuit mixedly mounting substrate of the present invention. For example, the metal layer is a metal foil, a metal film, a metal sheet or the like. The metal layer may be bonded via an adhesive layer in the material for the optical circuit-electrical circuit mixedly mounting substrate.

In step (4), the electrical circuit is formed by processing the bonded metal layer by a proper method so that the metal remains in a predetermined pattern. The electrical circuit may be formed by any method commonly used to form a wiring layer from a metal layer in the manufacture of printed circuit boards.

In a sixteenth aspect, the present invention provides the following method for manufacturing the optical circuit-electrical circuit mixedly mounting substrate:

In the method according to the fifteenth aspect, the material for the optical circuit-electrical circuit mixedly mounting substrate of any one of the first through sixth aspects is used as the material for the optical circuit-electrical circuit mixedly mounting substrate.

The material for the optical circuit-electrical circuit mixedly mounting substrate of the present invention described previously can be preferably used in the manufacturing method according to the fifteenth aspect.

In a seventeenth aspect, the present invention provides a method for manufacturing the optical circuit-electrical circuit mixedly mounting substrate comprising the steps of:

(1) applying the activating energy beam to the optical circuit forming layer of the material for the optical circuit-electrical circuit mixedly mounting substrate that has at least the metal layer and the optical circuit forming layer so as to form the core of the optical waveguide in the optical circuit forming layer, wherein the optical circuit forming layer is made of a light permeable resin of which solubility to solvent changes or of which refractive index changes when irradiated with the activating energy beam;

(2) forming a light deflector portion; and (3) processing the metal layer to form an electrical circuit.

The method for manufacturing the optical-electrical hybrid circuit board of the present invention according to the seventeenth aspect is different from the manufacturing method of the fifteenth aspect in that the material for the optical circuit-electrical circuit mixedly mounting substrate, as a laminate structure is used which substrate comprises at least the metal layer and the optical circuit forming layer made of the light permeable resin of which solubility to solvent changes or of which refractive index changes when irradiated with the activating energy beam, and that as a result, the step of bonding the metal layer is not necessary. With the other respects, this manufacturing method is similar to the method of the fifteenth aspect.

In an eighteenth aspect, the present invention provides the following method for manufacturing the optical circuit-electrical circuit mixedly mounting substrate:

In the method according to the seventeenth aspect, wherein the material for the optical circuit-electrical circuit mixedly mounting substrate of any one of the seventh to thirteenth aspects is used as the material for the optical circuit-electrical circuit mixedly mounting substrate.

The material for the optical circuit-electrical circuit mixedly mounting substrate of the present invention described previously can be preferably used in the manufacturing method according to the seventeenth aspect.

In the method for manufacturing the optical circuit-electrical circuit mixedly mounting substrate of the present invention according to the fifteenth to eighteenth aspects, it is made possible to manufacture the optical circuit-electrical circuit mixedly mounting substrate with the high quality in a simple method by using the conventional printed circuit board manufacturing technology, without requiring steps for stacking a cladding layer, a core layer and a further cladding layer on a substrate and/or forming an electrical circuit by plating as in the prior art.

In a nineteenth aspect, the present invention provides the following method for manufacturing the optical circuit-electrical circuit mixedly mounting substrate:

In the method according to the seventeenth or eighteenth aspect, a core of the optical waveguide, a deflector portion and an electrical circuit are formed at predetermined positions based on a reference mark formed in advance on the metal layer of the material for the optical circuit-electrical circuit mixedly mounting substrate.

With this manufacturing method, the reference mark is previously formed on the metal layer, and the position to irradiate with the activating energy beam is determined on the basis of positional relationship with the reference mark during the manufacture of the optical circuit-electrical circuit mixedly mounting substrate. For example, a mask used upon the irradiation is located with reference to the reference mark. The position to form the deflector portion is also determined on the basis of the positional relationship with the reference mark. The position to form the electrical circuit is also determined on the basis of the positional relationship with the reference mark. As the core, the deflector portion and the electrical circuit are formed using the same reference mark formed on the metal layer, the positional relationships between these components are also established as predetermined. The reference mark may be of any form that can serve the purpose, and for example, two rectangles measuring 100 μm by 500 μm crossing each other at their centers to form a cross-shape.

According to the method for manufacturing the optical circuit-electrical circuit mixedly mounting substrate of the nineteenth aspect, the optical waveguide, the deflector portion and the electrical circuit are aligned with each other by means of the reference mark, so that the optical waveguide, the deflector portion and the electrical circuit can be formed with good precision.

In a twentieth aspect, the present invention provides the following method for manufacturing the optical circuit-electrical circuit mixedly mounting substrate:

In the method according to any one of the fifteenth to the eighteenth aspects, the reference mark is formed on the optical circuit forming layer at the same time as it is irradiated with the activating energy beam, and then the deflector portion and the electrical circuit are formed at predetermined positions with reference to the reference mark in process (1) of forming the core.

According to this manufacturing method, when the core is formed by the irradiation with the activating energy beam, the irradiation results in the formation of the reference mark as well as the core. The mark has substantially the same refractive index as that of the core, but is different from the core in that it does not have the purpose of propagating light and is intended simply to rest at the predetermined position.

The manufacturing method of the twentieth aspect makes it possible to form the reference mark simultaneously in the step of forming the core of the optical waveguide, which simplifies the step of forming the reference mark, and form the core of the optical waveguide and the reference mark in the optical circuit forming layer with good accuracy of the positional relationship in the step of the exposure to the activating energy beam, thereby forming the deflector portion and the electrical circuit with the good positional accuracy in relation to the core of the optical guide by using the reference mark.

In a twenty-first aspect, the present invention provides the following method for manufacturing the optical circuit-electrical circuit mixedly mounting substrate:

In the method according to any one of the fifteenth through twentieth aspects, before the electrical circuit forming step (4) or (3), a substrate is bonded onto a surface of the material for the optical circuit-electrical circuit mixedly mounting substrate which surface is opposite to a surface thereof on which surface the electrical circuit is formed.

According to this manufacturing method, after the step (1) of forming the core of the optical waveguide and the step (2) of forming the deflector portion, the surface where the core has been formed is bonded onto the substrate and then the electrical circuit is formed. While the substrate may be made of any proper material, preferably it provides mechanical strength, namely rigidity, with the material for the optical circuit-electrical circuit mixedly mounting substrate. For example, a glass-epoxy plate, a glass plate or a metal plate may be used.

The manufacturing method of the twenty-first aspect makes it possible to form an electrical circuit on the material for the optical circuit-electrical circuit mixedly mounting substrate that has been made rigid by bonding onto the substrate, thus improving the efficiency upon the formation of the electrical circuit.

In a twenty-second aspect, the present invention provides the following method for manufacturing the optical circuit-electrical circuit mixedly mounting substrate:

In the method according to the twenty-first aspect, the substrate is a wiring board, preferably a printed circuit board that has an electrical circuit (referred to as the second electrical circuit in order to distinguish from the electrical circuit (first electrical circuit) formed from the metal layer) formed on the surface and/or inside thereof, and the method further comprises the step of electrically connecting the second electrical circuit and the formed first electrical circuit.

In this manufacturing method, the wiring board may be of any appropriate type, and for example a printed circuit board. The wiring board may be either a double-sided wiring board or a multi-layered wiring board. This manufacturing method is capable of easily manufacture the optical circuit-electrical circuit mixedly mounting substrate of a multi-layered structure.

In a twenty-third aspect, the present invention provides the following method for manufacturing the the optical circuit-electrical circuit mixedly mounting substrate:

In the method according to the twenty-first or twenty-second aspect, the step of bonding the wiring board via an adhesive layer is included, and the adhesive layer has a refractive index lower than that of the core.

According to this manufacturing method, the adhesive layer is formed from the adhesive used in the material for the optical circuit-electrical circuit mixedly mounting substrate of the present invention described previously, namely a thermosetting resin, for example, an epoxy resin, a polyimide resin, an unsaturated polyester resin or an epoxy acrylate resin, that is controlled to have a refractive index lower than that of the core. This adhesive layer can be used as the cladding portion for the core because of the relationship of the refractive indexes. As a result, the step of forming the cladding portion can be eliminated so as to simplify the method for manufacturing the optical circuit-electrical circuit mixedly mounting substrate.

In a twenty-fourth aspect, the present invention provides the following method for manufacturing the optical circuit-electrical circuit mixedly mounting substrate:

In the method according to one of the fifteenth to twenty-third aspects, the material for the optical circuit-electrical circuit mixedly mounting substrate further comprises a cover film that constitutes an exposed surface on a side of the material for the optical circuit-electrical circuit mixedly mounting substrate which side is opposite to the side on which the metal layer of the optical circuit forming layer is provided, or an exposed surface of a side of the material for the optical circuit-electrical circuit mixedly mounting substrate which side is opposite to the side to which the metal layer of the material for the optical circuit-electrical circuit mixedly mounting substrate is bonded, and the step (2) of forming the deflector portion is carried out by forming a surface that is inclined with respect to the light propagating direction in the core with the cover film in place, then forming a light reflector on the inclined surface and then peeling off the cover film.

This manufacturing method makes it possible to form the deflector portion while protecting the optical circuit forming layer with the cover film by using the cover film as a mask. The cover film may or may not be transparent depending on the purpose.

In a twenty-fifth aspect, the present invention provides the following method for manufacturing the optical circuit-electrical circuit mixedly mounting substrate:

In the method according to one of the fifteenth to twenty-fourth aspects, a surface that is inclined with respect to the light propagating direction is formed at least on the core, and the light reflector is formed by applying a paste containing metal particles to the inclined surface, thereby forming the deflector portion.

According to this manufacturing method, the inclined surface of the deflector portion is inclined with respect to the longitudinal direction of the core, namely the optical axis of the waveguide. There is no restriction on the angle of inclination, which may be, for example, 45° with respect to the longitudinal direction of the core in which case the light propagating direction is deflected by 90°. When forming the light reflector on the deflector portion by using the paste, a light reflecting portion or a reflector member having a reflecting surface can be formed without using a massive vacuum apparatus as in the case of the vapor deposition of metal.

The light reflector of the deflector portion may also be formed by the vapor deposition of metal onto the inclined surface, in which case a light reflector that is uniform and has a high purity can be formed easily.

In a twenty-sixth aspect, the present invention provides the following method for manufacturing the optical circuit-electrical circuit mixedly mounting substrate:

In the method according to any one of the fifteenth to twenty-fifth aspects, a portion of the metal layer that opposes the deflector portion (for example, located above the deflector portion) is removed in the step (4) or (3) of forming the electrical circuit, and then a light permeable resin is applied to the portion from which the metal layer has been removed.

According to this manufacturing method, a portion of the metal layer located in the path from the inside of the core through the deflector section to the outside of the core (namely located in the optical propagating direction or optical axis), which will be referred to as a "portion of the metal layer opposing the deflector portion", is removed. In the case wherein light is extracted from the deflector portion in a direction 90° upward from the longitudinal direction of the core, for example, a portion of the metal layer located right above the deflector portion is removed. When light is extracted at other angle, for example, a portion of the metal layer located obliquely above the deflector section is removed. In the case wherein light is introduced from the outside of the core through the deflector portion into the core, the portion of the metal layer to be removed can be easily determined by reversing the consideration described above.

With this method for manufacturing the optical circuit-electrical circuit mixedly mounting substrate, even when a base layer exposed by removing the metal layer has a rough surface, light introduced into the deflector portion or light emerging from the deflector portion can be prevented from being scattered by coating the rough surface with the light permeable resin, thereby to prevent the optical coupling efficiency between the optical waveguide and the outside from decreasing.

In one preferable form, the light permeable resin is applied in the form of a convex lens. This enables the applied resin to collect light entering or emerging from the deflector portion, so as to more effectively prevent the optical coupling efficiency between the optical waveguide and the outside from decreasing.

It is preferable that the light permeable resin applied has a refractive index which is the same as or similar to that of the resin that is exposed by removing the metal layer. This enables it to decrease the reflection loss due to the difference in the refractive indexes between both resins, thereby improving the optical coupling efficiency between the optical waveguide and the outside.

When the light permeable resin is applied, a portion of the metal layer in a region opposing the deflector portion is removed, then a surface and an end surface (or side surface) of the metal layer that remains around the removed area are treated to become water-repellent, and the light permeable resin is applied thereafter. This reduces the influence on the shape of the light permeable resin, that has been applied in dropwise, caused by the minute unevenness of the area from which the metal has been removed, thereby enabling it to form the light permeable resin in a stable shape.

Such water-repellent treatment is preferably to coat the surface and the end surfaces of the metal layer that remains around the removed area thereof with a polymer film 244 having a low surface energy density. In this case, the water-repellent treatment can be easily carried out by for example spraying only the desired area.

In a twenty-seventh aspect, the present invention provides the following method for manufacturing the optical circuit-electrical circuit mixedly mounting substrate:

In the method according to any one of the fifteenth to twenty-fifth aspects, a portion of the metal layer that opposes the deflector portion (for example, located above the deflector portion) is removed when forming the electrical circuit, and then a lens is placed in the portion from which the metal layer has been removed so as to make contact with the remaining metal layer that surrounds the portion so that the optical axis of the lens passes through the deflector portion.

This method is the same as the method of the twenty-sixth aspect with regard to the portion of the metal layer that opposes the deflector section. Such portion of the metal layer is removed and the lens is placed in the place where the metal layer is removed. The lens may be of any shape that can collect light, and for example, a ball lens or a half-ball lens. According to this manufacturing method, light entering or emerging from the deflector portion can be collected by the lens, so as to more effectively prevent the optical coupling efficiency between the optical waveguide and the outside from decreasing.

It is preferable to remove the portion of the metal layer so that the optical axis of the lens passes through the deflector portion when the lens is placed so as to make contact with the remaining metal layer that surrounds the portion. In this case, the lens can be placed at a precise position easily with high accuracy by fitting the lens in the portion from which the metal has been removed, which also makes it easy to place a plurality of lenses with less positional deviation.

The lens is preferably a ball lens or a ball lens of which portion is made flat. A ball lens or a half-ball lens that is commercially available can be used as it is, and can be easily mounted on the portion from which the metal has been removed.

When mounting the lens, it is preferable to apply a light permeable resin to fill the gap between the surface of the portion from which the metal has been removed and the lens. This reduces the reflection loss caused by a layer of air formed between the surface of the portion from which the metal has been removed and the lens, and firmly fixes the lens by means of the light permeable resin. For the light permeable resin, the light permeable resin used in the material for the optical circuit-electrical circuit mixedly mounting substrate of the present invention described previously can be used.

It is preferable that the light permeable resin used to fill the gap has a refractive index which is the same as or similar to that of the resin which is exposed by removing the metal layer. As a result, reflection loss due to the difference in refraction indexes between both resins can be reduced and the optical coupling efficiency between the optical waveguide and the outside can be improved.

In a twenty-eighth aspect, the present invention provides the following method for manufacturing the optical circuit-electrical circuit mixedly mounting substrate:

In the method according to any one of the fifteenth to twenty-seventh aspects, such an optical circuit-electrical circuit mixedly mounting substrate is used that has a light permeable resin layer which has a refractive index lower than that of the core and is formed between the optical circuit forming layer and the metal layer or formed on a surface of the optical circuit forming layer on a side thereof where the metal layer is bonded.

According to this method for manufacturing the optical circuit-electrical circuit mixedly mounting substrate, the light permeable resin layer and the optical circuit forming layer are adjacent to each other in the material for the optical circuit-electrical circuit mixedly mounting substrate or the optical circuit forming layer are adjacent to each other in the material for the optical circuit-electrical circuit mixedly mounting substrate.

The optical circuit forming layer may be the optical circuit forming layer described previously in conjunction with the material for the optical circuit-electrical circuit mixedly mounting substrate of the present invention. This manufacturing method enables it to prevent the core from making direct contact with the metal layer, so as to obtain the optical circuit-electrical circuit mixedly mounting substrate of the high quality by eliminating the causes of light transmission loss.

According to the method for manufacturing the optical circuit-electrical circuit mixedly mounting substrate of the present invention, the deflector portion may be formed in a step that includes the step of forming a surface 7 that is inclined with respect to the light propagating direction at least in the optical circuit forming layer and the step of forming the light reflector on the surface of the inclined surface. This makes it easy to form the deflector portion by forming the inclined surface and the light reflector.

When the surface inclined with respect to the light propagating direction is formed at least on the optical circuit forming layer, it is preferably formed by a cutting operation using a rotary blade or cutting tool having a cutting edge of which apex angle is about 90° or of which apex angle of at least one side is 45°. In this case, a surface inclined at an angle of 45° that allows it to eject or enter light at a deflection angle of about 90° can be formed by the cutting operation with high angular accuracy and good reproducibility. The deflector portion, particularly the inclined surface thereof may be formed by the other processing method, for example ultraviolet laser machining, instead of using the blade.

Such a cutting operation can be carried out by bringing the rotary blade or cutting tool into contact with the optical circuit forming layer at a predetermined position and cutting the optical circuit forming layer over a predetermined length to a predetermined depth, and then moving the rotary blade or cutting tool away from the cutting position. In this case, the inclined surface can be formed in a portion of the formed plural cores, in the predetermined number of the formed plural cores or all of the formed plural cores.

The cutting operation by the rotary blade or cutting tool may be carried out to such a depth as a portion of the thickness of the core formed in the optical circuit forming layer 1 remains. By leaving a portion of the thickness to remain in this way, a deflector portion for light splitting can be formed that divides the light propagating through the core into a portion that extracts the light from the deflector portion and a portion that passes the light through the core.

In a preferred form, the cutting operation can be carried out by bringing a rotary blade 241 into contact with the optical circuit forming layer 201 at a predetermined position and cutting the optical circuit forming layer, then cutting the same area again by using a second rotary blade 241 having smaller abrasive grains than those of the first rotary blade 241. In this case, after cutting the inclined surface with the rotary blade of larger abrasive grains, the inclined surface can be finished with the second rotary blade of smaller abrasive grains. This enables it to form the smoother inclined surface of finer surface roughness, without causing strain or burrs by dragging of the resin at the cut-in point of the surface due to insufficient cutting force.

The deflector portion may be formed by providing the optical circuit forming layer with a reflector that has a reflecting surface inclined with respect to the propagating direction of light or optical axis in the core. In this case, the deflector portion can be formed easily by simply providing the reflector that has a reflecting surface in the optical circuit forming layer.

In other embodiment, the deflector portion may be formed by providing a periodical structure at least in the optical circuit forming layer or in the interface between the optical circuit forming layer and the adjacent layer. The periodical structure refers to any member of which structural feature is repeated in the direction of light propagation. For example, the periodical structure may be a member that can function as a grating. The deflector portion can be formed easily by providing the periodical structure.

The deflector portion may be formed before the step of forming the core of the optical waveguide. In this case, even when the optical circuit forming layer is made of a resin that cures when forming the core of the optical waveguide, the deflector portion can be easily formed before the resin cures to increase its rigidity.

In the case wherein two electrical circuits located at different positions in the direction of thickness in the optical circuit-electrical circuit mixedly mounting substrate are to be electrically connected by means of a via hole(s), the via hole(s) may be formed by laser etching while using a metal layer as the laser stopping layer, that metal layer is used as the electrical wiring of one of the electrical circuits. In this case, the electrical circuits can be electrically connected with each other using the via hole(s) with high reliability.

In other embodiment of the method for manufacturing the optical circuit-electrical circuit mixedly mounting substrate of the present invention, by using the material for the optical circuit-electrical circuit mixedly mounting substrate having the optical circuit forming layer made of a material of which refractive index increases when irradiated with the activating energy beam, intensity of the activating energy beam applied to the optical circuit forming layer is controlled in the step (1) of forming the core of the optical waveguide, so that the refractive index of only a portion in the direction of the thickness of the optical circuit forming layer irradiated with the activating energy beam is increased while the refractive index of the rest of the optical circuit forming layer adjacent thereto in the direction of said thickness remains the same, and thereby said portion is obtained as the core having an increased refractive index. In this case, a cladding layer can be formed in the rest of the optical circuit forming layer where the refractive index has not been increased, so that there is no need to provide a resin layer to form the cladding portion on this side, thereby simplifying the structure of the stacked layers and making it easier to manufacture the optical circuit-electrical circuit mixedly mounting substrate.

BRIEF DESCRIPTION OF THE DRAWINGS

FIG. 1(a) to FIG. 1(e) are schematic sectional views thereof.

FIG. 3(a) to FIG. 3(e) are schematic sectional views thereof.

FIG. 5(a) to FIG. 5(e) are schematic sectional views thereof.

FIG. 7(a) to FIG. 7(e) are schematic sectional views thereof.

FIG. 9(a) to FIG. 9(e) are schematic sectional views thereof.

FIG. 11(a) to FIG. 11(e) are schematic sectional views thereof.

FIG. 13(a) to FIG. 13(e) are schematic sectional views thereof.

FIG. 15(a) to FIG. 15(e) are schematic sectional views thereof.

FIG. 17(a) to FIG. 17(h) are schematic sectional views thereof.

FIG. 18(a) and FIG. 18(b) are partially enlarged schematic sectional views thereof.

FIG. 19(a) and FIG. 19(b) are partially enlarged schematic sectional views thereof.

FIG. 21(a) and FIG. 21(b) are partially enlarged schematic sectional views thereof.

FIG. 22(a) to FIG. 22(h) are schematic sectional views thereof.

FIG. 23(a) to FIG. 23(h) are schematic sectional views thereof.

FIG. 24(a) and FIG. 24(b) are schematic sectional views thereof.

FIG. 25(a), FIG. 25(b) and FIG. 25(c) are schematic sectional views thereof.

FIG. 26(a) to FIG. 26(i) are schematic sectional views thereof.

FIG. 27(a) to FIG. 27(i) are schematic sectional views thereof.

FIG. 28(a) to FIG. 28(j) are schematic sectional views thereof.

FIG. 29(a) to FIG. 29(j) are schematic sectional views thereof.

FIG. 30(a) and FIG. 30(b) are schematic sectional views thereof.

FIG. 31(a), FIG. 31(b) and FIG. 31(c) are enlarged schematic sectional views thereof.

FIG. 32 shows the steps of one example of an embodiment of the method for manufacturing the optical circuit-electrical circuit mixedly mounting substrate according to the present invention, wherein FIG. 32(a) to FIG. 32(k) are schematic sectional views thereof.

FIG. 33 shows the steps of one example of an embodiment of the method for manufacturing the optical circuit-electrical circuit mixedly mounting substrate according to the present invention, wherein FIG. 33(a) to FIG. 33(i) are schematic sectional views thereof.

DESCRIPTION OF REFERENCE NUMERALS

Figure 1:
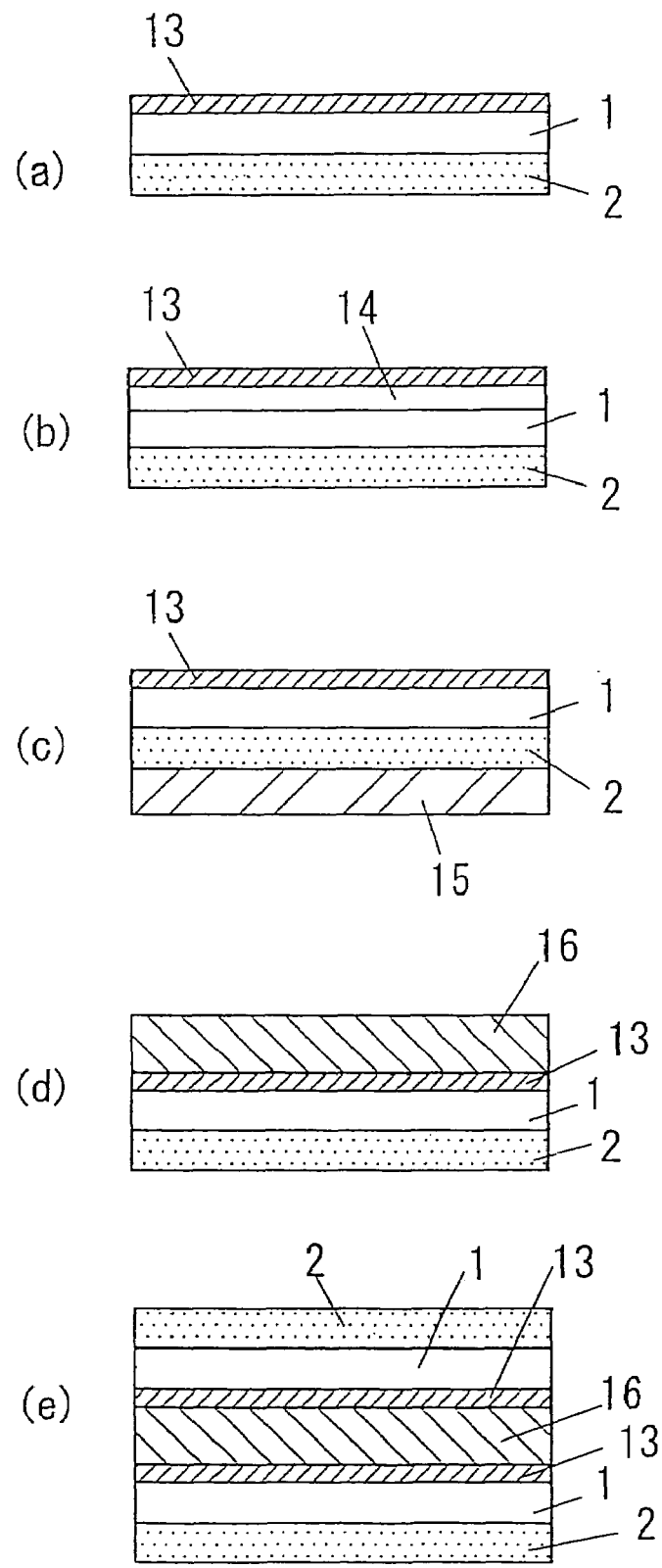
FIG. 1 shows an embodiment of the material for the optical circuit-electrical circuit mixedly mounting substrate according to the present invention.

1: Light permeable resin layer
2: Optical circuit forming layer
3, 4, 5, 6: Optical circuit forming layer
7: Second light permeable resin layer
8: Optical circuit forming layer
9: Second light permeable resin layer
10: Optical circuit forming layer
11: Light permeable resin layer
12: Optical circuit forming layer
13: Metal layer
14: Adhesive layer
15: Cover film
16: Supporting member 201: Optical circuit forming layer
202: Metal layer
203: Stacked structure
204: Optical waveguide
204a: Core
204b: Cladding portion
205: Deflector portion
206: Electrical circuit
207: Inclined surface
208: Light reflector
209: Reflecting surface
210: Reflector
211: Wiring board
212: Electrical circuit
213: Via hole
214: Adhesive
215: Cover film
216: Light permeable resin
217: Light permeable resin layer
240: Cutting blade
241: Rotary blade
244: Polymer film
246: Lens
247: Light permeable resin

EMBODIMENTS FOR CARRYING OUT THE INVENTION

Embodiments of the present invention will be now described.

FIG. 1(a) shows one example of an embodiment of the material for the optical circuit-electrical circuit mixedly mounting substrate of the present invention according to the seventh aspect, wherein an optical circuit forming layer 2 is stacked in direct contact with one side of a light permeable resin layer 1, and a metal layer 13 is stacked on a side of the light permeable resin layer 1 opposite to the side where the optical circuit forming layer 2 is provided. The metal layer 13 is preferably a copper foil. While there is no limitation as to the thickness of the metal layer 13, the thickness is usually in the range from 9 to 70 μm.

The light permeable resin layer 1 is made of a light permeable resin. The optical circuit forming layer 2 is made of a light permeable resin (or a photosensitive resin) of which solubility to solvent changes when irradiated with an activating energy beam. These resins may be selected from the resins previously mentioned. The resin used to form the optical circuit forming layer 2 is a resin that has a refractive index higher than that of the resin used to form the light permeable resin layer 1 or, a resin of which refractive index becomes higher than that of the resin used to form the light permeable resin layer 1 when irradiated with the activating energy beam.

An example of the method for manufacturing the optical circuit-electrical circuit mixedly mounting substrate will be described below. In the case wherein a metal foil is used as the metal layer 13, one side thereof, preferably a mat surface thereof is coated with the resin used to form the light permeable resin layer 1. The coating may be carried out by a comber coater, a curtain coater, a die coater, screen printing, offset printing or the like. Then the light permeable resin layer 1 is coated with the resin to form the optical circuit forming layer 2 thereon by similar coating process, and thereby to obtain the material for the optical circuit-electrical circuit mixedly mounting substrate as shown in FIG. 1(a).

Then, the method to manufacture the optical circuit-electrical circuit mixedly mounting substrate by using the material for the optical circuit-electrical circuit mixedly mounting substrate obtained as described above will be described below. First, as shown in FIG. 2(a), the optical circuit forming layer 2 is irradiated with an activating energy beam E on the side opposite to the metal layer 13. The irradiation of the activating energy beam is carried out in accordance to a pattern of the core of the optical circuit. For example, masked exposure with ultraviolet ray, drawing (or lithographic) exposure with laser beam or the like may be employed for the irradiation with the activating energy beam.

Then, the optical circuit forming layer 2 is processed with a solvent to develop the irradiated pattern and partially remove the optical circuit forming layer 2. In the case wherein the optical circuit forming layer 2 is made of a resin such as a photocurable resin of which solubility to solvent decreases in a portion thereof that is irradiated with the activating energy beam, the resin in portion other than said portion irradiated with the activating energy beam dissolves in the solvent and the resin remains in the portion that has been irradiated with the activating energy beam. In the case wherein the optical circuit forming layer 2 is made of a resin such as a photo-degrading resin of which solubility to solvent increases in a portion thereof that is irradiated with the activating energy beam, the resin in portion irradiated with the activating energy beam dissolves in the solvent and the resin remains in portions other than the portion that has been irradiated with the activating energy beam. The solvent is selected in accordance with the resin that constitutes the optical circuit forming layer. Such a selection is conventionally practiced in the field of manufacturing wiring boards.

After forming the optical circuit forming layer 2 shown in FIG. 2(b) in the predetermined optical circuit pattern as described above, the side of the light permeable resin layer 1 on which the optical circuit forming layer 2 is provided is coated with the light permeable resin layer 20, so as to cover the optical circuit pattern 2 with the light permeable resin layer 20 as shown in FIG. 2(c). For the light permeable resin layer 20, a light permeable resin that has a refractive index lower than that of the optical circuit forming layer 2, and thus that of the optical circuit pattern functioning as the core is used and, for example, the same resin as that used for the light permeable resin layer 1 may be used.

Then, a printed wiring board 22 having an electric wiring 21 formed thereon is prepared in advance, and the light permeable resin layer 20 is bonded onto the surface of the printed wiring board 22 by using an adhesive 23 as shown in FIG. 2(d). The metal layer 13 on the surface is then processed to form an electrical wiring 24 as shown in FIG. 2(e), and the electrical wiring 21 and the electrical wiring 24 are electrically connected with each other by laser via processing or plating processing.

In FIG. 2(e), since the refractive index of the optical circuit pattern formed from the optical circuit forming layer 2 is higher than the refractive indices of the light permeable resin layer 1 and the light permeable resin layer 20 that are in direct contact with the optical circuit forming layer 2, an optical waveguide is formed from the core layer 26 made from the optical circuit forming layer 2 and a cladding layers 27 formed from the light permeable resin layer 1 and the light permeable resin layer 20, so that the optical circuit is formed by the optical circuit forming layer 2. Thus, the optical circuit formed by the optical circuit forming layer 2, the electrical wiring 21 and the electrical wiring 24 are stacked one on another, which is used as optical circuit-electrical circuit mixedly mounting substrate. The light permeable resin layer 20 may be omitted when the adhesive 23 is permeable to light and has a refractive index lower than that of the optical circuit forming layer 2.

It is not essential for the material of the present invention to stack the material for the optical circuit-electrical circuit mixedly mounting substrate having the core formed on the printed wiring board 22 as described above. Instead, the material for the optical circuit-electrical circuit mixedly mounting substrate includes, on only one side thereof, the electrical wiring 24 obtained by processing the metal layer 13. Alternatively, by stacking a metal foil instead of the printed wiring board 22, the material for the optical circuit-electrical circuit mixedly mounting substrates may be manufactured to include the electrical wirings 24 on both sides thereof.

FIG. 1(b) shows another embodiment of the material for the optical circuit-electrical circuit mixedly mounting substrate according to the twelfth aspect, wherein an adhesive layer 14 that is flame-resistant is interposed between the metal layer 13 and the light permeable resin layer 1. In the case wherein a metal foil is used as the metal layer 13, the adhesive layer 14 can be formed by coating one side thereof or a mat surface side thereof if any with the adhesive by the coating method described above and, in the case wherein the adhesive contains a solvent, removing the solvent by drying and curing or semi-curing the adhesive if necessary. Thereafter, the light permeable resin layer 1 is coated on the adhesive layer 14 similarly and the optical circuit forming layer 2 is formed thereon by coating, thereby to obtain the material for the optical circuit-electrical circuit mixedly mounting substrate.

Interposing the adhesive layer 14 between the metal layer 13 and the resin layer makes it possible to increase the strength of bonding the metal layer 13 onto the resin layer by means of the adhesive layer 14. Also, because the adhesive layer 14 contains a flame retardant, it is made possible to provide the flame resistance.

FIG. 1(c) shows one example of an embodiment of the material for the optical circuit-electrical circuit mixedly mounting substrate according to the fourteenth aspect, wherein the optical circuit forming layer 2 is covered by a transparent cover film 15 on the surface which is opposite to the metal layer 13. The cover film 15 may be may be either laminated on the resin layers 1 and 2 formed on the metal layer 13, or formed by coating the cover film 15 with the resin layer 2 and laminating the film 15 coated with the resin layer 2 onto the metal layer 13 on which the light permeable resin layer 1 has been formed.

Laminating the cover film 15 on the resin layer prevents the resin layer from being exposed, and therefore improves the workability of handling the material for the optical circuit-electrical circuit mixedly mounting substrate. Exposure to light can be carried out through the cover film 15 as shown in FIG. 2(a), and the cover film 15 is removed from the resin layer when developing the exposed pattern as shown in FIG. 2(b).

Figure 2:
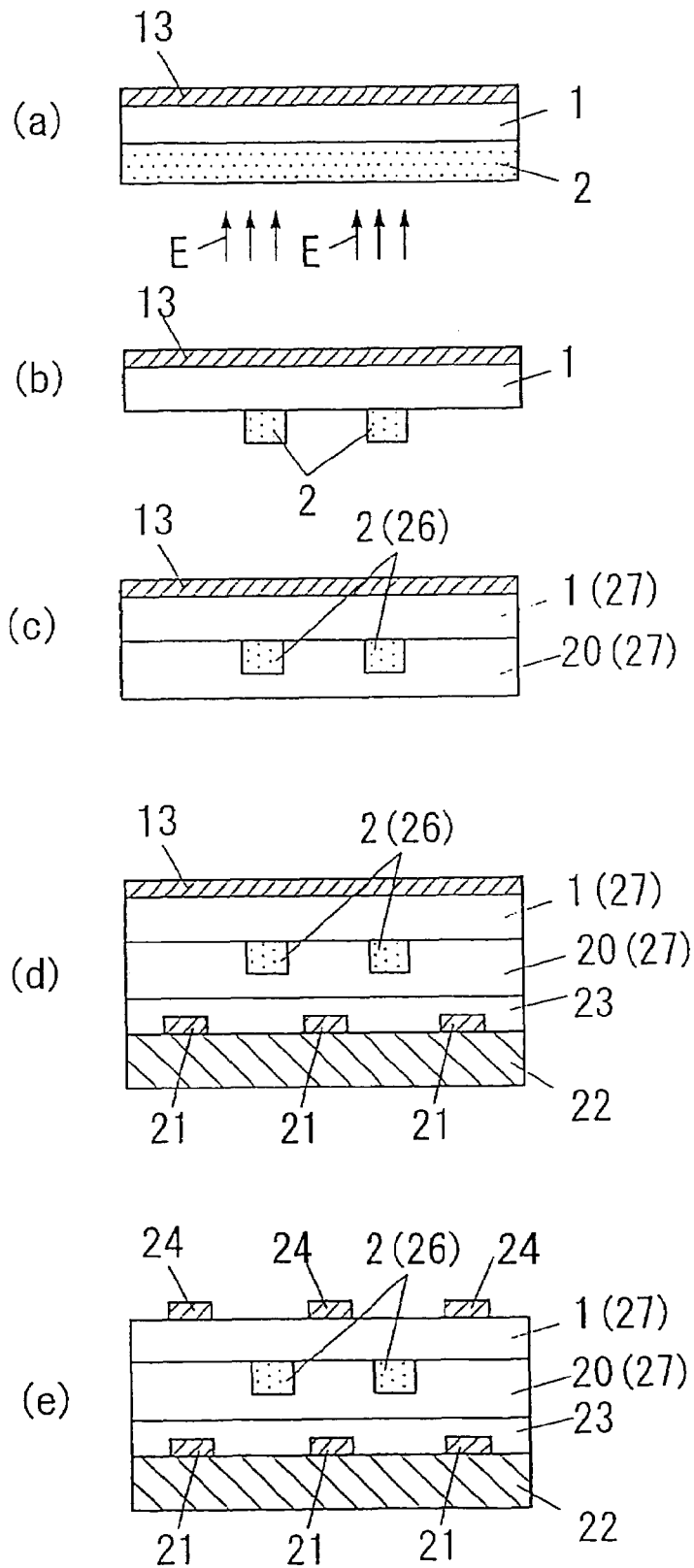
FIG. 2 shows a process of manufacturing the optical circuit-electrical circuit mixedly mounting substrate from the material for the optical circuit-electrical circuit mixedly mounting substrate shown in FIG. 1(a), and FIG. 2(a) to FIG. 2(e) are schematic sectional views thereof.

FIG. 1(d) shows one example of an embodiment of the material for the optical circuit-electrical circuit mixedly mounting substrate according to the thirteenth aspect, wherein the supporting member 16 is releasably attached on the surface of the metal layer 13 opposite to the side where the light permeable resin layer 1 is provided. The supporting member 16 may be made of any material as long as it has rigidity, and a metal plate, a resin plate or a ceramic plate may be used. When a metal foil is used as the metal layer 13, the metal foil may be releasably attached on the surface of the supporting member 16. The metal layer 13 may also be formed by plating on the supporting member 16. The metal layer 13 pasted onto the supporting member 16 so as to reinforce the metal layer 13 with the rigid supporting member 16 allows the resin layer to be formed on the surface of the metal layer 13 or the process shown in FIG. 2 is carried out, so that the improved workability is achieved.

FIG. 1(e) shows an example wherein the material for the optical circuit-electrical circuit mixedly mounting substrates are formed on both sides of the supporting member 16 by attaching the metal layers 13 on both sides of the supporting member 16.

Figure 3:
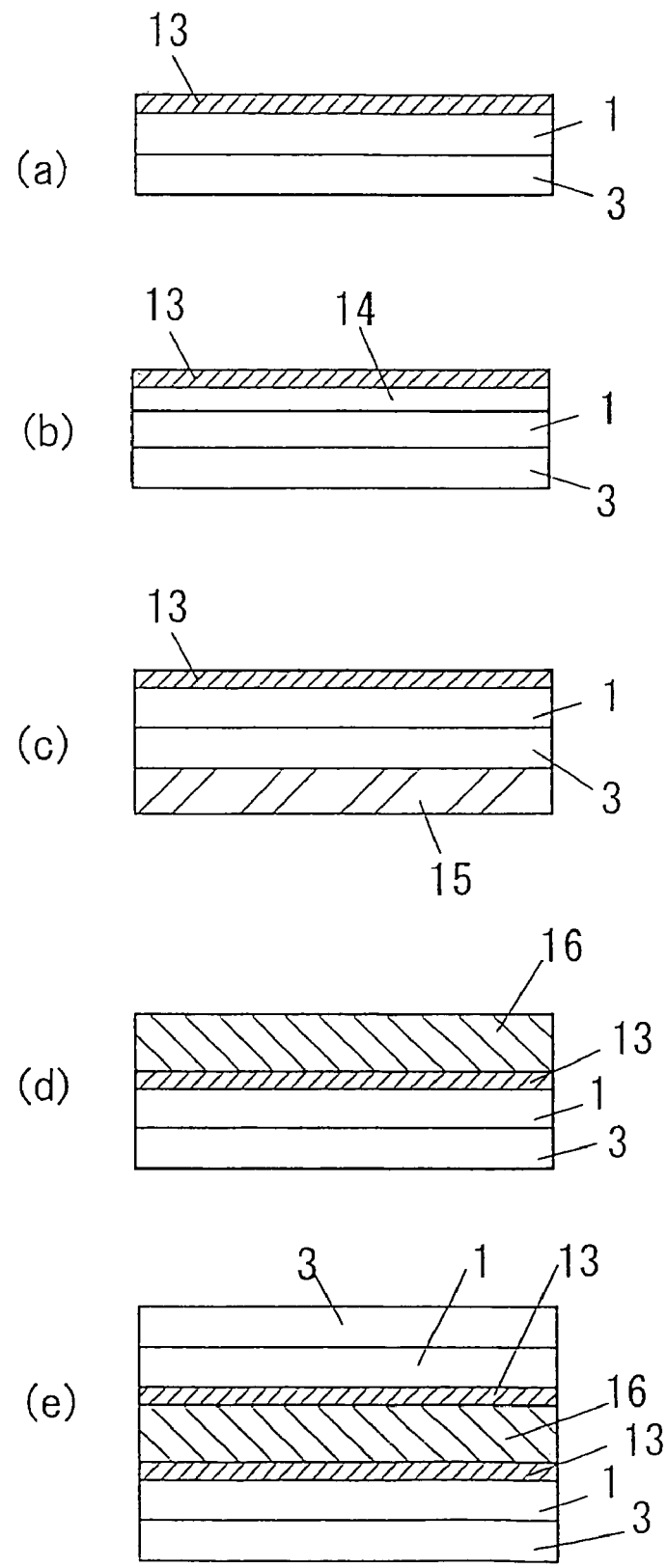
FIG. 3 shows another embodiment of the material for the optical circuit-electrical circuit mixedly mounting substrate according to the present invention.

FIG. 3(a) shows one example of an embodiment of the material for the optical circuit-electrical circuit mixedly mounting substrate according to the first aspect, wherein the optical circuit forming layer 3 is stacked on the light permeable resin layer 1 in direct contact with one side thereof, and the metal layer 13 is stacked on the light permeable resin layer 1 on the side opposite to the side where the optical circuit forming layer 3 is provided. The light permeable resin layer 1 and the metal layer 13 may be formed by using the materials already mentioned.

The optical circuit forming layer 3 is made of a light permeable resin of which refractive index changes to increase when irradiated with the activating energy beam. The optical circuit forming layer 3 is made of such a resin that the refractive index of the portion of the optical circuit forming layer which portion has been irradiated with the activating energy beam becomes higher than that of the portion of the optical circuit forming layer which portion has not been irradiated with the activating energy beam and also than that of the resin that forms the light permeable resin layer 1.

Figure 4:
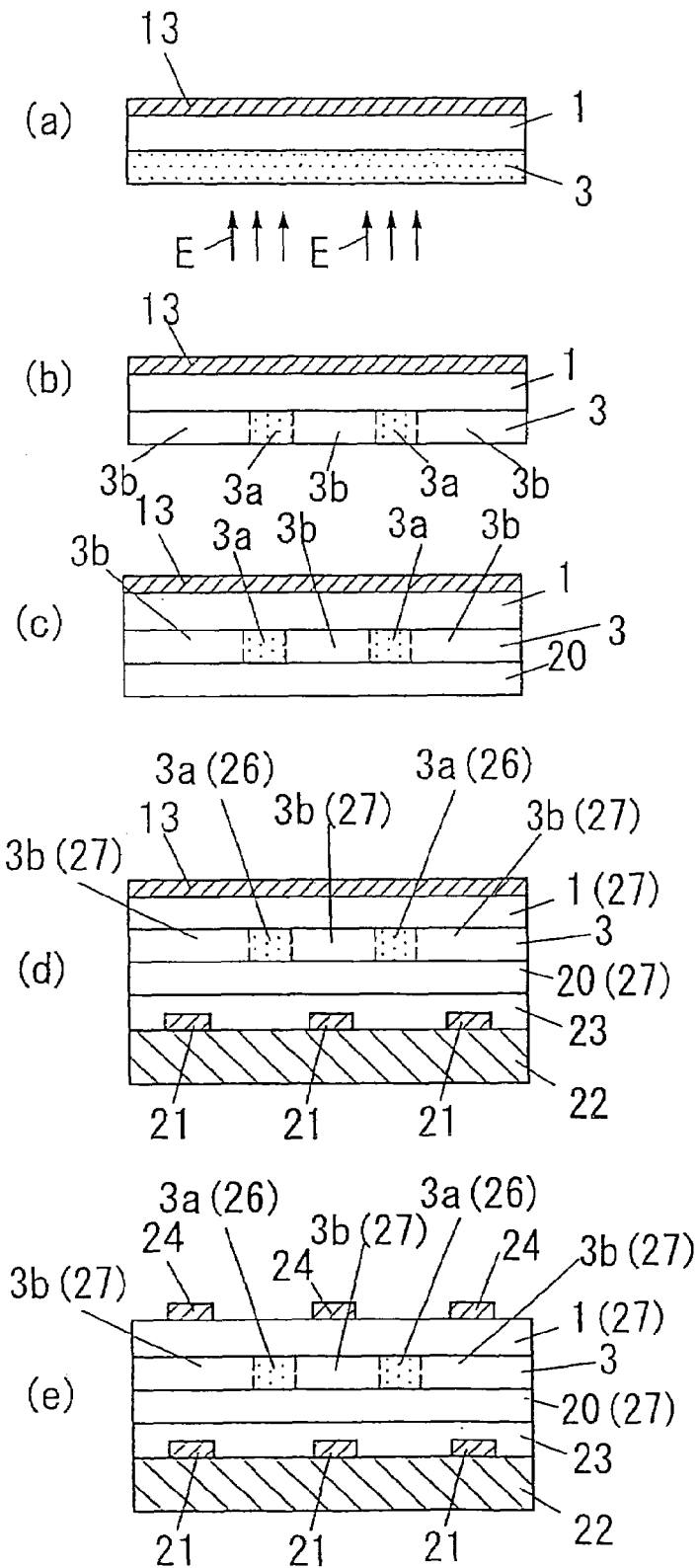
FIG. 4 shows steps of manufacturing the optical circuit-electrical circuit mixedly mounting substrate from the material for the optical circuit-electrical circuit mixedly mounting substrate shown in FIG. 3(a), and FIG. 4(a) to FIG. 4(e) are schematic sectional views thereof.

This material for the optical circuit-electrical circuit mixedly mounting substrate can be made similarly to that already mentioned, in the case wherein a metal foil is used as the metal layer 13, by coating one side thereof, preferably its mat surface side thereof, with the resin that forms the light permeable resin layer 1 and coating the light permeable resin layer 1 with the resin that forms the light forming layer 3 as shown in FIG. 4(b), the optical circuit forming layer 3 is coated with the light permeable resin layer 20 on the surface thereof opposite to the side where the light permeable resin layer 1 is provided, so as to cover the optical circuit forming layer 3 with the light permeable resin layer 20 as shown in FIG. 4(c). The light permeable resin layer 20 is made of a transparent resin that has a refractive index lower than that of the higher refractive index portion 3a of the optical circuit forming layer 3, and for example the same resin as the light permeable resin layer 1 may be used. Then, a printed wiring board 22 having an electric wiring 21 formed thereon is prepared, and the light permeable resin layer 20 is bonded onto a surface of the printed wiring board 22 by using an adhesive 23 as shown in FIG. 4(d). The metal layer 13 on the surface is then processed to form an electrical wiring 24 as shown in FIG. 4(e), and the electrical wiring 21 and the electrical wiring 24 may be electrically connected with each other by the laser via hole processing or plating.

In the embodiment in FIG. 4(e), since the refractive index of the higher refractive index portion 3a of the optical circuit pattern of the optical circuit forming layer 3 is higher than the refractive indices of the lower refractive index portion 3b of the optical circuit forming layer 3, the light permeable resin layer 1 and the light permeable resin 3.

Now, the method for manufacturing the optical circuit-electrical circuit mixedly mounting substrate using the material for the optical circuit-electrical circuit mixedly mounting substrate obtained as described above will be described below. First, as shown in FIG. 4(a), the optical circuit forming layer 3 is irradiated with the activating energy beam E on the side opposite to the metal layer 13. The irradiation of the activating energy beam is carried out in accordance to the pattern of the core of the optical circuit. Masked exposure to ultraviolet ray, exposure to laser beam or the like may be employed for the irradiation with the activating energy beam. While the refractive index of the portion of the optical circuit forming layer 3 that has not been irradiated with the activating energy beam does not change, the refractive index of the portion that has been irradiated increases, so that a higher refractive index portion 3a that has been irradiated and a lower refractive index portion 3b that has not been irradiated are formed in the optical circuit forming layer 3. The refractive index of the higher refractive index portion 3a of the optical circuit forming layer 3 is higher than that of the light permeable resin layer 1.

After forming the higher refractive index portion 3a of the pattern of the optical circuit in the optical circuit permeable resin 20 that are in direct contact with the optical circuit forming layer 3, an optical waveguide is formed wherein the higher refractive index portion 3a of the optical circuit forming layer 3 functions as the core layer 26 while the lower refractive index portion 3b of the optical circuit forming layer 3 and the light permeable resin layer 1 and the light permeable resin layer 20 function as the cladding layers 27, with the optical circuit formed by the higher refractive index portion 3a of the optical circuit forming layer 3, and thus such an optical circuit-electrical circuit mixedly mounting substrate is obtained that is constituted from the optical circuit formed by the higher refractive index portion 3a of the optical circuit forming layer 3, the electrical wiring 22 and the electrical wiring 24 which are stacked one on another.

FIG. 3(b), FIG. 3(c), FIG. 3(d) and FIG. 3(e) show other embodiments, FIG. 3(b) showing a case where the adhesive layer 14 having flame resistance is provided between the metal layer 13 and the resin layer similarly to that described above, FIG. 3(c) showing a case where the transparent cover film 15 is laminated on the resin layer on the side thereof opposite to the metal layer 13 similarly to that described above, FIG. 3(d) showing a case where the supporting member 16 is releasably attached to the metal layer 13 on the side thereof opposite to the side where the resin layer is provided similarly to that described above, and FIG. 3(e) showing a case where the material for the optical circuit-electrical circuit mixedly mounting substrates are formed on both sides of the supporting member 16 by providing the metal layers 13 on both sides of the supporting member 16.

Figure 5:
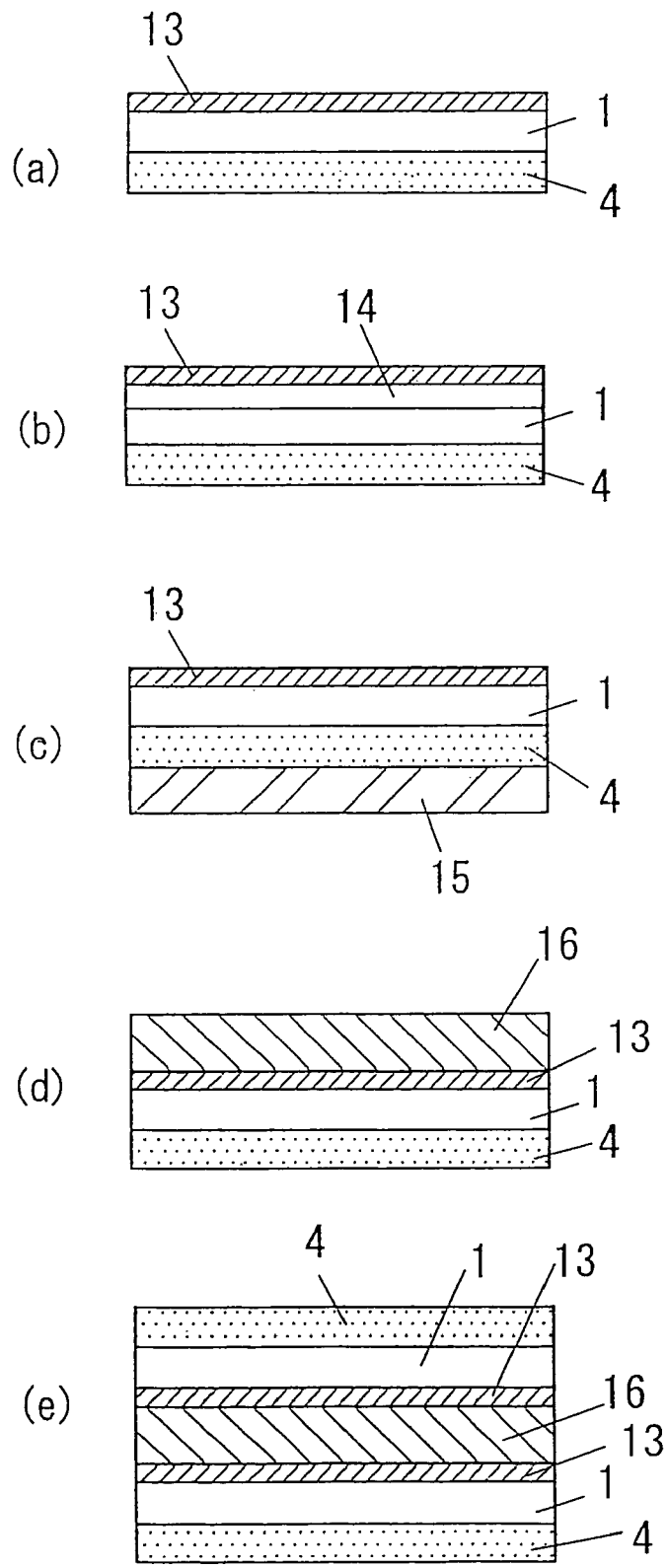
FIG. 5 shows other embodiment of the material for the optical circuit-electrical circuit mixedly mounting substratet according to the present invention.

FIG. 5(a) shows one example of an embodiment of the material for the optical circuit-electrical circuit mixedly mounting substrate according to the second aspect, wherein the optical circuit forming layer 4 is stacked on the light permeable resin layer 1 in direct contact with one side thereof, and the metal layer 13 is stacked on the light permeable resin layer 1 on the side opposite to the side on which the optical circuit forming layer 4 is provided. The light permeable resin layer 1 and the metal layer 13 may be formed by using the materials already mentioned.

The optical circuit forming layer 4 is made of a light permeable resin of which refractive index decreases when irradiated with the activating energy beam. The optical circuit forming layer 4 is made of such a resin that the refractive index of the portion that has not been irradiated with the activating energy beam is higher than that of the resin that forms the light permeable resin layer 1.

This the material for the optical circuit-electrical circuit mixedly mounting substrate can be made similarly to that already mentioned, in the case wherein a metal foil is used as the metal layer 13, by coating one side thereof, preferably a mat surface side thereof, with the resin that forms the light permeable resin layer 1 and coating the light permeable resin layer 1 with the resin that forms the optical circuit forming layer 4.

Figure 6:
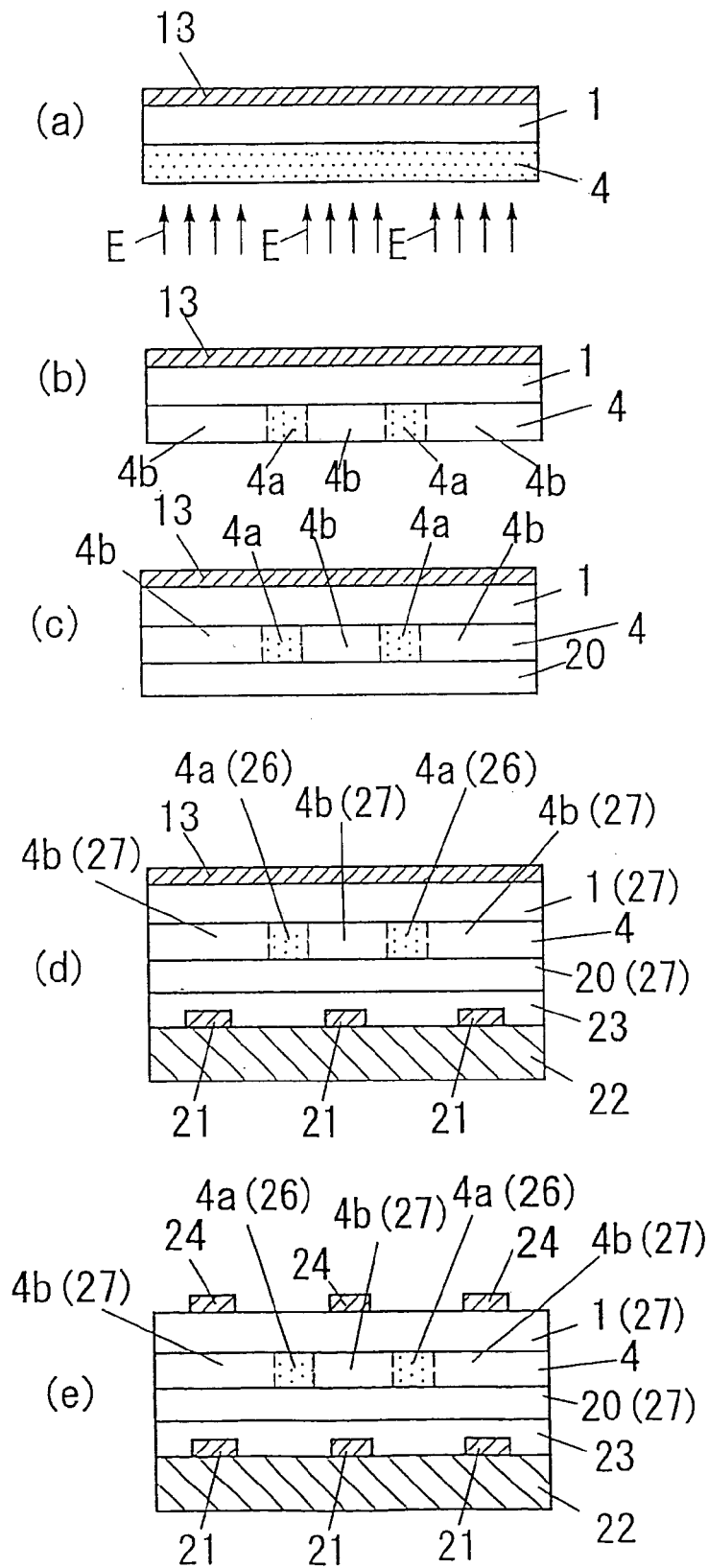
FIG. 6 shows the steps of manufacturing the optical circuit-electrical circuit mixedly mounting substrate from the material for the optical circuit-electrical circuit mixedly mounting substrate shown in FIG. 5(a), and FIG. 6(a) to FIG. 6(e) are schematic sectional views thereof.

Now, the method for manufacturing the optical circuit-electrical circuit mixedly mounting substrate using the material for the optical circuit-electrical circuit mixedly mounting substrate obtained as described above will be described below. First, as shown in FIG. 6(a), the optical circuit forming layer 4 is irradiated with the activating energy beam E on the side opposite to the metal layer 13. The irradiation of the activating energy beam is carried out in accordance to a reverse pattern to the core pattern of the optical circuit. Masked exposure to ultraviolet ray, exposure to laser beam or the like may be employed for the irradiation with the activating energy beam. While the refractive index of the portion of the optical circuit forming layer 4 that has not been irradiated with the activating energy beam does not change, the refractive index of the portion that has been irradiated decreases, so that a higher refractive index portion 4a that has not been irradiated and a lower refractive index portion 4b that has been irradiated are formed in the optical circuit forming layer 4. The refractive index of the higher refractive index portion 4a of the optical circuit forming layer 4 is higher than that of the light permeable resin layer 1.

After forming the high refractive index portion 4a in the pattern of the optical circuit on the optical circuit forming layer 4 as shown in FIG. 6(b), the optical circuit forming layer 4 is coated with the light permeable resin layer 20 on the surface thereof opposite to the side on which the light permeable resin layer 1 is provided, so as to cover the optical circuit forming layer 4 with the light permeable resin layer 20 as shown in FIG. 6(c). The light permeable resin layer 20 is made of a transparent resin that has a refractive index lower than that of the higher refractive index portion 4a of the optical circuit forming layer 4, and for example the same resin as the light transmitting resin 1 may be used. Then a printed wiring board 22 having an electric wiring 21 formed thereon is used, and the light permeable resin layer 20 is bonded onto the surface of the printed wiring board 22 by using the adhesive 23 as shown in FIG. 6(d). The metal layer 13 on the surface is then processed to form the electrical wiring 24 as shown in FIG. 6(e), and the electrical wiring 21 and the electrical wiring 24 may be electrically connected with each other by processing of via hole by laser or plating.

In FIG. 6(e), since the refractive index of the higher refractive index portion 4a in the optical circuit pattern of the optical circuit forming layer 4 is higher than the refractive indices of the lower refractive index portion 4b of the optical circuit forming layer 4, the light permeable resin layer 1 and the light permeable resin layer 20 that make direct contact with the optical circuit forming layer 4, an optical waveguide is formed wherein a core layer 26 is made of the higher refractive index portion 4a of the optical circuit forming layer 4, while the cladding layer 27 are made of the lower refractive index portion 4b of the optical circuit forming layer 4, the light permeable resin layer 1 and the light permeable resin layer 20, with the optical circuit formed by the higher refractive index portion 4a of the optical circuit forming layer 4, thus such an optical circuit-electrical circuit mixedly mounting substrate is obtained that is constituted from the optical circuit formed by the higher refractive index portion 4a of the optical circuit forming layer 4, the electrical wiring 21 and the electrical wiring 24 which are stacked one on another.

FIG. 5(b), FIG. 5(c), FIG. 5(d) and FIG. 5(e) show other embodiments, FIG. 5(b) showing a case where the adhesive layer 14 having flame resistance is provided between the metal layer 13 and the resin layer similarly to that described above, FIG. 5(c) showing a case where a transparent cover film 15 is laminated on the resin layer on the side thereof opposite to the metal layer 13 similarly to that described above, FIG. 5(d) showing a case where a supporting member 16 is releasably attached to the metal layer 13 on the side thereof opposite to the side where the resin layer is provided similarly to that described above, and FIG. 5(e) showing a case where the material for the optical circuit-electrical circuit mixedly mounting substrates are formed on both sides of the supporting member 16 by providing the metal layers 13 on both sides of the supporting member 16.

Figure 7:
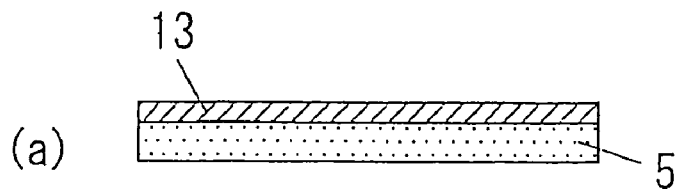
FIG. 7 shows other embodiment of the material for the optical circuit-electrical circuit mixedly mounting substrate according to the present invention.
Figure 7:
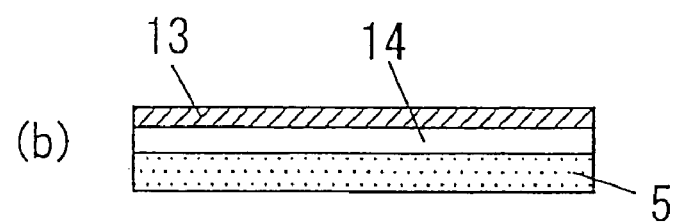
Figure 7:
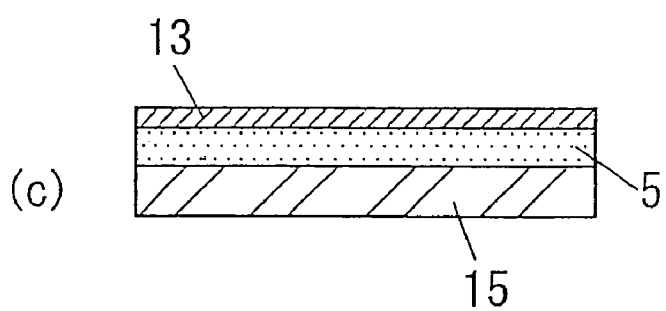
Figure 7:
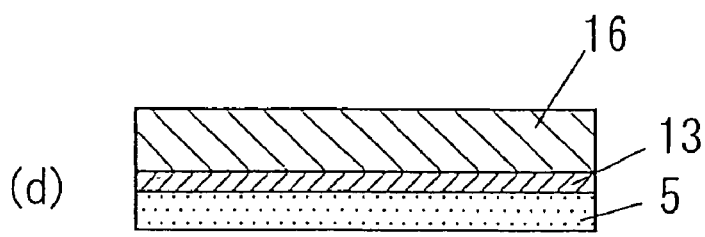
Figure 7:
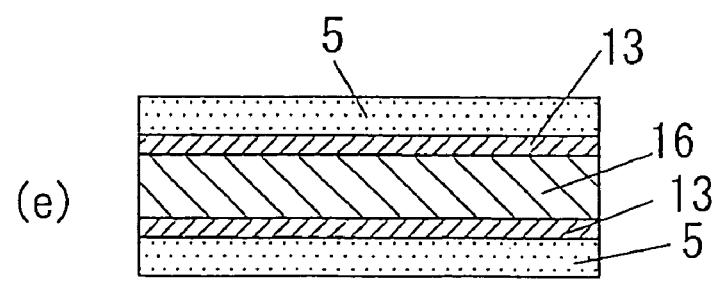

FIG. 7(a) shows one example of an embodiment of the present invention according to the eighth or ninth aspect, wherein the metal layer 13 is provided on one side of the optical circuit forming layer 5 that is made of a light permeable resin of which refractive index changes when irradiated with the activating energy beam. The metal layer 13 may be formed by using the material already mentioned. The optical circuit forming layer 5 may be made of a resin of which refractive index changes when irradiated with the activating energy beam, either one described previously of which refractive index increases when irradiated with the activating energy beam and one of which refractive index decreases when irradiated with the activating energy beam. In the case wherein a metal foil is used as the metal layer 13, the material for the optical circuit-electrical circuit mixedly mounting substrate can be made similarly to that described above, by coating the mat surface of the metal foil with the resin that forms the optical circuit forming layer 5.

Figure 8:
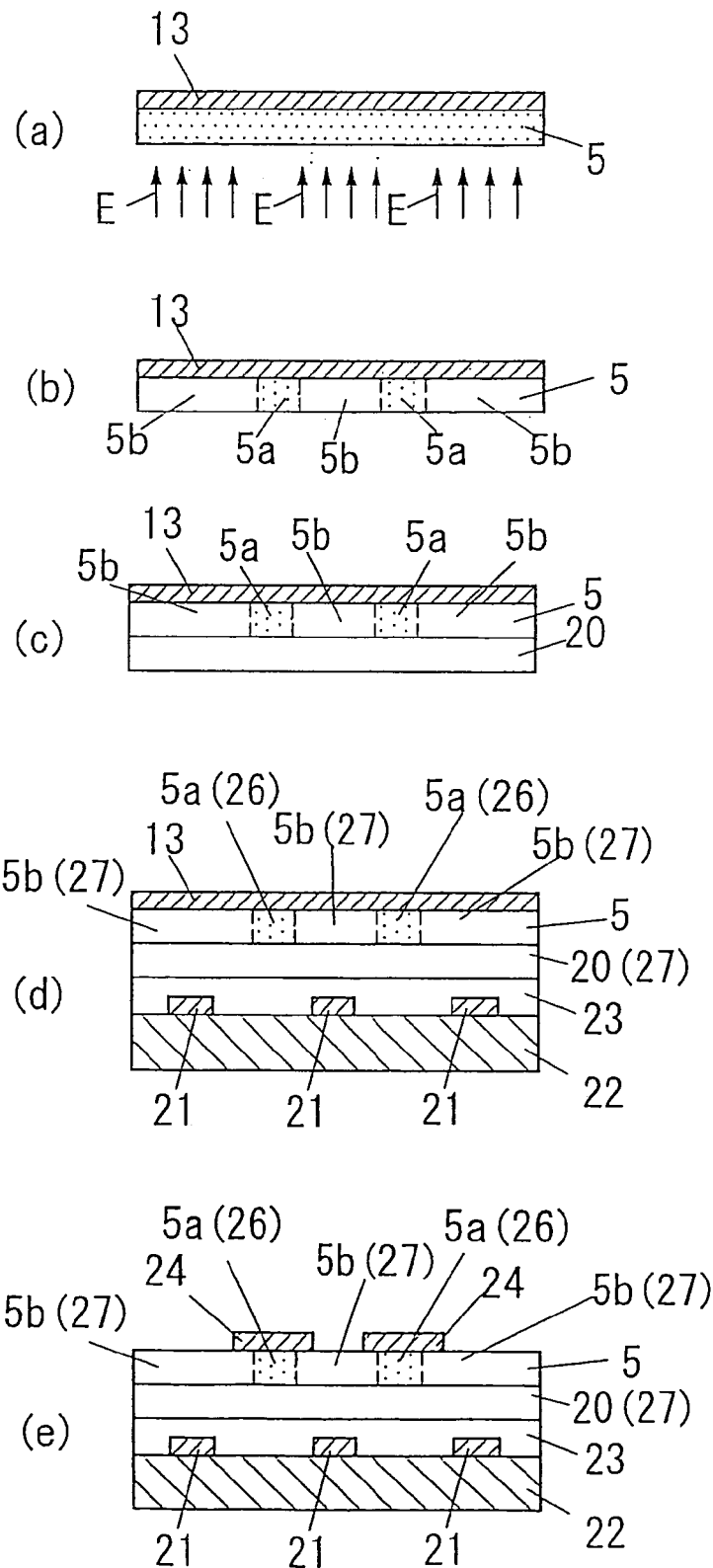
FIG. 8 shows the steps of manufacturing the optical circuit-electrical circuit mixedly mounting substrate from the material for the optical circuit-electrical circuit mixedly mounting substrate shown in FIG. 7(a), and FIG. 8(a) to FIG. 8(e) are schematic sectional views thereof.

Now, the method for manufacturing the material for the optical circuit-electrical circuit mixedly mounting substrate using the material for the optical circuit-electrical circuit mixedly mounting substrate obtained as described above will be described below. First, as shown in FIG. 8(a), the optical circuit forming layer 5 is irradiated with the activating energy beam E on the side opposite to the metal layer 13. In the case wherein the optical circuit forming layer 5 is made of a resin of which refractive index decreases when irradiated with the activating energy beam, the irradiation of the activating energy beam is carried out in accordance to a reverse pattern to the optical circuit. Masked exposure to ultraviolet ray, exposure to laser beam or the like may be employed for the irradiation with the activating energy beam. While the refractive index of the portion of the optical circuit forming layer 5 that has not been irradiated with the activating energy beam does not change, the refractive index of the portion that has been irradiated decreases, so that a higher refractive index portion 5a that has not been irradiated and a lower refractive index portion 5b that has been irradiated are formed in the optical circuit forming layer 5.

After forming the higher refractive index portion 5a in the pattern of the optical circuit on the optical circuit forming layer 5 as shown in FIG. 8(b), the optical circuit forming layer 5 is coated with the light permeable resin layer 20 on the surface thereof opposite to the side on which the metal layer 13 is provided, so as to cover the optical circuit forming layer 5 with the light permeable resin layer 20 as shown in FIG. 8(c). The light permeable resin layer 20 is made of a transparent resin that has a refractive index lower than that of the higher refractive index portion 5a of the optical circuit forming layer 5, and for example the same resin as the light permeable resin layer 1 may be used. Then a printed wiring board 22 having an electric wiring 21 formed thereon is prepared, and the light permeable resin layer 20 is bonded onto the surface of the printed wiring board 22 by using the adhesive 23 as shown in FIG. 8(d). The metal layer 13 on the surface is then processed to form an electrical wiring 24 as shown in FIG. 8(e), and the electrical wiring 21 and the electrical wiring 24 can be electrically connected with each other by via hole processing by laser or plating. In this case, it is preferable that a portion of the metal layer 13 that portion is related to the higher refractive index portion 5a of the optical circuit forming layer 5 (the portion of the metal layer 13 which portion is located on the higher refractive index portion 5a in the embodiment shown in the drawing) is left to remain, or an electrical wiring 24 is formed from the metal layer 13 as a portion of the metal layer 13 that portion is related to the higher refractive index portion 5a of the optical circuit forming layer 5.

In FIG. 8(e), since the refractive index of the higher refractive index portion 5a in the optical circuit pattern of the optical circuit forming layer 5 is higher than the refractive indices of the lower refractive index portion 5b of the optical circuit forming layer 5 and the light permeable resin layer 20 of the optical circuit forming layer 5 that make direct contact with the optical circuit forming layer 5, and also the higher refractive index portion 5a contacts with the metal layer 13 which reflects light, an optical waveguide is formed wherein the higher refractive index portion 5a of the optical circuit forming layer 5 forms a core layer 26, while cladding layers 27 are formed from the lower refractive index portion 5b of the optical circuit forming layer 5 and the optical circuit forming layer 5, with the optical circuit-electrical circuit mixedly mounting substrate obtained which includes the optical circuit formed by the higher refractive index portion 5a of the optical circuit forming layer 5, the electrical circuit 21 and the electrical circuit 24 which are stacked one on another.

In the case where the optical circuit forming layer 5 is made of a light permeable resin of which refractive index increases when irradiated with the activating energy beam, a duration and an intensity of the irradiation with the activating energy beam may be controlled so as to form the higher refractive index portion 5a in the optical circuit forming layer 5 only in the side thereof which contacts the light permeable resin 20, similarly to the case shown in FIG. 14(b) to be described later.

FIG. 7(b), FIG. 7(c), FIG. 7(d) and FIG. 7(e) show other embodiments, FIG. 7(b) showing a case wherein an adhesive layer 14 having flame resistance is provided between the metal layer 13 and the resin layer similarly to that described above, FIG. 7(c) showing a case wherein a transparent cover film 15 is laminated on the resin layer on the side thereof opposite to the metal layer 13 similarly to that described above, FIG. 7(d) showing a case wherein a supporting member 16 is releasably attached to the metal layer 13 on the side thereof opposite to the side on which the resin layer is provided similarly to that described above, and FIG. 7(e) showing a case wherein the material for the optical circuit-electrical circuit mixedly mounting substrates are formed on both sides of the supporting member 16 by providing the metal layers 13 on both sides of the supporting member 16.

Figure 9:
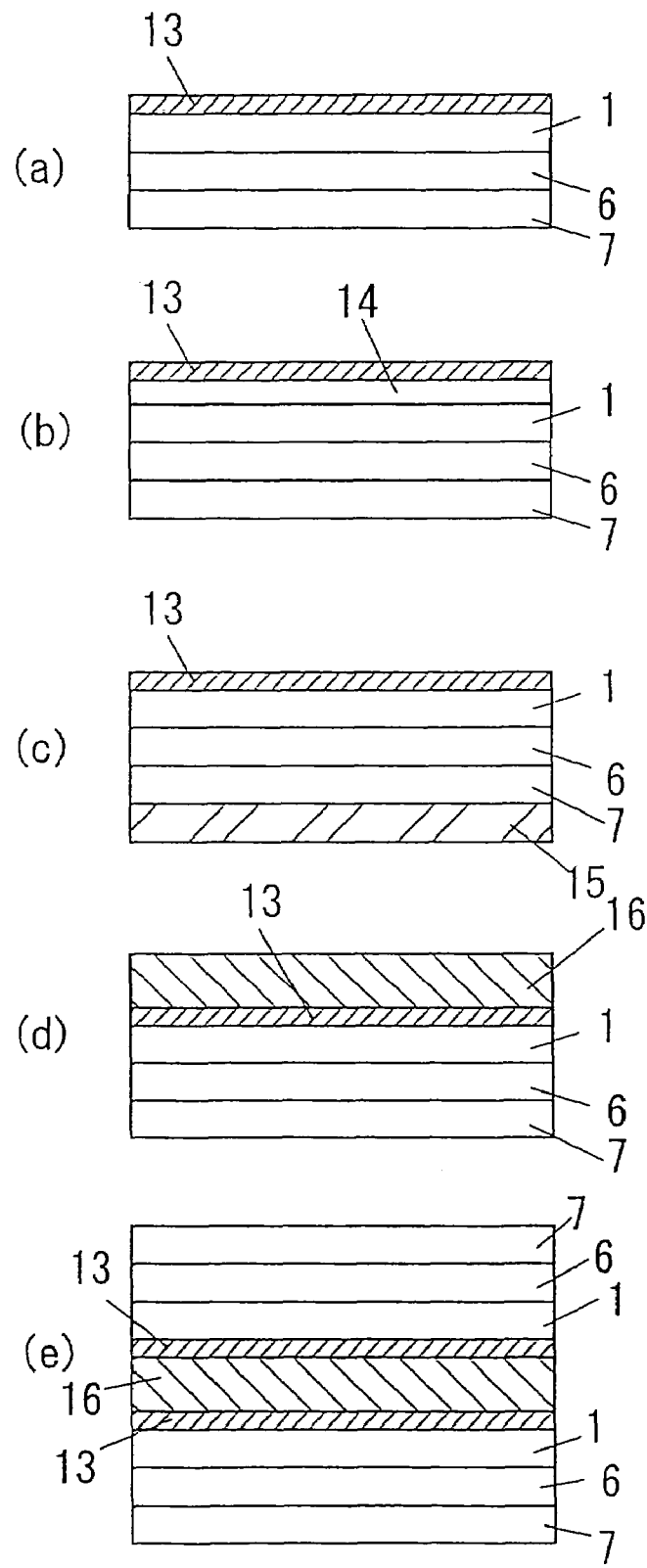
FIG. 9 shows other embodiment of the material for the optical circuit-electrical circuit mixedly mounting substrate according to the present invention.

FIG. 9(a) shows one example of an embodiment of the present invention according to the third aspect, wherein an optical circuit forming layer 6 is stacked on the first light permeable resin layer 1 in direct contact with one side thereof, and the second light permeable resin layer 7 is stacked on the optical circuit forming layer 6 on the side opposite to the side on which the light permeable resin layer 1 is provided, and the metal layer 13 is formed on the light permeable resin layer 1 on its side opposite to the side on which the optical circuit forming layer 6 is provided.

The light permeable resin layer 1 and the metal layer 13 may be formed by using the materials already mentioned. The second light permeable resin layer 7 is made of a light permeable resin that preferably has a refractive index which is comparable to that of the first light permeable resin layer 1, and such light permeable resin be similar to the resin used in forming the first light permeable resin layer 1. The optical circuit forming layer 6 is made of a light permeable resin of which refractive index changes to increase when irradiated with the activating energy beam. For the resin of which refractive index increases when irradiated with the activating energy beam, the same resin as that used in forming the optical circuit forming layer 3 may be used. The optical circuit forming layer 6 is made of such a resin that its refractive index of the portion irradiated with the activating energy beam becomes higher than those of the portion that has not been irradiated with the activating energy beam, the resin that forms the light permeable resin layer 1 and the resin that forms the second light permeable resin layer 7.

This optical circuit-electrical circuit mixedly mounting substrate can be made similarly to that already mentioned, in the case wherein a metal foil is used as the metal layer 13, by coating a mat surface side thereof with the resin that forms the light permeable resin layer 1, coating the light permeable resin layer 1 with the resin that forms the optical circuit forming layer 6, and further coating the light circuit forming layer 6 with the resin that forms the second light permeable resin layer 7.

Figure 10:
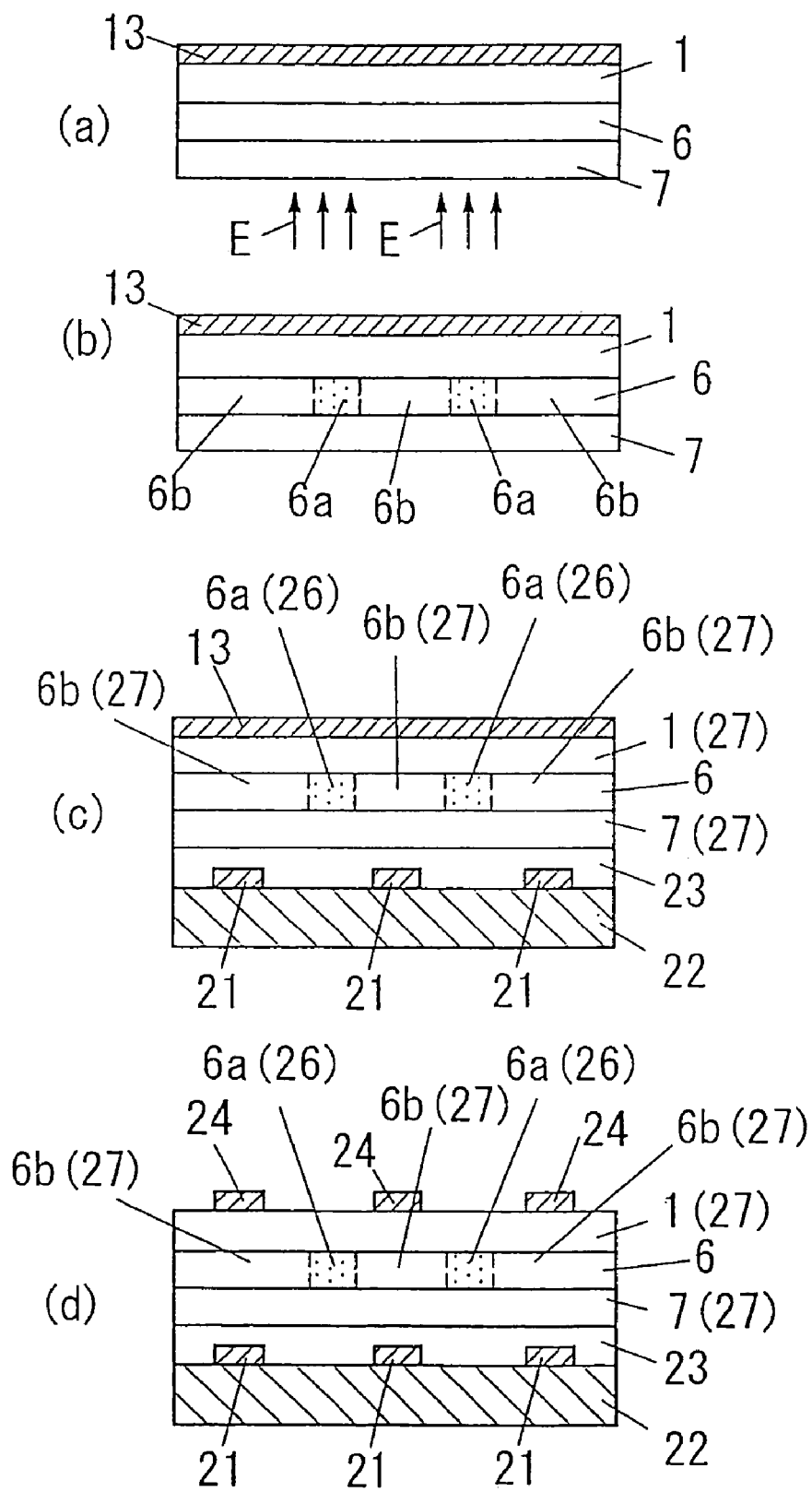
FIG. 10 shows the steps of manufacturing the optical circuit-electrical circuit mixedly mounting substrate from the material for the optical circuit-electrical circuit mixedly mounting substrate shown in FIG. 9(a), and FIG. 10(a) to FIG. 10(d) are schematic sectional views thereof.

Now, the method for manufacturing the optical-electrical hybrid circuit board using the material for the optical circuit-electrical circuit mixedly mounting substrate obtained as described above will be described below. First, as shown in FIG. 10(a), the optical circuit forming layer 6 is irradiated with the activating energy beam E on its side opposite to the metal layer 13 through the second light permeable resin layer 7. The irradiation of the activating energy beam is carried out in accordance to the pattern of the optical circuit. Masked exposure to ultraviolet ray, exposure to laser beam or the like may be employed for the irradiation with the activating energy beam. While the refractive index of a portion of the optical circuit forming layer 6 that portion has not been irradiated with the activating energy beam does not change, the refractive index of a portion that has been irradiated increases, so that a higher refractive index portion 6a that has been irradiated and a lower refractive index portion 6b that has not been irradiated are formed in the optical circuit forming layer 6. The refractive index of the higher refractive index portion 6a of the optical circuit forming layer 6 is higher than those of the light permeable resin layer 1 and the second light permeable resin layer 7.

After forming the higher refractive index portion 6a in the pattern of the optical circuit on the optical circuit forming layer 6 as shown in FIG. 10(b), an adhesive layer 23 is provided on the second light permeable resin layer 7 on the side thereof opposite to its side on which the optical circuit forming layer 6 is provided, which is then bonded with the adhesive 23 onto a surface of a printed wiring board 22 that has been made with the electrical wiring 21 formed thereon, as shown in FIG. 10(c). The metal layer 13 on the surface is then processed to form an electrical wiring 24 as shown in FIG. 10(d), and the electrical wiring 21 and the electrical wiring 24 may be electrically connected with each other by via hole processing by laser or plating.

In FIG. 10(d), since the refractive index of the higher refractive index portion 6a in the optical circuit pattern of the optical circuit forming layer 6 is higher than the refractive indices of the lower refractive index portion 6b of the optical circuit forming layer 6, the light permeable resin layer 1 and the second light permeable resin layer 7 that make direct contact with the optical circuit forming layer 6, an optical waveguide is formed wherein a core layer 26 is made of the higher refractive index portion 6a of optical circuit forming layer 6 while the cladding layers 27 are made of the lower refractive index portion 6b of the optical circuit forming layer 6, the light permeable resin layer 1 and the second light permeable resin layer 7, so that the optical circuit is formed by the higher refractive index portion 6a of the optical circuit forming layer 6, and thus an optical circuit-electrical circuit mixedly mounting substrate is obtained that is constituted from the optical circuit formed by the higher refractive index portion 6a of the optical circuit forming layer 6, the electrical wiring 21 and the electrical wiring 24 which are stacked one on another.

FIG. 9(b), FIG. 9(c), FIG. 9(d) and FIG. 9(e) show other embodiments, FIG. 9(b) showing a case wherein the adhesive layer 14 having flame resistance is provided between the metal layer 13 and the resin layer similarly to that described above, FIG. 9(c) showing a case wherein a transparent cover film 15 is laminated on the resin layer on the side thereof opposite to the metal layer 13 similarly to that described above, FIG. 9(d) showing a case wherein a supporting member 16 is releasably attached to the metal layer 13 on the side thereof opposite to the side where the resin layer is provided similarly to that described above, and FIG. 9(e) showing a case wherein the material for the optical circuit-electrical circuit mixedly mounting substrate is formed on each side of the supporting member 16 by providing the metal layer 13 on each side of the supporting member 16.

Figure 11:
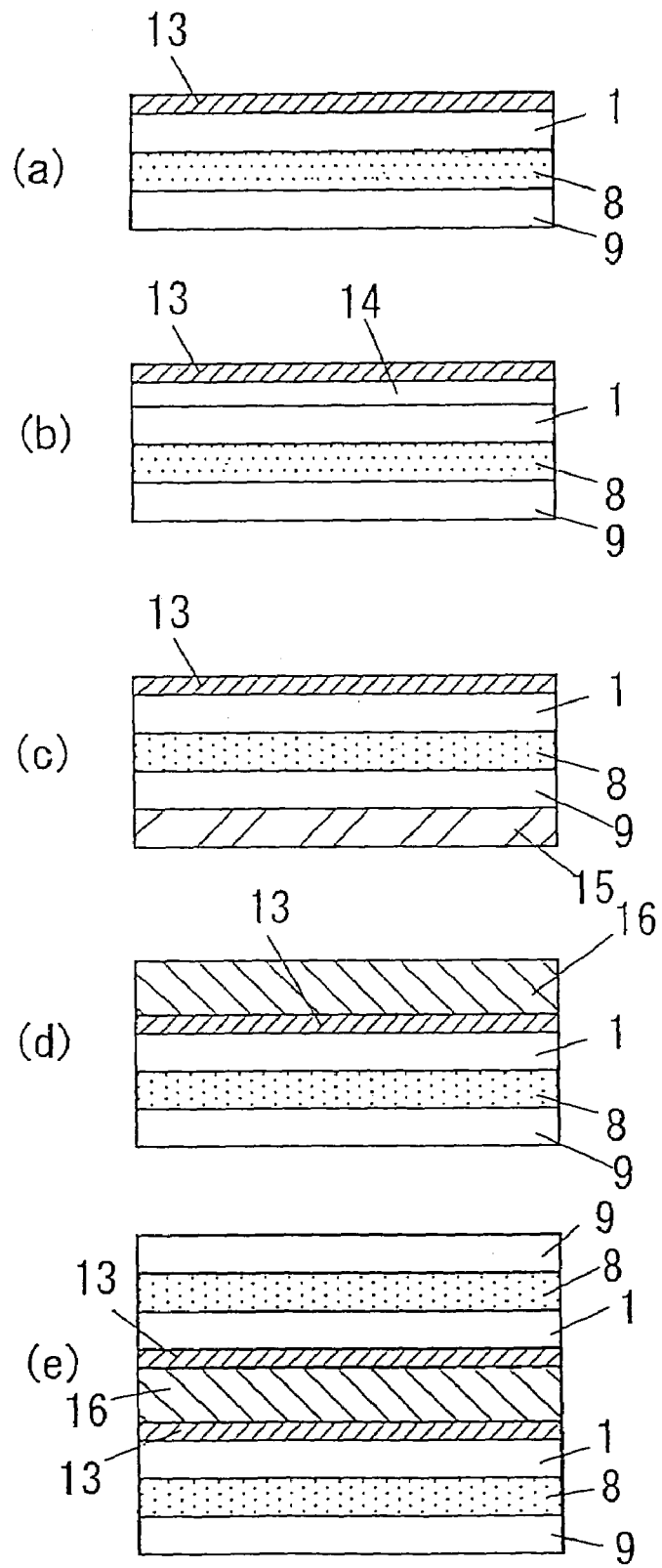
FIG. 11 shows other embodiment of the material for the optical circuit-electrical circuit mixedly mounting substrate according to the present invention.

FIG. 11(a) shows one example of an embodiment of the present material for the optical circuit-electrical circuit mixedly mounting substrate according to the fourth aspect, wherein the optical circuit forming layer 8 is stacked on the first light permeable resin layer 1 in direct contact with one side thereof, and the second light permeable resin layer 9 is stacked on the optical circuit forming layer 8 in direct contact with the surface thereof opposite to the side on which the first light permeable resin layer 1 is provided, and the metal layer 13 is formed on the first light permeable resin layer 1 on the side opposite to the side on which the optical circuit forming layer 8 is provided.

The first light permeable resin layer 1 and the metal layer 13 may be formed by using the materials already mentioned. The second light permeable resin layer 9 is made of a light permeable resin that preferably has a refractive index comparable to that of the first light permeable resin layer 1, which may be similar to the resin used in forming the first light permeable resin layer 1. The optical circuit forming layer 8 is made of a light permeable resin of which refractive index decreases when irradiated with the activating energy beam. For the resin of which refractive index decreases when irradiated with the activating energy beam, the same resin as that used in forming the optical circuit forming layer 4 may be used. The optical circuit forming layer 8 is made of such a resin that the refractive index of the portion that has not been irradiated with the activating energy beam becomes higher than those of the resin that forms the first light permeable resin layer 1 and the resin that forms the second light permeable resin layer 9.

This the optical circuit-electrical circuit mixedly mounting substrate can be made similarly to that already mentioned, in the case wherein a metal foil is used as the metal layer 13, by coating a mat surface thereof with the resin that forms the light permeable resin layer 1 and coating the light permeable resin layer 1 with the resin that forms the optical circuit forming layer 8, and further coating the optical circuit forming layer 8 with the resin that forms the second light permeable resin layer 9.

Figure 12:
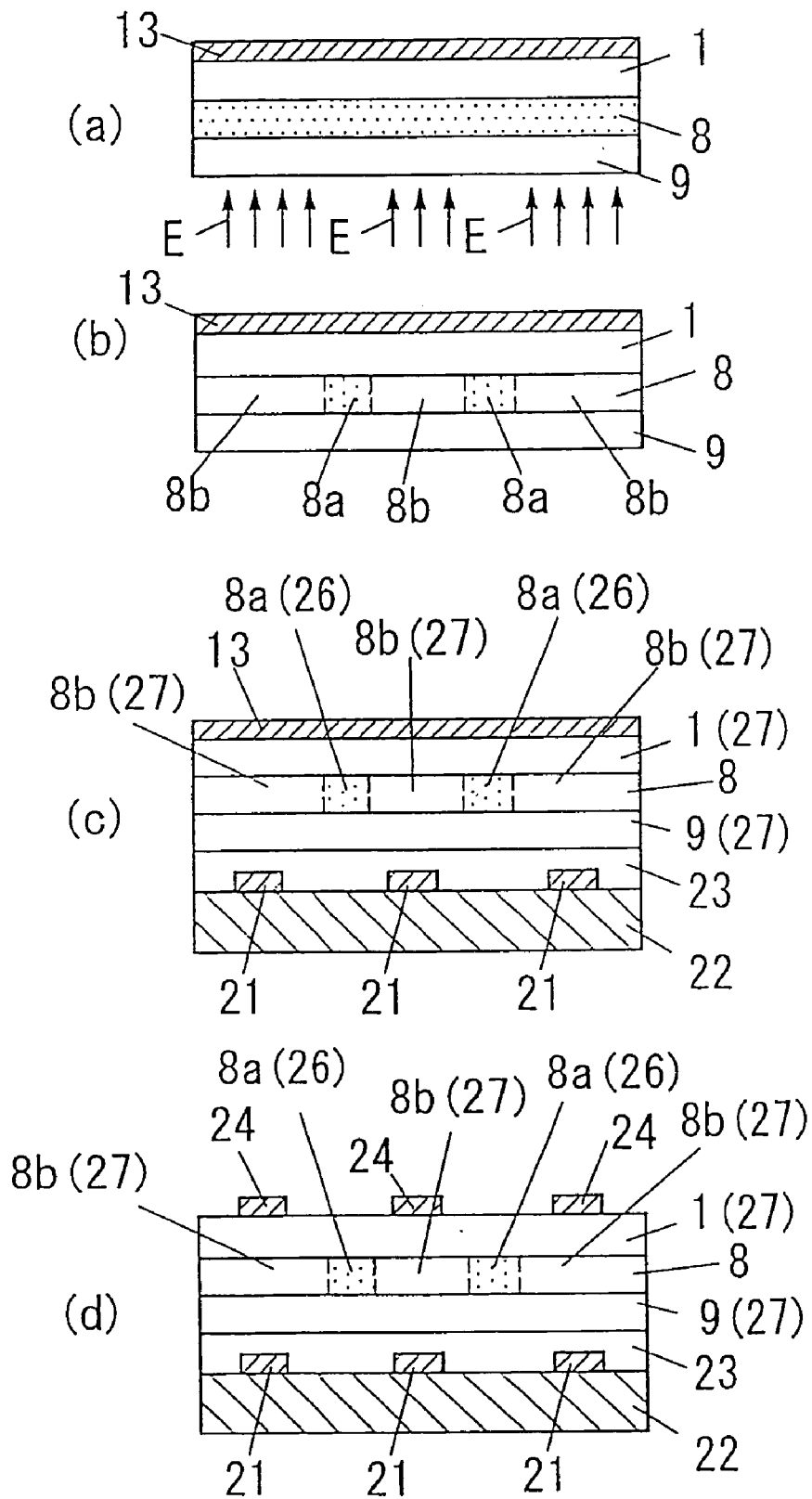
FIG. 12 shows the steps of manufacturing the optical circuit-electrical circuit mixedly mounting substrate from the material for the optical circuit-electrical circuit mixedly mounting substrate shown in FIG. 11(a), and FIG. 12(a) to FIG. 12(d) are schematic sectional views thereof.

Now, the method for manufacturing the optical circuit-electrical circuit mixedly mounting substrate using the material for the optical circuit-electrical circuit mixedly mounting substrate obtained as described above will be described below. First, as shown in FIG. 12(*a*), the optical circuit forming layer 8 is irradiated with the activating energy beam E on the side thereof opposite to the metal layer 13 through the second light permeable resin layer 9. The irradiation of the activating energy beam is carried out in accordance to the reverse pattern to the optical circuit. Masked exposure to ultraviolet ray, exposure to laser beam or the like may be employed for the irradiation with the activating energy beam. While the refractive index of the portion of the optical circuit forming layer 8 that portion has not been irradiated with the activating energy beam does not change, the refractive index of the portion that has been irradiated decreases, so that a higher refractive index portion 8*a* that has not been irradiated and a lower refractive index portion 8*b* that has been irradiated are formed in the optical circuit forming layer 8. The refractive index of the higher refractive index portion 8*a* of the optical circuit forming layer 8 is higher than those of the light permeable resin layer 1 and the second light permeable resin layer 9.

After forming the higher refractive index portion 8*a* in the pattern of the optical circuit in the optical circuit forming layer 8 as shown in FIG. 12(*b*), the adhesive layer 23 is provided on the second light permeable resin layer 9 on the surface thereof opposite to the side on which the optical circuit forming layer 8 is provided, which is then bonded with the adhesive 23 onto a surface of the printed wiring board 22 that has been made with the electrical wiring 21 formed thereon, as shown in FIG. 12(*c*). The metal layer 13 on the surface is then processed to form the electrical wiring 24 as shown in FIG. 12(*d*), and the electrical wiring 21 and the electrical wiring 24 can be electrically connected with each other by via hole processing by laser or plating.

In FIG. 12(*d*), since the refractive index of the higher refractive index portion 8*a* of the optical circuit pattern of the optical circuit forming layer 8 is higher than the refractive indices of the lower refractive index portion 8*b* of the optical circuit forming layer 8, the light permeable resin layer 1 and the second light permeable resin layer 9 that make direct contact with the optical circuit forming layer 8, an optical waveguide is formed from a core layer 26 made of the higher refractive index portion 8*a* of the optical circuit forming layer 8 and the cladding layers 27 made of the lower refractive index portion 8*b* of the optical circuit forming layer 8, the light permeable resin 1 and the second light permeable resin layer 9, so that the optical circuit is formed by the higher refractive index portion 8*a* of the optical circuit forming layer 8, and thus an optical circuit-electrical circuit mixedly mounting substrate is obtained that is constituted from the optical circuit formed by the higher refractive index portion 8*a* of the optical circuit forming layer 8, the electrical wiring 21 and the electrical wiring 24 which are stacked one on another.

FIG. 11(*b*), FIG. 11(*c*), FIG. 11(*d*) and FIG. 11(*e*) show other embodiments, FIG. 11(*b*) showing a case wherein an adhesive layer 14 having flame resistance is provided between the metal layer 13 and the resin layer similarly to that described above, FIG. 11(*c*) showing a case wherein a transparent cover film 15 is laminated on the resin layer on the side thereof opposite to the metal layer 13 similarly to that described above, FIG. 11(*d*) showing a case wherein a supporting member 16 is releasably attached to the metal layer 13 on the side thereof opposite to the side where the resin layer is provided similarly to that described above, and FIG. 11(*e*) showing a case wherein the material for the optical circuit-electrical circuit mixedly mounting substrate is formed on each side of the supporting member 16 by providing the metal layer 13 on each side of the supporting member 16.

Figure 13:
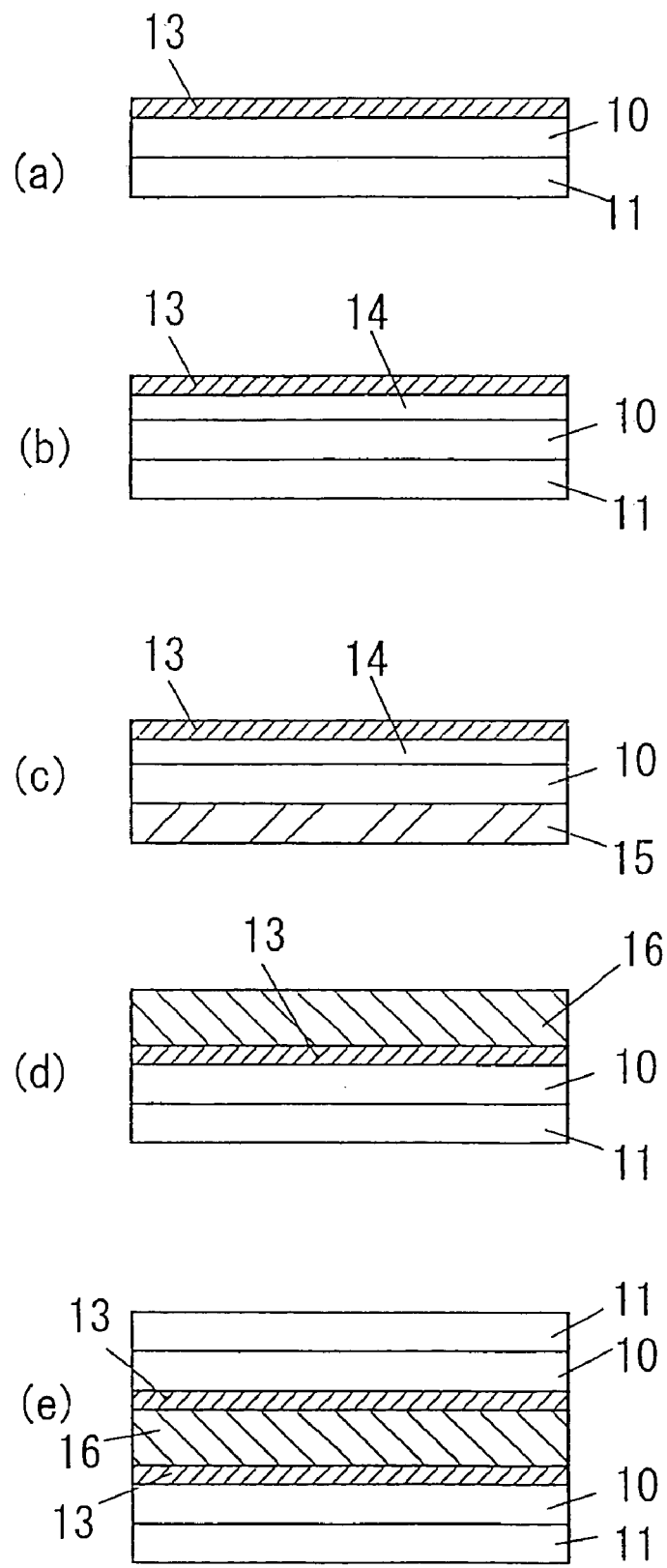
FIG. 13 shows other embodiment of the material for the optical circuit-electrical circuit mixedly mounting substrate according to the present invention.

FIG. 13(*a*) shows one example of embodiment of the present invention according to the tenth aspect, wherein a light permeable resin layer 11 is stacked on an optical circuit forming layer 10 in direct contact with one side thereof, and a metal layer 13 is stacked on the optical circuit forming layer 10 on the side opposite to the side on which the light permeable resin layer 11 is provided.

The metal layer 13 may be formed by using the materials already mentioned. The light permeable resin layer 11 is made of a light permeable resin which may be similar to the resin used in forming the first light permeable resin layer 1. The optical circuit forming layer 10 is made of a light permeable resin of which refractive index increases when irradiated with the activating energy beam. For the resin of which refractive index increases when irradiated with the activating energy beam, the same resin as that used in forming the optical circuit forming layer 3 may be used. The optical circuit forming layer 10 is made of a resin such that the refractive index of the portion that has been irradiated with the activating energy beam becomes higher than those of the portion that has not been irradiated with the activating energy beam and the resin that forms the light permeable resin layer 11.

This optical circuit-electrical circuit mixedly mounting substrate can be made similarly to that already mentioned, in the case wherein a metal foil is used as the metal layer 13, by coating a mat surface thereof with the resin that forms the optical circuit forming layer 10, and coating the optical circuit forming layer 10 with the resin that forms the light permeable resin layer 11.

Figure 14:
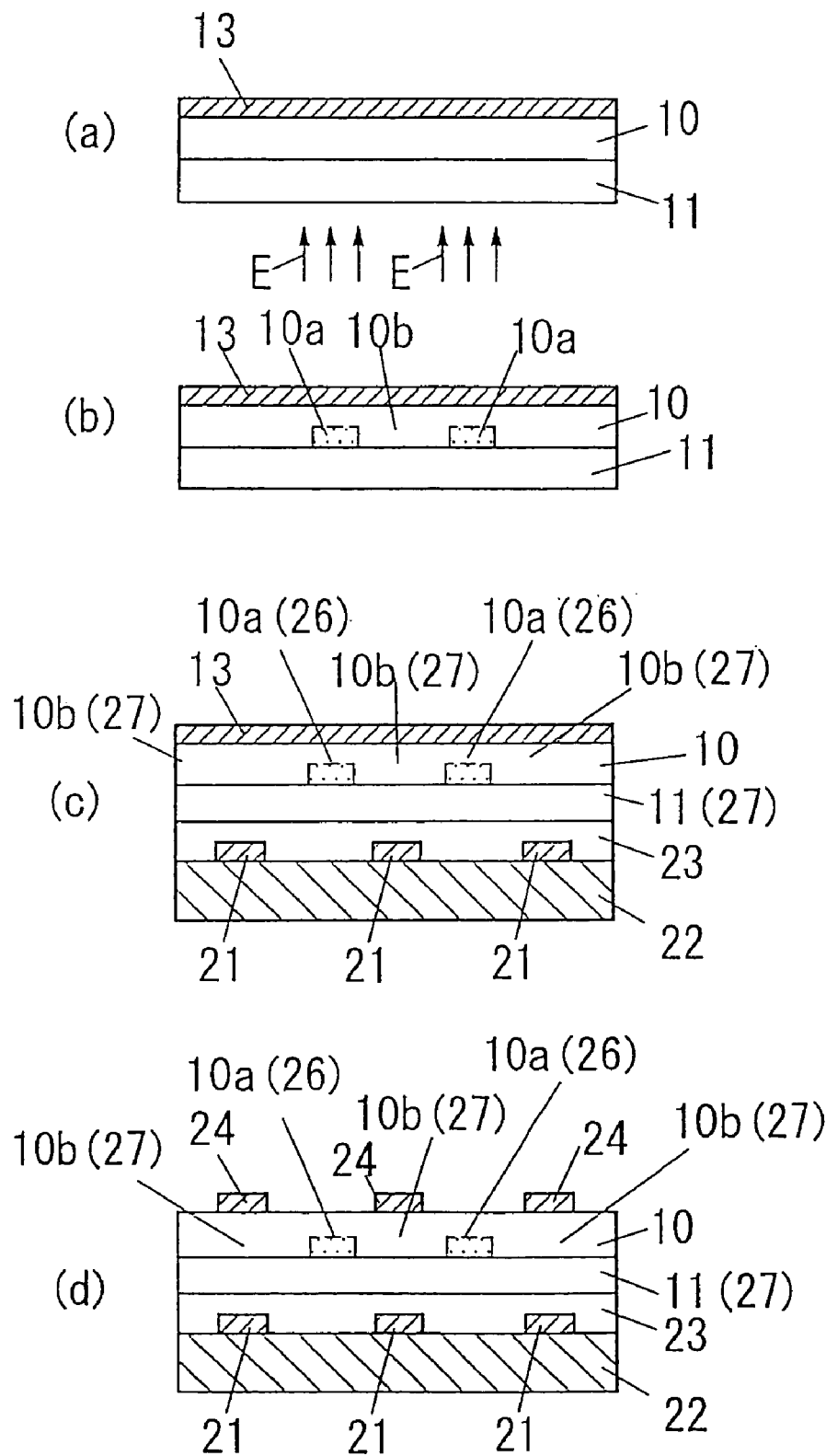
FIG. 14 shows the steps of manufacturing the optical circuit-electrical circuit mixedly mounting substrate from the material for the optical circuit-electrical circuit mixedly mounting substrate shown in FIG. 13(a), and FIG. 14(a) to FIG. 14(d) are schematic sectional views thereof.

Now, the method for manufacturing the optical circuit-electrical circuit mixedly mounting substrate using the material for the optical circuit-electrical circuit mixedly mounting substrate obtained as described above will be described below. First, as shown in FIG. 14(*a*), the optical circuit forming layer 10 is irradiated with an activating energy beam E on the side thereof opposite to the metal layer 13 through the light permeable resin layer 11. The irradiation of the activating energy beam is carried out in accordance to the pattern of the optical circuit. Masked exposure to ultraviolet ray, exposure to laser beam or the like may be employed for the irradiation with the activating energy beam. While the refractive index of the portion of the optical circuit forming layer 10 that has not been irradiated with the activating energy beam does not change, the refractive index of the portion that has been irradiated increases, so that a higher refractive index portion 10*a* that has been irradiated and a lower refractive index portion 10*b* that has not been irradiated are formed in the optical circuit forming layer 10. The refractive index of the higher refractive index portion 10a of the optical circuit forming layer 10 is higher than that of the light permeable resin layer 11.

The higher refractive index portion 10a can be formed in the pattern of the optical circuit in the optical circuit forming layer 10 as described above and is shown in FIG. 14(b). It is preferable to control the duration and intensity of the irradiation of the activating energy beam, so that the higher refractive index portion 10a of the optical circuit forming layer 10 is formed in a portion that is on only the side adjacent to the light permeable resin layer 11, and that does not reach the other side in contact with the metal layer 13. In other words, a portion 10a of the optical circuit forming layer which portion extends partway along a thickness direction and which portion does not reach the metal layer 13 becomes to have the higher refractive index. In this way, after forming the higher refractive index portion 10a of the pattern of optical circuit in the optical circuit forming layer 10, the adhesive layer 23 is provided on the light permeable resin layer 11 on the surface thereof opposite to the side on which the optical circuit forming layer 10 is provided, which is then bonded with the adhesive 23 onto the surface of the printed wiring board 22 that has been made with the electrical wiring 21 formed thereon, as shown in FIG. 14(c). The metal layer 13 on the surface is then processed to form the electrical wiring 24 as shown in FIG. 14(d), and the electrical wiring 21 and the electrical wiring 24 can be electrically connected with each other by via hole processing with laser or plating.

In FIG. 14(d), since refractive index of the higher refractive index portion 10a of the optical circuit pattern of the optical circuit forming layer 10 is higher than the refractive indices of the lower refractive index portion 10b of the optical circuit forming layer 10 and the light permeable resin layer 11 that makes direct contact with the optical circuit forming layer 10, an optical waveguide is formed from the core layer 26 made of the higher refractive index portion 10a of the optical circuit forming layer 10 and the cladding layers 27 made of the low refractive index portion 10b of the optical circuit forming layer 10 and the light permeable resin layer 11, so that the optical circuit is formed by the higher refractive index portion 11a of the light permeable resin layer 11, and thus an optical circuit-electrical circuit mixedly mounting substrate is obtained that is constituted from the optical circuit formed by the higher refractive index portion 10a of the optical circuit forming layer 10, the electrical wiring 21 and the electrical wiring 24 which are stacked one on another.

FIG. 13(b), FIG. 13(c), FIG. 13(d) and FIG. 13(e) show other embodiments, FIG. 13(b) showing a case wherein an adhesive layer 14 having flame resistance is provided between the metal layer 13 and the resin layer similarly to that described above, FIG. 13(c) showing a case wherein a transparent cover film 15 is laminated on the resin layer on the side thereof opposite to the metal layer 13 similarly to that described above, FIG. 13(d) showing a case wherein a supporting member 16 is releasably attached to the metal layer 13 on the side thereof opposite to the side where the resin layer is provided similarly to that described above, and FIG. 13(e) showing a case wherein the material for the optical circuit-electrical circuit mixedly mounting substrate is formed on each side of the supporting member 16 by providing the metal layer 13 on each side of the supporting member 16.

Figure 15:
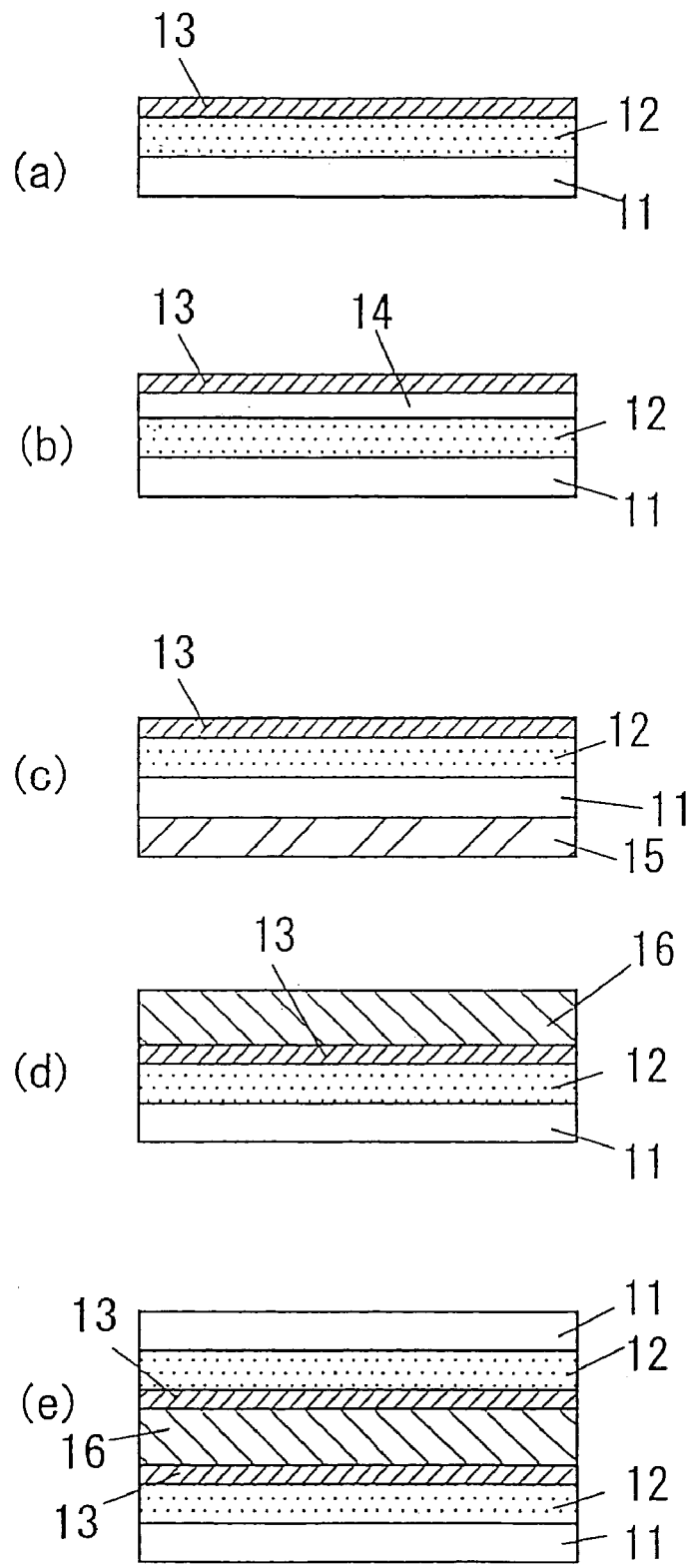
FIG. 15 shows other embodiment of the material for the optical circuit-electrical circuit mixedly mounting substrate according to the present invention.

FIG. 15(a) shows one example of an embodiment of the present invention according to the eleventh aspect, wherein the light permeable resin layer 11 is stacked on the optical circuit forming layer 12 in direct contact with one side thereof, and the metal layer 13 is stacked on the optical circuit forming layer 12 on the side thereof opposite to the side on which the light permeable resin layer 11 is provided.

The light permeable resin layer 11 and the metal layer 13 may be formed by using the materials already mentioned. The optical circuit forming layer 12 is made of a light permeable resin of which refractive index change to decrease when irradiated with the activating energy beam. For the resin of which refractive index decreases when irradiated with the activating energy beam, the same resin as that of the optical circuit forming layer 4 may be used. The resin which forms the optical circuit forming layer 12 is such that the refractive index of the portion that has not been irradiated with the activating energy beam becomes higher than those of the portion that has been irradiated with the activating energy beam and of the resin that forms the light permeable resin layer 11.

This the optical circuit-electrical circuit mixedly mounting substrate can be made similarly to that already mentioned, in the case wherein a metal foil is used as the metal layer 13, by coating the mat surface thereof with the resin that forms the optical circuit forming layer 12 and coating the optical circuit forming layer 12 with the resin that forms the light permeable resin layer 11.

Figure 16:
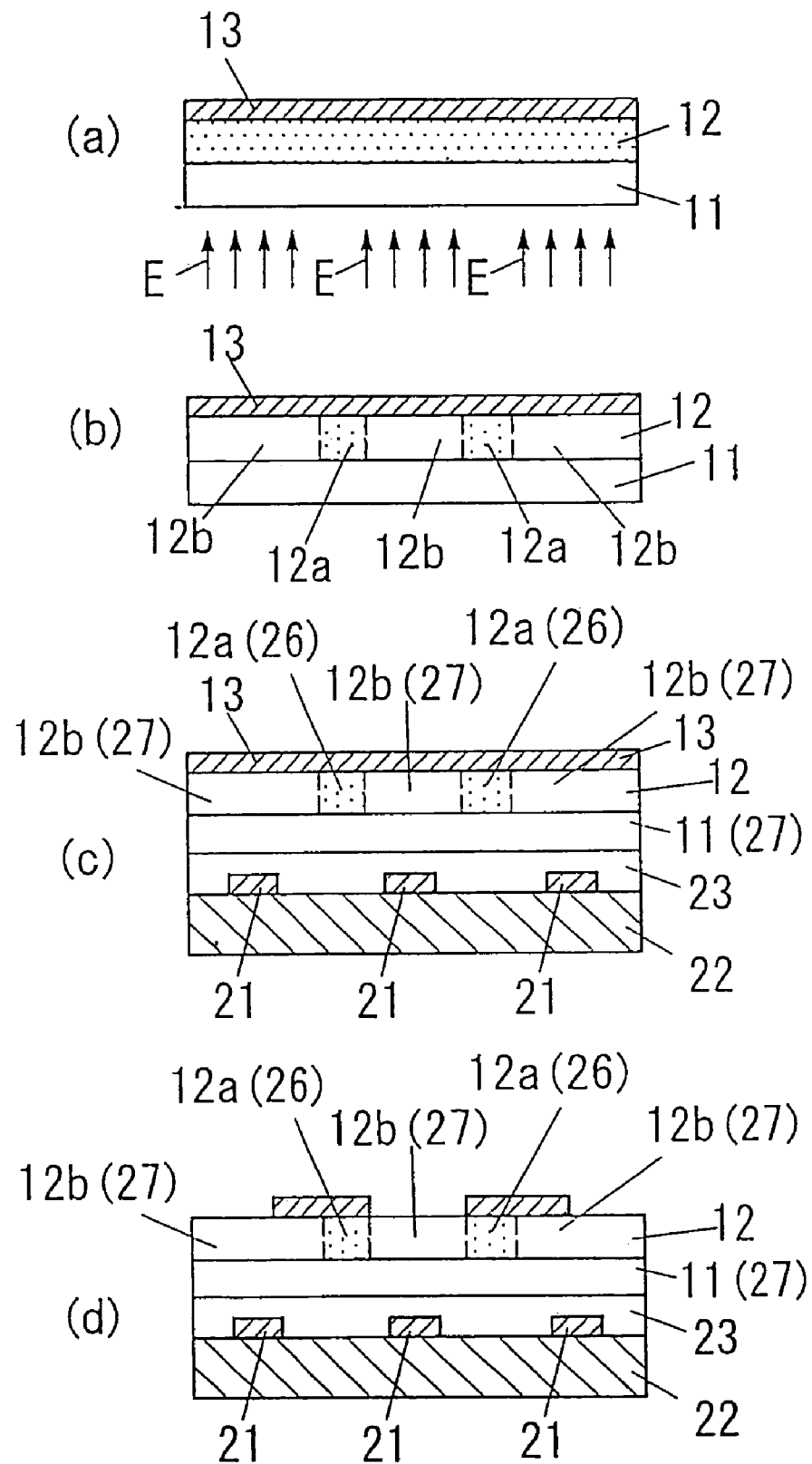
FIG. 16 shows the steps of manufacturing the optical circuit-electrical circuit mixedly mounting substrate from the material for the optical circuit-electrical circuit mixedly mounting substrate shown in FIG. 15(a), and FIG. 16(a) to FIG. 16(d) are schematic sectional views thereof.

Now, the method for manufacturing the optical circuit-electrical circuit mixedly mounting substrate using the material for the optical circuit-electrical circuit mixedly mounting substrate obtained as described above will be described below. First, as shown in FIG. 16(a), the optical circuit forming layer 12 is irradiated with the activating energy beam E from the side thereof opposite to the metal layer 13 through the light permeable resin layer 11. The irradiation of the activating energy beam is carried out in accordance to the reverse pattern to the pattern of the core of the optical circuit. Masked exposure to ultraviolet ray, exposure to laser beam or the like may be employed for the irradiation with the activating energy beam. While the refractive index of the portion of the optical circuit forming layer 12 that has not been irradiated with the activating energy beam does not change, the refractive index of the portion that has been irradiated decreases, so that a higher refractive index portion 12a that has not been irradiated and a lower refractive index portion 12b that has been irradiated are formed in the optical circuit forming layer 12.

After forming the higher refractive index portion 12a in the pattern of the optical circuit in the optical circuit forming layer 12 as shown in FIG. 16(b), the adhesive layer 23 is provided on the light permeable resin layer 11 on a surface thereof opposite to the side thereof on which the optical circuit forming layer 12 is provided, which is then bonded with the adhesive 23 onto the surface of the printed wiring board 22 that has been made with the electrical wiring 21 formed thereon as shown in FIG. 16(c). The metal layer 13 on the surface is then processed to form an electrical wiring 24 as shown in FIG. 16(d), and the electrical wiring 21 and the electrical wiring 24 can be electrically connected with each other by via hole processing with laser or plating. It is preferable that the portion of the metal layer 13 that portion is related to the higher refractive index portion 12a of the optical circuit forming layer 12 is left to remain, or the electric wiring 24 is formed from the metal layer 13 in the portion of the metal layer 13 that portion corresponds to the higher refractive index portion 12a of the optical circuit forming layer 12.

In FIG. 16(d), since the refractive index of the higher refractive index portion 12a in the optical circuit pattern of the optical circuit forming layer 12 is higher than the refractive indices of the lower refractive index portion 12b of the optical circuit forming layer 12 and the light permeable resin layer 11 that makes direct contact with the optical circuit forming layer 12, and the higher refractive index portion 12a makes contact with the metal layer 13 that reflects light, an optical waveguide is formed from the core layer 26 made of the higher refractive index portion 12a of optical circuit forming layer 12 and the cladding layers 27 made of the lower refractive index portion 12b of the optical circuit forming layer 12 and the light permeable resin 11, so that the optical circuit is formed by the higher refractive index portion 12a of the optical circuit forming layer 12, and thus an optical circuit-electrical circuit mixedly mounting substrate is obtained that is constituted from the optical circuit formed by the higher refractive index portion 12a of the optical circuit forming layer 12, the electrical wiring 21 and the electrical wiring 24 which are stacked one on another.

FIG. 15(b), FIG. 15(c), FIG. 15(d) and FIG. 15(e) show other embodiments, FIG. 15(b) showing a case wherein an adhesive layer 14 having flame resistance is provided between the metal layer 13 and the resin layer similarly to that described above, FIG. 15(c) showing a case wherein a transparent cover film 15 is laminated on the resin layer on the side thereof opposite to the metal layer 13 similarly to that described above, FIG. 15(d) showing a case wherein a supporting member 16 is releasably attached to the metal layer 13 on the side thereof opposite to the side where the resin layer is provided similarly to that described above, and FIG. 15(e) showing a case wherein the material for the optical circuit-electrical circuit mixedly mounting substrate is formed on each side of the supporting member 16 by providing the metal layer 13 on each side of the supporting member 16.

While the materials for the optical circuit-electrical circuit mixedly mounting substrate described above with reference to the drawings have the metal layer, the material for the optical circuit-electrical circuit mixedly mounting substrate without a metal layer can be manufactured by using a dummy substrate (a dummy supporting member) instead of the metal layer, forming a composite material as a laminate from one or more various resin layers stacked on the dummy substrate similarly to the described above, and then removing the dummy substrate from the laminate. The dummy substrate may be any proper one such as a metal or plastic plate or sheet that has been processed to be releasable on the side thereof on which the resin layer(s) is stacked.

The material for the optical circuit-electrical circuit mixedly mounting substrate without a metal layer obtained as described above can be made into the material for the optical circuit-electrical circuit mixedly mounting substrate having the metal layer as described previously by bonding the above-mentioned metal layer onto the material for the optical circuit-electrical circuit mixedly mounting substrate without a metal layer, and thus made material can be used for manufacturing the optical circuit-electrical circuit mixedly mounting substrate as described previously and also described later. Bonding of the metal layer may be carried out after the material for the optical circuit-electrical circuit mixedly mounting substrate without a metal layer has been subjected to various processes, or in the course of such processes.

Figure 17:
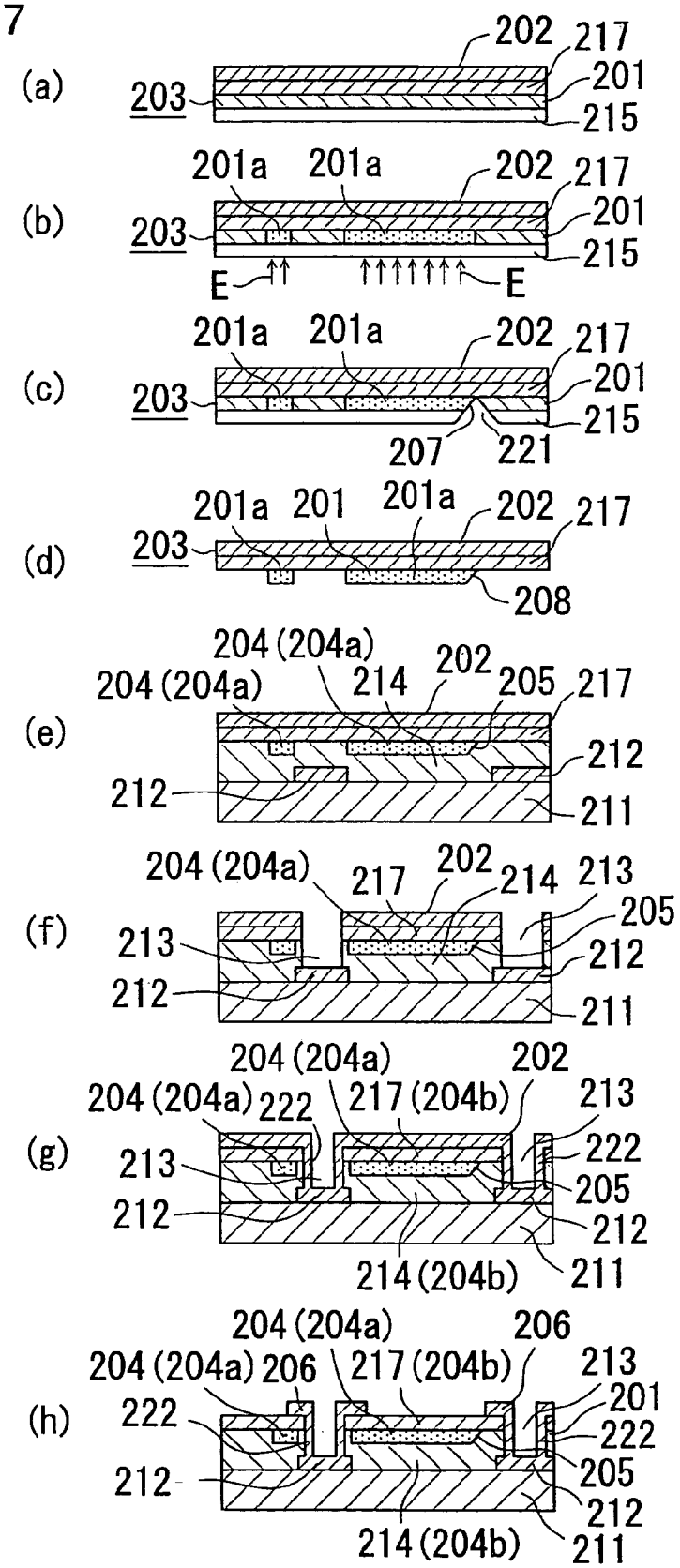
FIG. 17 shows one example of an embodiment of the process of the method for manufacturing the optical circuit-electrical circuit mixedly mounting substrate according to the present invention.

FIG. 17 shows one example of an embodiment of the method for manufacturing the optical circuit-electrical circuit mixedly mounting substrate according to the present invention. The material for the optical circuit-electrical circuit mixedly mounting substrate used in this manufacturing method is of a laminate structure 3 comprising a metal layer 202, an optical circuit forming layer 201, a light permeable resin layer 217 and a cover film 215 as shown in FIG. 17(a). The metal layer 202 is used to form an electrical circuit 206, the optical circuit forming layer 201 is used for forming a core 204a of a light waveguide 204, the light permeable resin layer 217 is used to bond the metal layer 202 and the optical circuit forming layer 201, and the cover film 215 is to cover the surface of the optical circuit-forming layer 201.

As a photosensitive resin that forms the optical circuit forming layer 201, a resin of which solubility to solvent change when irradiated with the activating energy beam such as ultraviolet ray is used. Among such resins, one that has high transparency and high heat resistance is preferable. Specifically, the material which is exemplified in the above in connection with the material for the optical circuit-electrical circuit mixedly mounting substrate of the present invention may be used.

For the light permeable resin that forms the light permeable resin layer 217, a resin that has a refractive index lower than that of the optical circuit forming layer 201 (at least an exposed portion 201a to be described later of the optical circuit forming layer 201) is used, and such resin preferably has high flame resistance and absorbs the activating energy beam irradiated to the optical circuit forming layer 201. When it is difficult to satisfy these conditions with the light permeable resin layer 217 consisting of a single layer, it may be constituted from two layers: a layer having a lower refractive index provided on the side of the optical circuit forming layer 201; and a layer bonded onto the metal layer 202. As the light permeable resin that forms the light permeable resin layer 217, the resin already mentioned above as an example in connection with the material for the optical circuit-electrical circuit mixedly mounting substrate of the present invention may be concretely used. Also, for providing the flame resistance and/or absorbency for the activating energy beam with the resin, such resin may contain an additive or reactive type flame retardant based on halogen, phosphorus or silicon compound and/or an ultraviolet absorber.

The metal layer 202 may be made of the material already mentioned as an example in connection with the material for the optical circuit-electrical circuit mixedly mounting substrate of the present invention. The metal layer 202 may be, for example, a metal foil, and a copper foil having thickness in the range from about 9 to 70 μm can be preferably used. It is of course that the metal layer is not limited to the above, and an aluminum foil, a nickel foil or the like may be used, and also that the thickness is not limited to the range described above. The metal layer 202 can be made easier to handle by attaching a rigid supporting member releasably with a pressure-sensitive adhesive to the metal layer 202 on the side thereof opposite to the side thereof on which the resin layer is provided. The supporting member may be a metal plate, a resin plate or a ceramic plate, and preferably has a mirror-finished surface on the side on which the metal layer 202 is attached for the purpose of easy releasing. The metal layer 202 may also be formed on the surface of the supporting member by plating.

For the cover film 215, the material already mentioned as an example in connection with the material for the optical circuit-electrical circuit mixedly mounting substrate of the present invention may be used, but is not limited to it. While there is no limitation as to the thickness of the cover film 215, the thickness is preferably in the range from 5 to 100 μm. The cover film 215 may also be processed on the surface thereof to make it easy to release. The cover film 215 is not essential, and the laminate structure 203 may be formed without the cover film 215.

The laminate structure 203 is formed as follows: In the case wherein a metal foil is used as the metal layer 202, the mat surface of the metal layer is coated with a light permeable resin by a comber coater, a curtain coater, a die coater, screen printing, offset printing or the like. In the case wherein the resin contains a solvent, it is dried to remove the solvent and cured if necessary, to form the light permeable resin layer 217. The light permeable resin layer 217 may also be cured to the semi-cured condition. The method and conditions of curing may be determined in accordance to the kind of the resin used. The laminate structure 203 as shown in FIG. 17(a) can be obtained by forming the optical circuit forming layer 201 by coating the surface of the cover film 215 with a photosensitive resin, then laminating the light permeable resin layer 217 with the optical circuit forming layer 201 together. Alternatively, after the light permeable resin layer 217 is formed on the metal layer 202 as described above, the optical circuit forming layer 201 is formed on the light permeable resin layer 217 by coating, then the cover film 215 is laminated onto the optical circuit forming layer 201.

Then, using the laminate structure 203, the optical circuit forming layer 201 is irradiated with the activating energy beam E such as ultraviolet ray from the side thereof opposite to the metal layer 202 via the cover film 215, as shown in FIG. 17(b). The irradiation with the activating energy beam E is carried out through a photo mask (not shown) that has a pattern corresponding to the optical circuit pattern. By exposing the optical circuit forming layer 201 to the irradiation of the activating energy beam E, the degree of curing of the exposed portion 201a of the optical circuit forming layer 201 can be increased, thereby decreasing its solubility to solvent. The metal layer 202 has a reference mark (not shown) formed thereon beforehand, and the exposed portion 201a can be determined with reference to the reference mark. Instead of the masked exposure to the ultraviolet ray, drawing exposure with laser beam or electron beam may be employed depending on the properties of the photosensitive resin.

Then, the deflector portion 205 is formed. First, as shown in FIG. 17(c), a portion of the exposed portion 201a of the optical circuit forming layer 201 as well as a portion of the cover film 215 are cut off together in V-shape from the cover film side so that a V-shaped groove 221 is formed. The V-shaped groove may be formed by using a rotary blade having cutting edge of which apex angle is about 90° or a side tool of which apex angle is about 45°. FIG. 17(c) shows a case of cutting with the rotary blade having a cutting edge angle of about 90°. The V-shaped groove 221 is able to provide an inclined surface 207 that is inclined at an angle of 45° with respect to the longitudinal direction of the exposed portion 201a that makes the core 204a of the optical waveguide 204, namely the direction of the light propagation. The inclined surface 207 may be formed, instead of cutting with the blade, by laser abrasion, pressing with a V-shaped die (a kind of a male die that is pressed into an object so as to form a recess which is complementary to the convex part of the die) or the like.

Figure 19:
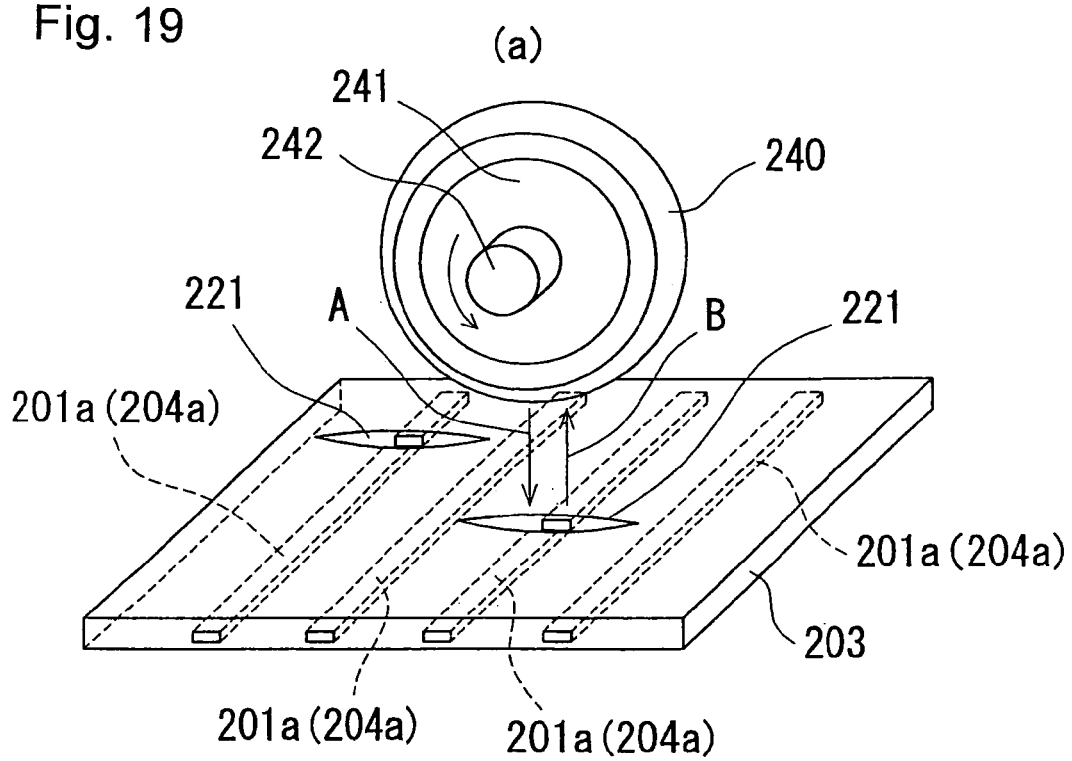
FIG. 19 shows one example of an embodiment of forming a deflector portion in the method for manufacturing the optical circuit-electrical circuit mixedly mounting substrate according to the present invention.
Figure 19:
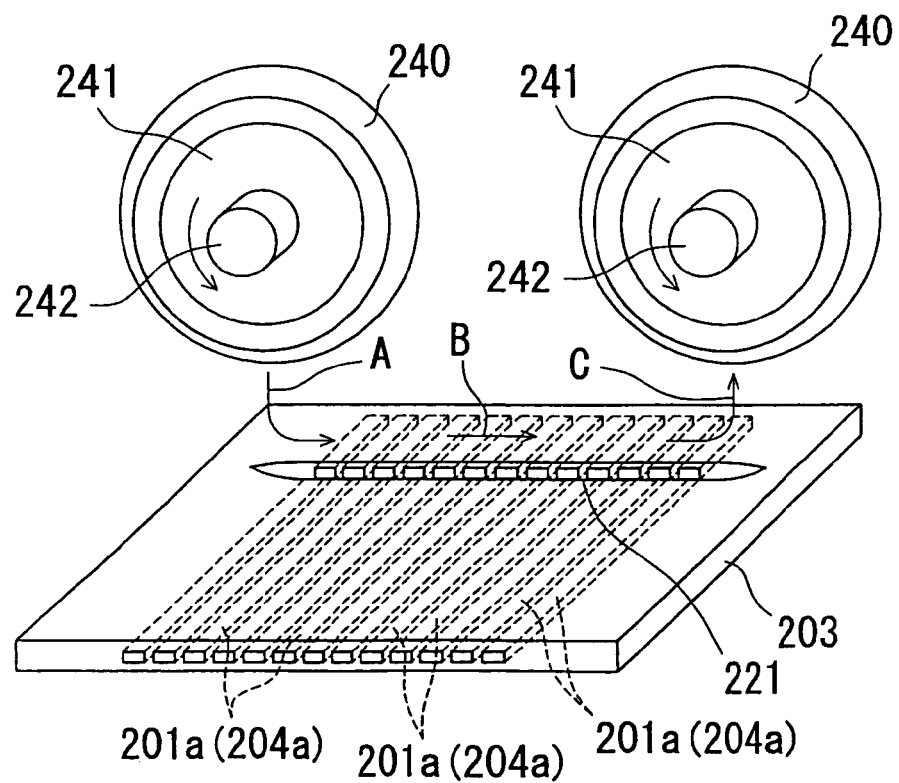

FIG. 19 shows an example of cutting into the V-shaped groove 221 by rotating the rotary blade 241 around a rotary shaft 242 which blade has a cutting edge 240 having an apex angle of about 90° and formed along an outer periphery of the cutting edge. The cutting operation is carried out by bringing the cutting edge 240 of the rotary blade 241 into contact with the laminate structure 203 on the position where the inclined surface 207 is to be formed through the exposed portion 201a of the optical circuit forming layer 201, and then removing the rotary blade 241 from the cutting surface. In the example shown in FIG. 19(a), the rotary blade 241 is brought into contact with the laminate structure 203 as indicated with the arrow A, and the V-shaped groove 221 is cut up to a predetermined depth with the cutting edge 240 formed along the outer periphery of the blade, followed by removing the rotary blade 241 from the laminate structure 203 as indicated with the arrow B. In this case, the V-shaped groove 221 can be formed over a short distance, and the inclined surface 207 can be formed by cutting into the V-shaped groove 221 only in one (or a small number of) exposed portion 201a. In an example shown in FIG. 19(b), the rotary blade 241 is brought into contact with the laminate structure 203 as indicated with the arrow A, moved over the surface of the laminate structure as indicated with the arrow B, and the removed from the laminate structure 203 as indicated with the arrow C, so that the V-shaped grooves 221 are cut into a predetermined depth over a predetermined length by the cutting edge 240 formed along its outer periphery. In this case, the long V-shaped groove 221 can be formed over the distance the rotary blade 241 was moved, and the inclined surface 207 can be formed in each of a plurality of the exposed portions 201a by cutting into the V-shaped grooves 221 simultaneously in the plurality of the exposed portions 201a.

Figure 20:
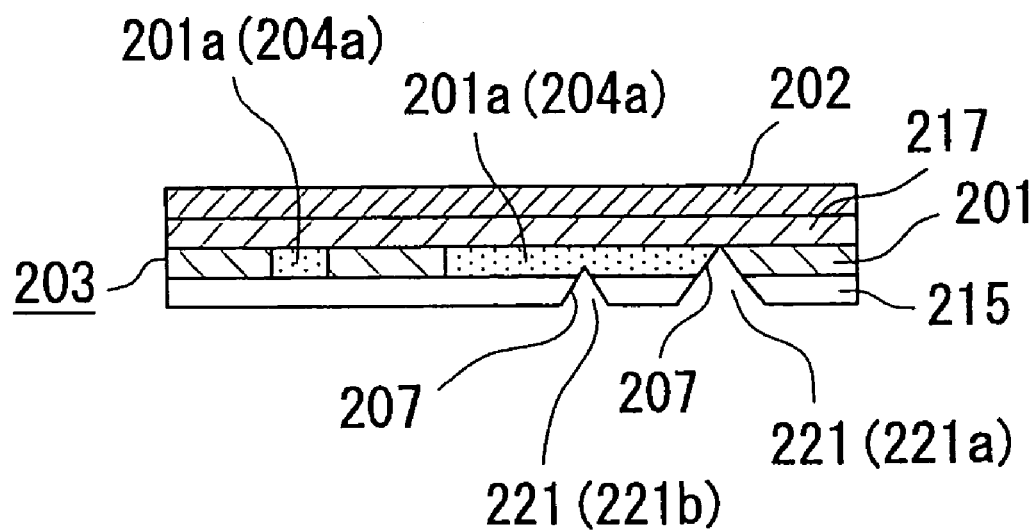
FIG. 20 shows a schematic sectional view of one example of an embodiment of forming a deflecting portion in the method for manufacturing the optical circuit-electrical circuit mixedly mounting substrate.

The V-shaped groove 221 is usually formed over the entire thickness of the exposed portion 201a that functions as the core 204a of the optical waveguide 204 as described below, as in the case of the V-shaped groove 221a shown in FIG. 20. In this case, the core 204a can be completely blocked by the deflector portion 205 that is formed on the inclined surface 207 of the V-shaped groove 221a as described later, so as to deflect all of the light propagating through the core 204a by the deflector portion 205 and extract the light to the outside. On the other hand, the groove may also be formed to such a depth that a portion of the thickness of the exposed portion 201a that forms the core 204a of the optical waveguide 204 remains intact as the V-shaped groove 221b shown in FIG. 20, by controlling the cutting depth with the rotary blade or tool. In this case, since the core 204a is not completely blocked by the deflector portion 205 that is formed on the inclined surface 207 of the V-shaped groove 221b, it is made possible to deflect a portion of the light propagating through the core 204a by the deflector portion 205 and extract such portion to the outside, and let the rest of the light propagate through the deflector portion 205, so that the deflector portion 205 can function as a half mirror.

When cutting the V-shaped groove 221 with the rotary blade 241, since the cutting edge 240 of the rotary blade 241 is formed by attaching abrasive particles together onto the surface thereof, surface roughness of the inclined surface 207 that is formed by cutting into the V-shaped groove 221 becomes important. While the V-shaped groove 221 can be cut into using a rotary blade 241 with a smoother surface having finer abrasive particles of the larger abrasive particle count (that is, of a smaller abrasive particle size), cutting power of such blade is insufficient. As a result, there may occurs a problem in that strain or distortion is caused in the surface of the rotary blade 241 when forming the V-shaped groove 221 by pressing the cutting edge 240 of the rotary blade 240 into the laminate structure 203. There may also occurs another problem in that the processing period required for cutting is extended, and thus lowering the efficiency of cutting operation. Therefore, it is preferable, with using a rotary blade 241 having abrasive particles of the lower particle count (namely, coarser abrasive particles), to cut into the V-shaped groove 221 up to a predetermined depth over a predetermined length at the predetermined position of the optical circuit forming layer 201. The cutting edge 241 of such rotary blade 240 is applied to the laminate structure 203, and then using a second rotary blade 241 having abrasive particles of the larger particle count (namely, smaller abrasive particles), continue to again cutting into the V-shaped groove 221 up to a predetermined depth at the same position. This enables it to form a surface having a smaller surface roughness stably without causing a strain or distortion in the formed V-shape due to the insufficient cutting power.

Figure 18:
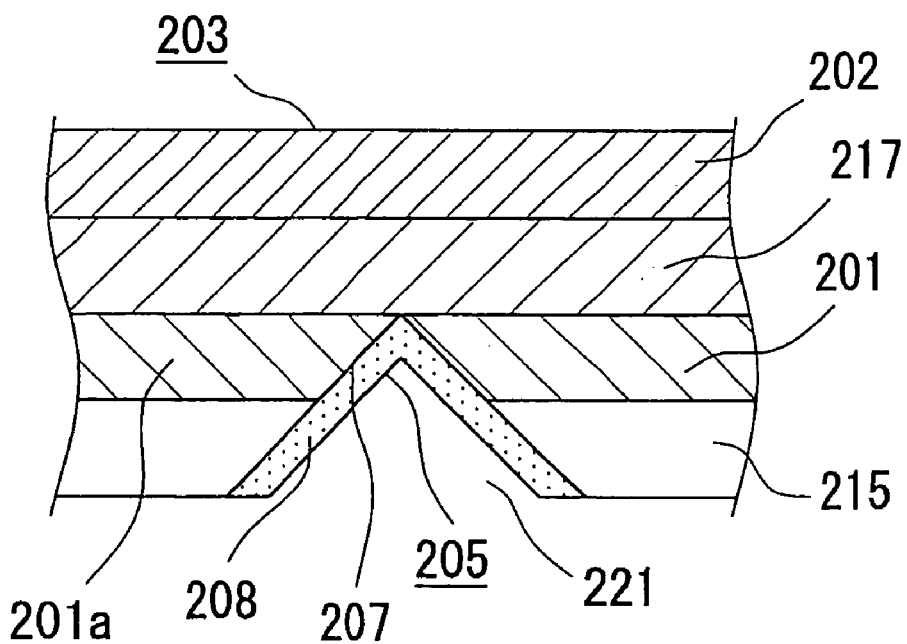
FIG. 18 shows one example of an embodiment of forming a reflector in a deflector portion in the process of the method for manufacturing the optical circuit-electrical circuit mixedly mounting substrate according to the present invention.
Figure 18:
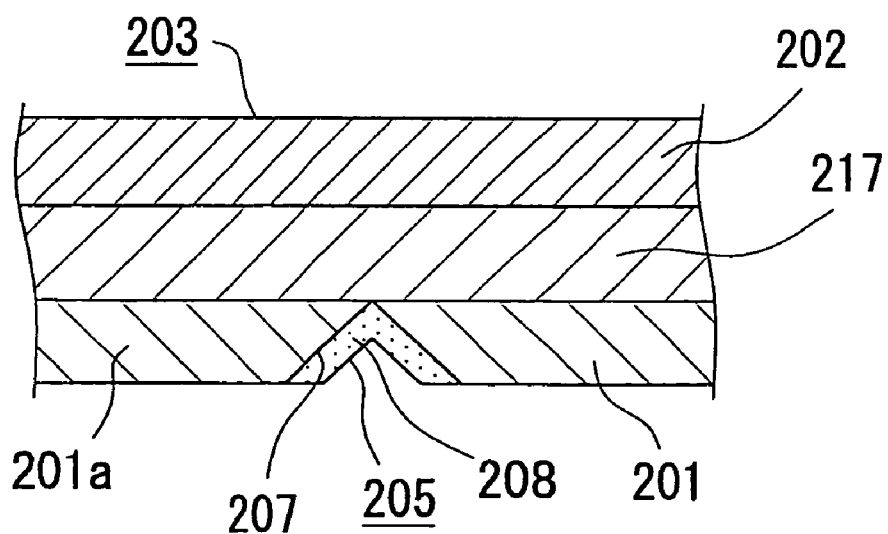

The deflector portion 205 can be formed by providing a light reflector 208 on the inclined surface 207 as shown in FIG. 18(a) after forming the inclined surface 207 by cutting into the V-shaped groove 221 as described above. The light reflector 208 can be formed by applying a paste containing metal particles such as a silver paste onto the inclined surface 207 by a printing process. The metal particles may be made of a high-reflectivity metal such as gold besides silver. Particle size of the metal particles is preferably 0.2 μm or less in order to make the surface of the reflector 208 smoother with a higher reflectivity. The particle size of the metal particles is preferably as small as possible, and particles as small as several nanometers may be used. The light reflector 208 may be formed, besides printing of the paste containing the metal particles as described above, by selectively depositing a metal on the inclined surface 207 by the vapor deposition or sputtering. The deflector portion 205 is completed by removing the cover film 215 as shown in FIG. 18(b).

While the V-shaped groove 221 is cut into from the above of the cover film 215 in the embodiment shown in FIG. 17, it needs not to say that the V-shaped groove 221 is cut into directly into the optical circuit forming layer 201 in the case wherein the laminate structure 203 is not provided with the cover film 215. It is preferable, however, that the V-shaped groove 221 is cut into from the above of the cover film 215 covering the optical circuit forming layer 201, since it prevents the paste or other material from sticking to the optical circuit forming layer 201 in areas other than the V-shaped groove 221 when the surface of the optical circuit forming layer 201 is covered by the cover film 215 upon the formation of the light reflector 208 by printing the paste that includes the metal particles as described above.

Figure 21:
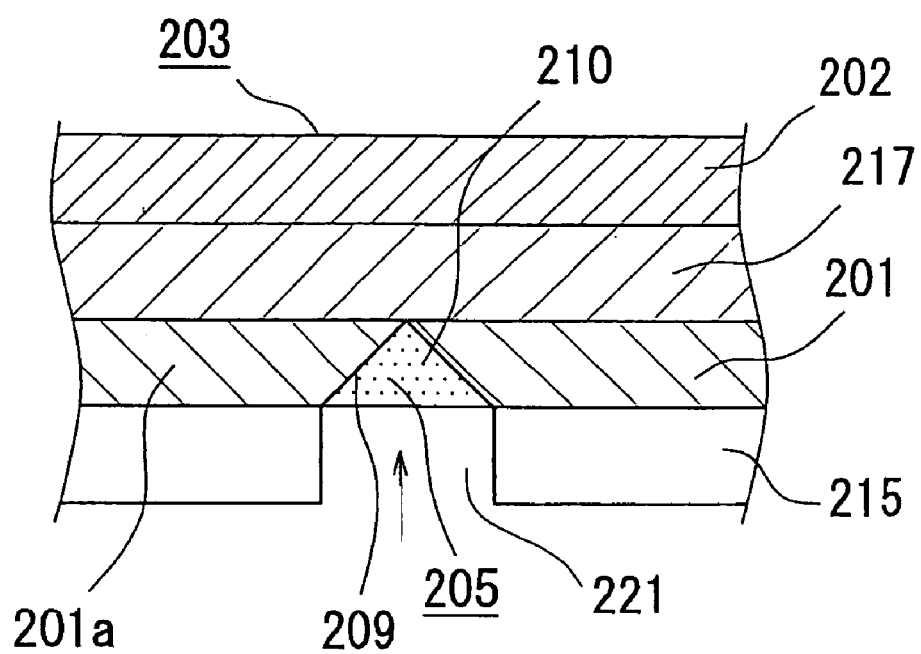
FIG. 21 shows one example of forming a deflecting portion having a reflector.
Figure 21:
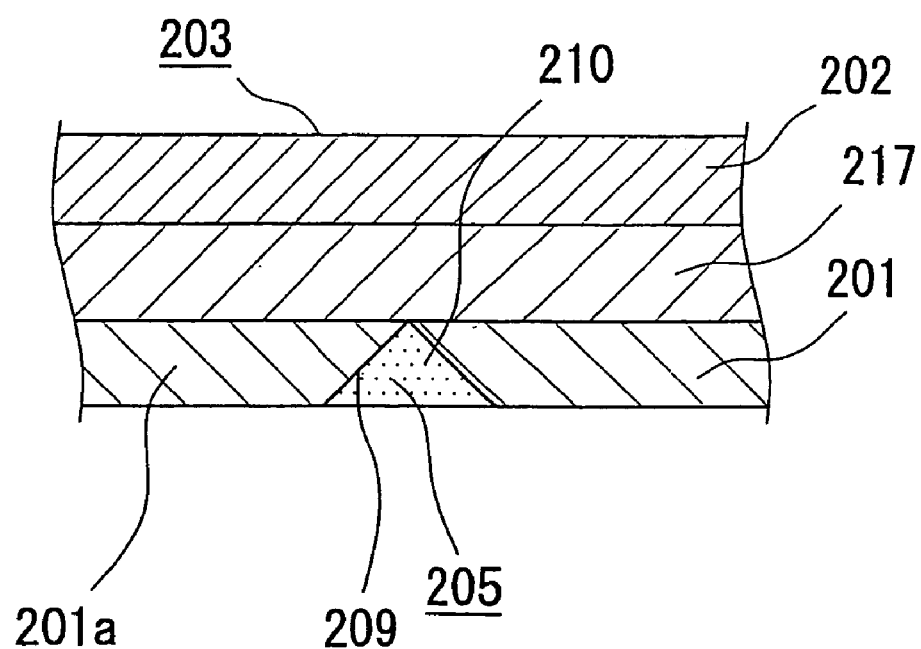

In the case wherein the groove 221 is formed by pressing a V-shaped die into the optical circuit forming layer 201, the reflector 210 having reflecting surfaces 209 each formed with an inclined angle of 45° may be used as the die, and it is left to remain in the V-shaped groove 221 as shown in FIG. 21(a), so as to form the deflector portion 205 using the inclined surface 207 of the V-shaped groove 221 and the reflecting surface 209. In this case, cutting into of the V-shaped groove 221 and the formation of the deflector portion 205 can be carried out at the same time, thus which reduces the number of steps of the formation of the deflector portion. The position where the deflector portion 205 is to be formed can be determined on the basis of a positional relationship with the reference mark that is formed on the metal layer 202 in advance. Then the cover film 215 is removed as shown in FIG. 21(b).

While the processing to form the deflector portion 205 is carried out after irradiating the optical circuit forming layer 201 with the activating energy beam thereby to form the exposed portion 201a that functions as the core 204a of the optical waveguide 204 in the embodiment shown in FIG. 17, the processing to form the deflector portion 205 may be carried out first, followed by the irradiating of the optical circuit forming layer 201 to form the exposed portion 201a that functions as the core 204a of the optical waveguide 204. In this case, the V-shaped groove 221 can be formed in the optical circuit forming layer 201 that has not been hardened by the irradiation of the activating energy beam, and it is easier to form the V-shaped groove 221. When the V-shaped groove 221 is formed by pressing the die or the reflector 210, the V-shaped groove 221 can be formed more easily in the optical circuit forming layer 201 that has not yet hardened and is still soft, thereby making it possible to form the deflector portion 205 with a high accuracy.

After forming the deflector portion 205 as described above, the cover film 215 is removed and the exposed portion 1a of the optical circuit forming layer 201 is developed so as to remove by dissolving into a solvent as shown in FIG. 17(d).

On the other hand, an insulating board 211 having an electrical circuit 212 formed thereon is prepared beforehand. The insulating board 211 having the electrical circuit 212 formed thereon may be a printed wiring board having the electrical circuit 202 which is formed on the surface thereof from a metal such as copper. Then as shown in FIG. 17(e), the laminate structure 203 is bonded with an adhesive 214 onto the surface of the wiring board 211 on the side of the optical circuit forming layer 201. The adhesive 214 is made of a light permeable resin that has a refractive index lower than that of the exposed portion 1a of the optical circuit forming layer 201, and may be the same resin as that used to form the light permeable resin layer 217. The laminate structure 203 may also be bonded onto the surface of the wiring board 211 after providing the light permeable resin to form the cladding layer having a lower refractive index on the surface of the optical circuit forming layer 201. In this case, the refractive index of the adhesive 214 is not subjected to the restriction described above. The wiring board 211 may also be a mere board without an electrical circuit 212. This eliminates the need to form a via hole which will be described later. The laminate structures 203 may also be bonded onto both sides of the wiring board 211.

After bonding the laminate structure 203 onto the wiring board 211 having the electrical circuit 212 as described above, via holes 213 are formed penetrating from the metal layer 202 through the light permeable resin layer 217 and the adhesive layer 214 as shown in FIG. 17(f). The via holes 213 may be formed by laser processing. Then, after forming electrical conductors 222 by plating on the inside peripheries of the via hole 213 as shown in FIG. 17(g), an electrical circuit 206 is formed by patterning of the metal layer 202 with lithography and etching thereafter, thereby to obtain the optical circuit-electrical circuit mixedly mounting substrate as shown in FIG. 17(h). The position to form the electrical circuit 206 can be determined by patterning with photolithography on the basis of the positional relationship with the reference mark that is formed on the metal layer 202 in advance.

In this optical circuit-electrical circuit mixedly mounting substrate, the exposed portion 201a of the optical circuit forming layer 201 makes the core 204a having the higher refractive index while the light permeable resin layer 217 and the adhesive layer 214 make the cladding portions 204b each having the lower refractive index so as to form the optical waveguide 204 in the exposed portion 201a. The optical circuit comprising the optical waveguide 204, the electrical circuit 206 and the electrical circuit 212 are mounted together on the substrate. The portion of the metal layer 202 located at a position just above the deflector portion 205 that is formed at an end of the optical waveguide 204 is removed, so that light propagating in the optical waveguide 204 is reflected by the deflector portion 205 and the direction of the light propagation is deflected by 90° into the direction of the thickness of the optical circuit-electrical circuit mixedly mounting substrate, and the light emerges through the light permeable resin layer 217 to the outside. Also, light entering from the outside through the light permeable resin layer 217 is reflected by the deflector portion 205 and the direction of light propagation is deflected by 90° so as to enter the optical waveguide 204.

The electrical circuit 206 and the electrical circuit 212 are electrically connected to each other by the electrical conductor 222 formed inside the via hole 213. Upon forming the via hole 213 by laser processing, when the laser beam is applied right above the electrical circuit 212 provided on the wiring board 211 and the via hole 213 to be formed has reached the electrical circuit 212, the laser beam is reflected by the metal such as copper that constitutes the electrical circuit 212, so that the metal of the electrical circuit 212 serves as a stopping layer to prevent processing by the laser beam from proceeding further more, resulting in the formation of the via hole 213 of which bottom is formed by the electrical circuit. Thus, it is possible to achieve reliable electrical continuity between the electrical circuit 212 and the electrical circuit 206 by exposing the electrical circuit 212 at the bottom of the via hole 213. Since the exposed portion 201a that makes the core 204a of the optical waveguide 204, the deflector portion 205 and the electrical circuit 206 are all formed at the positions determined on the basis of the reference mark formed on the metal layer 202 beforehand, the optical waveguide 204, the deflector portion 205 and the electrical circuit 206 are aligned with each other through the reference mark, thus enabling it to form the optical waveguide 204, the deflector portion 205 and the electrical circuit 206 with high positional accuracy.

Figure 22:
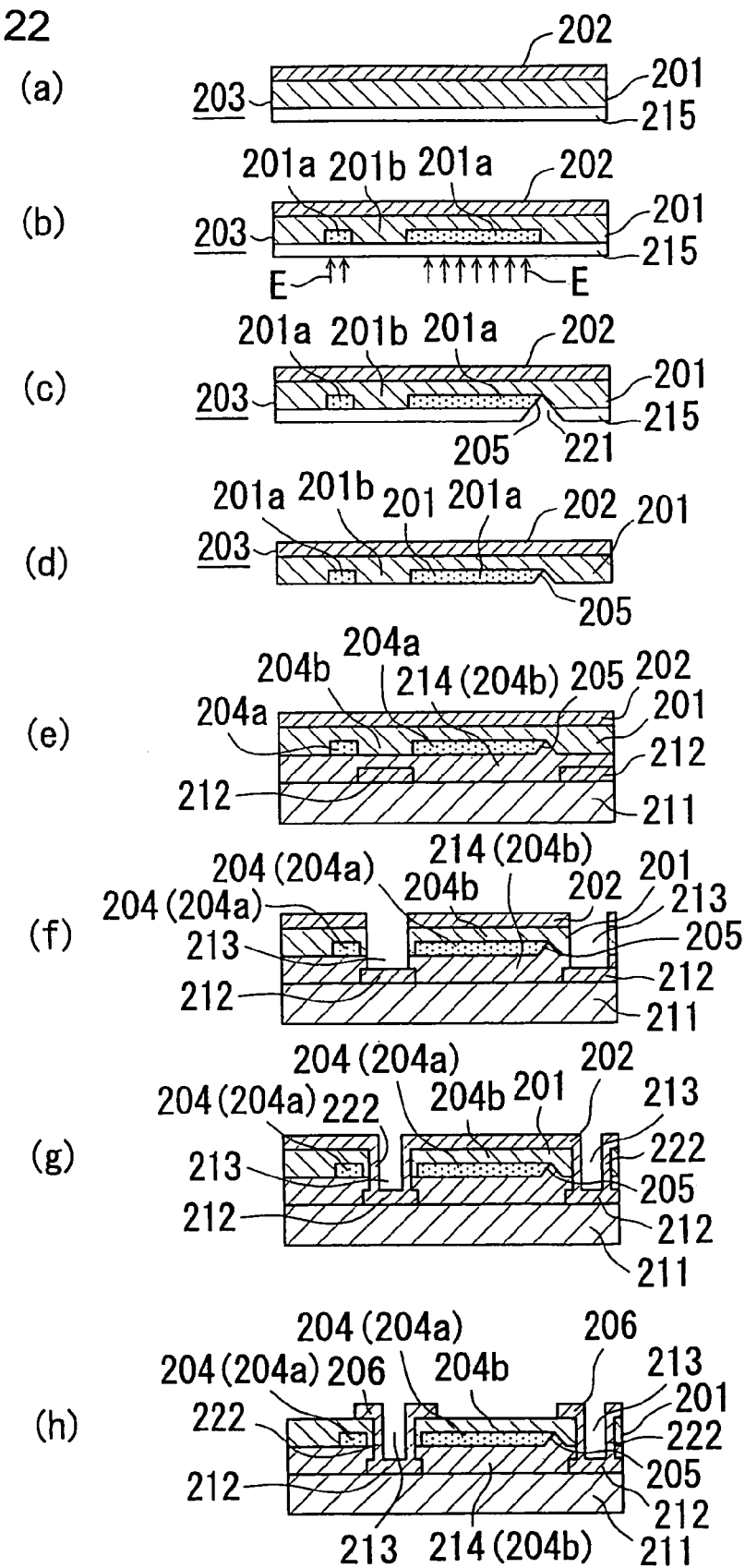
FIG. 22 shows the steps of one example of an embodiment of the method for manufacturing the optical circuit-electrical circuit mixedly mounting substrate according to the present invention.

FIG. 22 shows other embodiment of the present invention, wherein the laminate structure 203 is to be used comprises the metal layer 202 that is to form the electrical circuit 206, the optical circuit forming layer 201 that is to form the core 204a as well as the cladding portions 204b of the optical waveguide 204, and the cover film 215 that covers the surface of the optical circuit forming layer 201 on the side opposite to the metal layer 202, as shown in FIG. 22(a).

As the photosensitive resin that forms the optical circuit forming layer 201, such a resin is used that changes its refractive index when irradiated with the activating energy beam. For example, as the resins of which refractive index can be changed by irradiating with ultraviolet ray, for example, a composite resin comprising an acrylic resin or a polycarbonate resin which contains a photopolymerizable monomer, or a polysilane resin may be used. As the metal layer 202 and the cover film 215, the materials already mentioned may be used.

Upon the formation of the laminate structure 203, in case wherein a metal foil is used as the metal layer 202, the mat surface of the metal layer is coated with the photosensitive resin with using a comber coater, a curtain coater, a die coater, screen printing, offset printing or the like to form the optical circuit forming layer 201. Then, the cover film 215 is laminated on the surface of the optical circuit forming layer 201.

Then, using thus obtained laminate structure 203, the optical circuit forming layer 201 is irradiated with the activating energy beam E such as ultraviolet ray from the side opposite to the metal layer 202 through the cover film 215, as shown in FIG. 22(b). The irradiation with the activating energy beam E is carried out through a photo mask as in the case of the embodiment shown in FIG. 17. The photo mask is positioned with reference to the reference mark formed on the metal layer 202 in advance, followed by the exposure. By exposing the optical circuit forming layer 201 to the irradiation of the activating energy beam E, the refractive index of the exposed portion 201a of the optical circuit forming layer 201 changes to increase, so that the refractive index of the exposed portion 201a becomes higher than the refractive index of the non-exposed portion 201b of the optical circuit forming layer 201. Since the activating energy beam E is applied from the interface on the side of the optical circuit forming layer 201 which side is opposite to the metal layer 202, the optical reaction caused by the irradiation of the activating energy beam E proceeds from such interface on the side of the optical circuit forming layer 201 which is opposite to the metal layer 202 toward the inside of the optical circuit forming layer 201 along the direction of its thickness. Therefore, by controlling the intensity of the irradiation of the activating energy beam E, the exposed portion 201a to be formed can be limited to only a portion which is remote from the metal layer 202 with respect to the thickness direction of the optical circuit forming layer, so as to leave a non-exposed portion 201b on the side of the metal layer 202 in the direction of thickness of the photosensitive resin layer 201. Instead of the masked exposure to ultraviolet ray, exposure to laser beam or electron beam may be employed depending on the properties of the photosensitive resin.

Then, the deflector portion 205 is formed by processing the V-shaped groove 221 as shown in FIG. 22(c). The deflector section 205 may be formed similarly to the embodiment shown in FIG. 17(c). The cover film 215 is then removed as shown in FIG. 22(d). Since the refractive index of the exposed portion 201a of the optical circuit forming layer 201 is higher than the refractive index of the non-exposed portion 201b, and the core 204a of the optical waveguide 204 is formed with the exposed portion 201a and the cladding portion 204b is formed with the non-exposed portion 201b, no development step as in the case of the embodiment shown in FIG. 17 becomes necessary. Also, in the embodiment shown in FIG. 22, the step of forming the deflector portion 205 may be carried out first, followed by the step of forming the exposed portion 201a that forms the core 204a of the optical waveguide 204 in the optical circuit forming layer 201.

Then, as shown in FIG. 22(e), the laminate structure 203 is bonded through an adhesive 214 to the surface of the wiring board 211 such as a printed wiring board that has an electrical circuit 212 formed thereon on the side of the optical circuit forming layer 201 of the laminate structure. The adhesive 214 is made of a light permeable resin that has a refractive index lower than that of the exposed portion 201a of the optical circuit forming layer 201, and it is preferably a resin of which refractive index is the same as that of the non-exposed portion 1b of the light permeable resin layer 217. For example, a resin may be used which is the same as the resin forming the optical circuit forming layer 217. Also, after providing a resin layer to form a cladding layer having a lower refractive index on the surface of the optical circuit forming layer 201, thus obtained laminate structure 203 may also be bonded onto the surface of the wiring board 211. In this case, there is no restriction as to the refractive index of the adhesive 214 as described above. The wiring board 211 may also be a mere board with no electrical circuit 212 provided thereon. The laminate structures 203 may also be bonded onto both sides of the wiring board 211.

After bonding the laminate structure 203 onto the wiring board 211 having the electrical circuit 212 as described above, via holes 213 are formed as shown in FIG. 22(*f*). Then, after forming an electrical conductor 222 by plating on the peripheral inner surface of the via hole 213 as shown in FIG. 22(*g*), the electrical circuit 206 is formed by processing the metal layer 202, thereby to obtain the optical circuit-electrical circuit mixedly mounting substrate shown in FIG. 22(*h*). The via holes 213, the electrical conductors 222 and the electrical circuits 206 may be formed similarly to the embodiment shown in FIG. 17.

In this optical circuit-electrical circuit mixedly mounting substrate, the exposed portion 201*a* of the optical circuit forming layer 201 forms the core 204*a* having the higher refractive index while the non-exposed portion 201*b* of the optical circuit forming layer 201 and the adhesive layer 214 form the cladding portions 204*b* having the lower refractive index so as to form the optical waveguide 204 in the exposed portion 201*a*. The optical circuit comprising the optical waveguide 204, the electrical circuit 206 and the electrical circuit 212 are mounted together in the substrate. The deflector portion 205 that is formed at the end of the optical waveguide 204 causes the light propagating in the optical waveguide 204 to be deflected so as to eject the light to the outside and inject the light from the outside into the optical waveguide 204.

Figure 23:
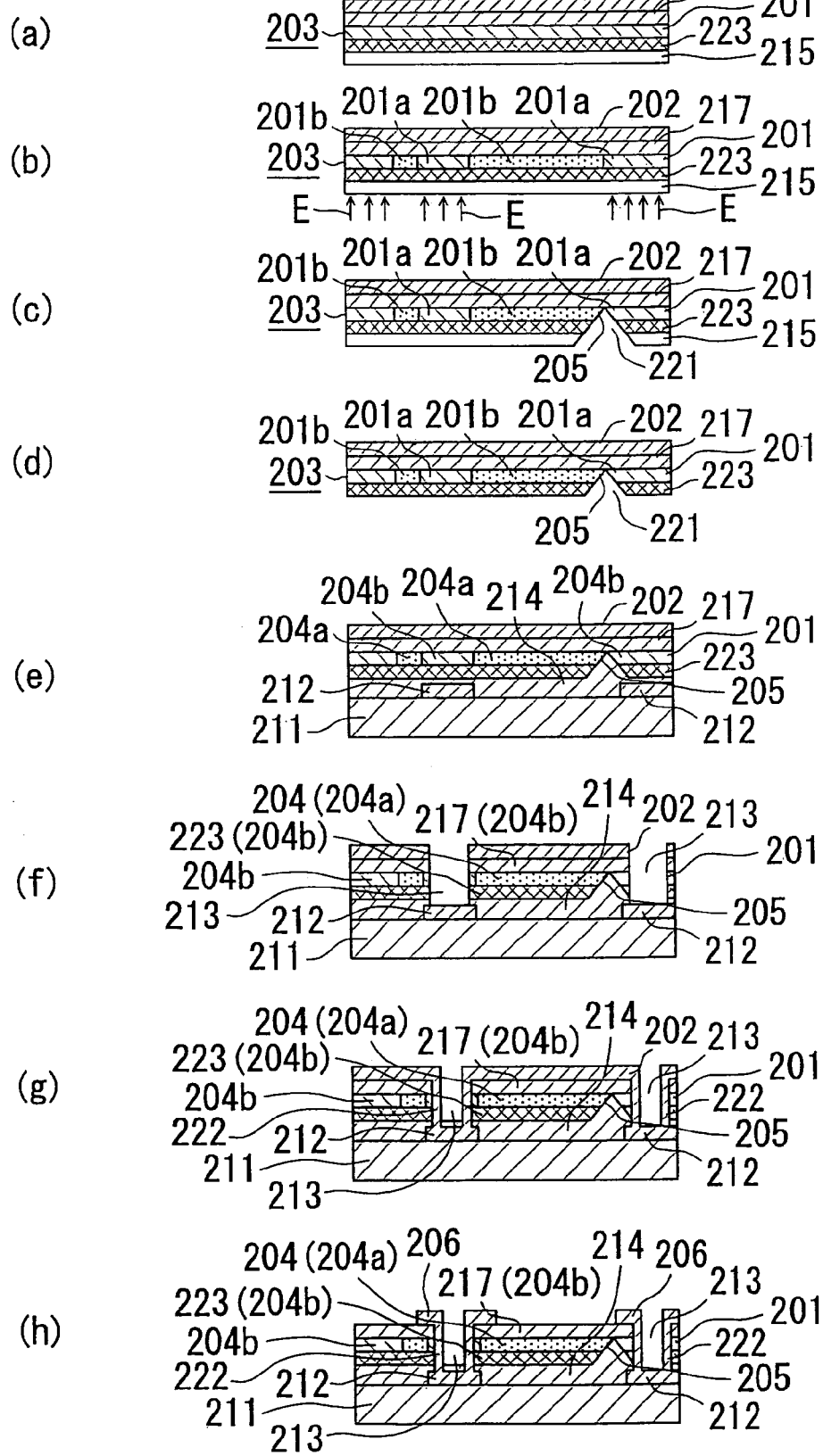
FIG. 23 shows the steps of one example of the method for manufacturing the optical circuit-electrical circuit mixedly mounting substrate according to the present invention.

FIG. 23 shows other embodiment of the present invention, wherein the laminate structure 203 comprises the metal layer 202 that is to form the electrical circuit 206, the optical circuit forming layer 201 that is to form the core 204*a* of the optical waveguide 204 and the cladding portion 204*b*, the light permeable resin layer 217 that bonds the metal layer 202 and the optical circuit forming layer 201, the second light permeable resin layer 223 provided on the optical circuit forming layer 201 on the side opposite to the metal layer 202, and the cover film 215 that cover the surface of the second light permeable resin layer 223, as shown in FIG. 23(*a*).

As the photosensitive resin that forms the optical circuit forming layer 201, a resin is used of which refractive index of an irradiated region thereof is changed when irradiated with the activating energy beam, and such resin may be the material already mentioned. The metal layer 202 and the cover film 215 may be made of the materials already mentioned.

As the light permeable resin that forms the light permeable resin layer 217, a resin that has a refractive index lower than that of the core 204*a* described below of the optical circuit forming layer 201 is used, and it preferably has a refractive index comparable to that of the cladding portion 204*b* of the optical circuit forming layer 201, and also preferably has high flame resistance and absorbs the activating energy beam irradiated on the optical circuit forming layer 201. When it is difficult to satisfy these conditions with the light permeable resin layer 217 consisting of a single layer, it may be constituted from two layers: a layer provided on the side of the optical circuit forming layer 201 having a lower refractive index and a layer bonded onto the metal layer 202. As the light permeable resin that forms the light permeable resin layer 217, the photocurable resin already mentioned may be used such as an epoxy resin, a polyimide resin, an unsaturated polyester resin or an epoxy acrylate resin. For the purpose of the provision of flame resistance and/or absorbency for the activating energy beam, the resin may also contain an additive or a reactive flame retardant and/or an ultraviolet absorber based on halogen, phosphorus or silicon compound.

For the light permeable resin that forms the second light permeable resin layer 223, a resin that has a refractive index lower than that of the core 204*a* of the optical circuit forming layer 201 is used, and it preferably has a refractive index comparable to that of the cladding portion 204*b* of the optical circuit forming layer 201 and the light permeable resin layer 217. Also, the resin is required to allow penetration of most of the activating energy beam applied to the optical circuit forming layer 201. It is also preferable that the resin has flame resistance and may contain an additive or reactive type flame retardant based on halogen, phosphorus or silicon compound and/or an ultraviolet absorber.

The laminate structure 203 is produced as follows. In the case wherein a metal foil is used as the metal layer 202, the mat surface of the metal layer is coated with a light permeable resin by a comber coater, a curtain coater, a die coater, screen printing, offset printing or the like. In the case wherein the resin contains a solvent, the coating is dried to remove the solvent and cured if necessary, to form the light permeable resin layer 217. The light permeable resin layer 217 may also be cured to the semi-cured condition. The method and conditions of curing may be determined in accordance to the kind of the resin used. The laminate structure 203 as shown in FIG. 23(*a*) can be made by forming the second light permeable resin layer 223 by coating the surface of the cover film 215 with the light permeable resin, then forming the optical circuit forming layer 201 by coating the surface of the second light permeable resin layer 223 with a photosensitive resin, and then laminating the light permeable resin layer 217 and the optical circuit forming layer 201 together. It is noted that as described above, after forming the light permeable resin layer 217 on the metal layer 202, the optical circuit forming layer 217 is coated on the light permeable resin layer 217 while the second light permeable resin layer 223 is formed on the cover film 215, followed by laminating thus formed optical circuit forming layer 201 and the second light permeable resin layer 223 together. These steps may be carried out continuously.

Then, using thus formed laminate structure 203, the optical circuit forming layer 201 is irradiated with the activating energy beam E such as ultraviolet ray from the side of the structure which is opposite to the metal layer 202 through the cover film 215 and the second light permeable resin layer 223, as shown in FIG. 23(*b*). The irradiation with the activating energy beam E is carried out through a photo mask similar to the embodiment shown in FIG. 17. The photo mask is positioned with reference to the reference mark formed on the metal layer 202 in advance, followed by the exposure. By exposing the optical circuit forming layer 201 to the irradiation of the activating energy beam E, the refractive index of the exposed portion 201*a* can be changed. In the embodiment shown in FIG. 23(*b*), a photoreaction is caused over the entire thickness of the optical circuit forming layer 201, so as to form the exposed portion 201*a* over the entire thickness of the optical circuit forming layer 201.

In the case wherein the photosensitive resin of the optical circuit forming layer 201 has a property such that its refractive index increases when irradiated with the activating energy beam E such as ultraviolet ray, a mask is used which allows to irradiate a region in the same pattern as that of the core 204a of the optical waveguide 204, so that the refractive index of the exposed portion 201a of the optical circuit forming layer 201 changes to increases, and the refractive index of the exposed portion 201a is higher than that of the non-exposed portion 201b. In the case wherein the photosensitive resin of the optical circuit forming layer 201 has a property such that the refractive index decreases when irradiated with the activating energy beam E such as ultraviolet ray, a mask is used which allows it to irradiate a region in a reverse pattern of that of the core 204a of the optical waveguide 204, so that the refractive index of the exposed portion 201a of the optical circuit forming layer 201 changes to decrease, and the refractive index of the non-exposed portion 201b is made higher than that of the exposed portion 201a. It is noted that instead of the masked exposure to ultraviolet ray as described above, drawing exposure with laser beam or electron beam may be employed depending on the properties of the photosensitive resin.

Then, the deflector portion 205 is formed by processing the V-shaped groove 221 as shown in FIG. 23(c). The deflector portion 205 may be formed similarly to the embodiment shown in FIG. 17(c). The cover film 215 is then removed as shown in FIG. 23(d). Since one of the exposed portion 201a and the non-exposed portion 201b of the optical circuit forming layer 201 is to form the core 204a of the waveguide 204 while the other is to form the cladding portion 204b, the development step as in the embodiment shown in FIG. 17 becomes unnecessary. In the embodiment shown in FIG. 23, too, the step of forming the deflector portion 205 may be carried out first, followed by the step of forming the exposed portion 201a that is to form the core 204a or the cladding portion 204b of the optical waveguide 204 in the optical circuit forming layer 201.

Then, as shown in FIG. 23(e), the laminate structure 203 is bonded with the adhesive 214 onto the surface of the wiring board 211 such as a printed wiring board that has the electrical circuit 212 formed thereon on its side of the second light permeable resin layer 223. The adhesive 214 may be of any type of which refractive index is not limited. The wiring board 211 may also be a mere board with no the electrical circuit 212 provided thereon. The laminate structures 203 may also be bonded onto each side of the wiring board 211.

After bonding the laminate structure 203 onto the wiring board 211 having the electrical circuit 212 as described above, via holes 213 are formed as shown in FIG. 23(f). Then, after forming an electrical conductor 222 by plating on the inner periphery of the via holes 213 as shown in FIG. 23(g), the electrical circuit 206 is formed by processing the metal layer 202, thereby to obtain the optical circuit-electrical circuit mixedly mounting substrate shown in FIG. 23(h). The formations of the via hole 213, the electrical conductor 222 and the electrical circuit 206 may be similar to those in the embodiment shown in FIG. 17.

In this optical circuit-electrical circuit mixedly mounting substrate, in the case wherein the photosensitive resin of the optical circuit forming layer 201 has a property such that the refractive index decreases when irradiated with the activating energy beam, the non-exposed portion 201b of the optical circuit forming layer 201 forms the core 204a having the higher refractive index while the exposed portion 201a of the optical circuit forming layer 201, the light permeable resin layer 217 and the second light permeable resin layer 223 form the cladding portions 204b having the lower refractive index so as to form the optical waveguide 204 in the non-exposed portion 201b. The optical circuit comprising the optical waveguide 204, the electrical circuit 206 and the electrical circuit 212 are mounted together in the same substrate. The deflector portion 205 that is formed at the end of the optical waveguide 204 deflects the light propagating in the optical waveguide 204 so as to eject to the outside, and deflects light from the outside to enter the optical waveguide 204. In the case wherein the photosensitive resin of the optical circuit forming layer 201 has a property such that the refractive index increases when irradiated with the activating energy beam E, it needs not to say that the exposed portion 201a of the optical circuit forming layer 201 forms the core 204a having the higher refractive index while the non-exposed portion 201b of the optical circuit forming layer 201, the light permeable resin layer 217 and the second light permeable resin layer 223 form the cladding portions 204b having the lower refractive index so as to form the optical waveguide 204 in the exposed portion 201a.

Figure 24:
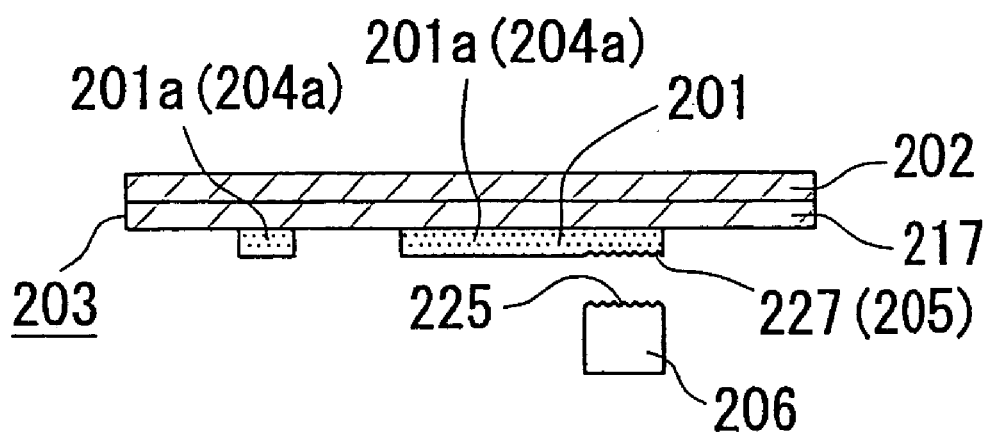
FIG. 24 shows one example of an embodiment for forming a deflecting portion in the method for manufacturing the optical circuit-electrical circuit mixedly mounting substrate according to the present invention.
Figure 24:
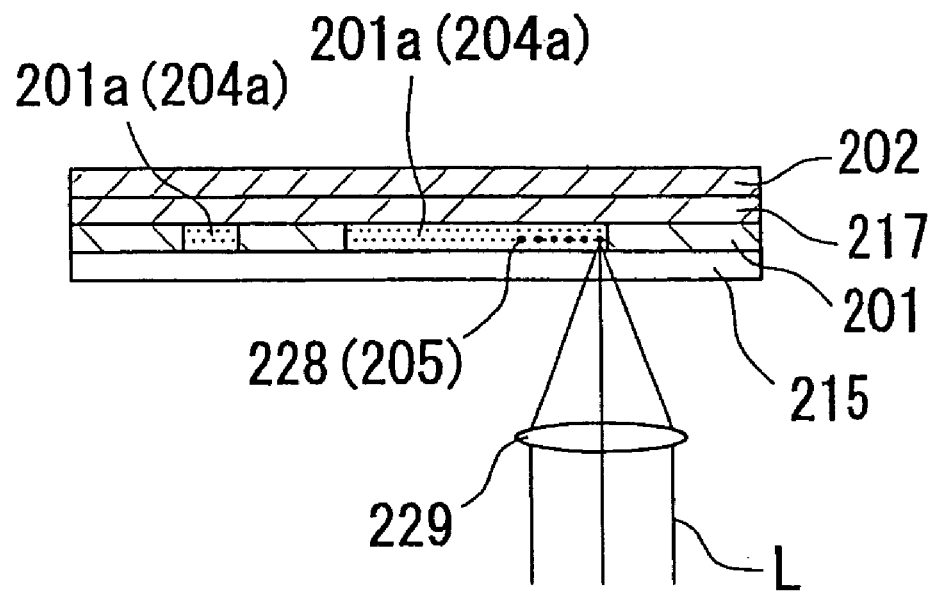

FIG. 24(a) shows other embodiment of the method for forming the deflector portion 205 in the core 204a of the optical waveguide 204. For example, similarly to the steps shown in FIG. 17(a) to FIG. 17(d) (provided that the V-shaped groove 221 is not formed), the core 204a of the optical waveguide 204 is formed by providing the exposed portion 201a in the optical circuit forming layer 201, the cover film 215 is removed, and then a press die 226 having a multitude of fine protrusions 225 arranged in a periodical grating pattern is pressed into a portion of the surface of the optical circuit forming layer 201 where the core 204a is to be formed, so as to form an array 227 of fine grooves arranged in the periodical grating pattern on the portion of the surface of the exposed portion 201a of the optical circuit forming layer 201 to become the core 204a. The array 227 of the fine periodical grooves constitutes a grating, that causes the light propagating in the core 204a of the optical waveguide 204 to be deflected. This enables it to form the deflector portion 205 from the array 227 of the fine periodical grooves without need to form the inclined surface 207 as in the case of the embodiments described above. The press die 226 is preferably made by preparing a master die having the fine grooves on a silicon wafer by a semiconductor manufacturing process and forming the press die by electroforming of nickel using the master die.

When the array 227 is formed on the surface of the optical circuit forming layer 201 by means of transferring the profile of the press die 226 as described above, it is preferable to improve the transfer efficiency by heating the press die 226 as well as if possible, at least the portion of the optical circuit forming layer 201 where the core 204a is to be formed, thereby softening the portion of the optical circuit forming layer 201 where the core 204a is to be formed. In the case wherein the optical circuit forming layer 201 is made of a resin which is cured by the exposure, the press die 226 is pressed into the optical circuit forming layer 201 followed by curing the resin thereof, so that the transfer efficiency is improved. Also, after forming the fine array 227 of the periodical structure on the portion of the surface of the optical circuit forming layer 201 where the core 204a is to be formed, a transparent material that has a refractive index significantly different from that of the core 204a of the optical circuit forming layer 201 is applied to fill so that the difference in the refractive indexes between the optical circuit forming layer 201 and the applied transparent material is made large, which improves the efficiency of deflection of the deflector portion 205.

FIG. 24(b) shows other embodiment of the method for forming the deflector portion 205 in the core 204a of the optical waveguide 204, wherein the portion where the core 204a is to be formed in the optical circuit forming layer 201 is irradiated with a converged laser beam L through the cover film 215 with using the laminate structure 203 prepared by stacking the metal layer 202, the light permeable resin layer 217 and the optical circuit forming layer 201, with the cover film 215 laminated thereon, and after forming the core 204a of the optical waveguide 204 by providing the exposed portion 201a in the optical circuit forming layer 201 similarly to the steps shown in FIG. 23(a) and FIG. 23(b). The irradiation of the converged laser beam L causes the refractive index of the optical circuit forming layer 201 in the converged-irradiated portion to change, so as to form the array 228 of periodical grating pattern from the portion where the refractive index has changed. For the laser beam L, pulse laser having a high peak intensity is preferably used with the power density increased at the focus so as to change the property of the resin of the optical circuit forming layer 201 only in the region exposed to the high power density, thereby to change the refractive index therein. Thus, the fine array 228 of the periodical structure of which refractive index is changed forms the grating, and the light propagating in the core 204a of the optical waveguide 204 can be deflected by the array 228. This enables it to form the deflector portion 205 from the array 228 of the fine periodical grooves without a need to form the inclined surface 207 as in the case of the embodiments described above.

It is noted that instead of changing the refractive index by converging the irradiated laser beam L, the array 228 of the periodical structure may also be produced by forming voids. In order to form the array 228 of the periodical structure by converging the irradiated laser beam L, it is necessary to converge the laser beam by means of a lens 229 having a very high numeral aperture, and an oil-immersion object lens or the like is preferably used.

In either of the periodical structures shown in FIG. 24(a) and FIG. 24(b), the intervals of the arrays 227, 228 are set to the wavelength of the transmitted light divided by the refractive index of the core 204a. If the wavelength of the transmitted light is 850 nm and the refractive index of the core 204a is 1.5, for example, the arrays 227, 228 are formed of which pitch is about 0.57 µm. The arrays 227, 228 that constitute the periodical structure are positioned with reference to the reference mark formed on the metal layer 202 in advance.

FIG. 25(a) to FIG. 25(c) show other embodiment of the optical circuit-electrical circuit mixedly mounting substrate. In this optical circuit-electrical circuit mixedly mounting substrate, the metal layer 202 located right above and opposing to the deflector portion 205 provided in the optical waveguide 204 is etched off during the pattern formation of the electrical circuit 206, so as to form an opening 231 that allows light to transmit in or out of the deflector portion 205. The surface of the resin layer (the light permeable resin layer 217 or the optical circuit forming layer 201) that is exposed to the opening 231 formed by partially removing the metal layer 202 is very rough, and light transmitting in or out of the deflector portion 205 is scattered by the rough surface, resulting in an extremely low efficiency of introducing or extracting light, namely a low coupling efficiency of the light with the optical waveguide 204.

To counter this problem, in the embodiment shown in FIG. 25(a), a light permeable resin 216 is applied in the opening 231 which is formed by partially removing the metal layer 202 followed by hardening the resin so as to fill the irregularities of the rough surface with the resin, whereby a smooth surface of the light permeable resin 216 is obtained over the rough surface. This eliminates the scattering of light by means of the rough surface that enters or emerging from the deflector portion 205, so as to greatly improve the efficiency of light introduction into or extraction from the deflector portion 205, whereby the coupling efficiency of the light with the optical waveguide. The light permeable resin 216 preferably has a refractive index comparable to that of the resin layer as a base (the light permeable resin layer 217 or the optical circuit forming layer 201).

In the embodiment shown in FIG. 25(b), the light permeable resin 216 is applied in the opening 231 formed by partially removing the metal layer 202 while the surface of the applied resin bulges, so as to form a convex lens. Forming the light permeable resin 216 in the shape of the convex lens enables it to collect light that enters the deflector portion 205, so as to further improve the efficiency of the light introduction or extraction into the deflector portion, namely to improve the coupling efficiency of the light with the optical waveguide. Since the convex profile of the lens is determined by such factors as the viscosity of the light permeable resin 216, wettabilities of the resin layer as the base and the surrounding metal layer, and the size of the exposed resin layer area, the convex lens can be formed with less variation in its shape.

In the embodiment shown in FIG. 25(c), a surface or side of the metal layer 202 remaining around the opening 231 is processed to be water-repellent after the opening 231 has been formed by partially removing the metal layer 202. Following the water-repellent treatment, a drop of the light permeable resin 216 is dropped into the opening so as to form a convex lens of the light permeable resin 216. The water-repellent treatment can be applied by coating the surface or side of the metal layer 202 remaining around the opening 231 with a polymer film 244 that has a low surface energy density and is water-repellent. The polymer film 244 can be formed by, for example, by dropping or spraying a diluted varnish of a fluorine polymer. The polymer film 244 preferably has a refractive index comparable to that of the resin layer as the base (the light permeable resin 217 or the optical circuit forming layer 201). The water-repellent treatment of the surface or side of the metal layer 202 surrounding the opening 231 causes a liquid of the light transmitting resin 216 that is dropped in the opening 231 to be repelled, so that deformation of the liquid drop can be minimized and the liquid can be formed in a convex shape bulging large, even when the partial removal of the metal layer 202 cannot be done evenly due to burrs or the like. Thus, it is made possible to form a convex lens of the light permeable resin 216 which allows large refraction, which results in high light convergence capacity without using a resin of a higher refractive index.

Figure 26:
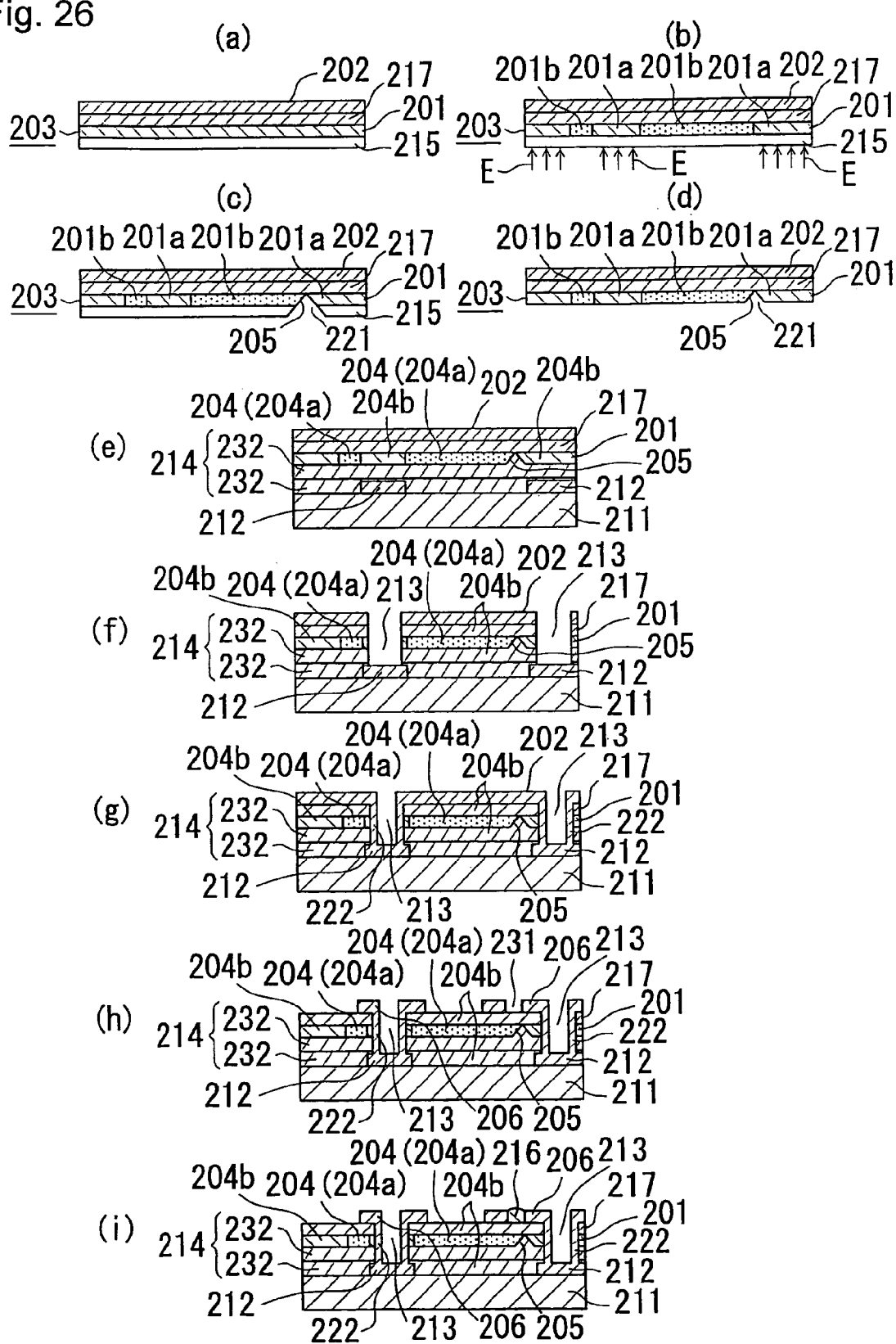
FIG. 26 shows the steps of one example of an embodiment of the method for manufacturing the optical circuit-electrical circuit mixedly mounting substrate according to the present invention.

FIG. 26 shows other embodiment of the present invention, wherein the optical circuit-electrical circuit mixedly mounting substrate is manufactured by a method similar to the embodiment shown in FIG. 23, except that the laminate structure 203 is made by stacking the metal layer 202, the light permeable resin layer 217, the optical circuit forming layer 201 and the cover film 215 in this listed order. It should be noted, however, that in the embodiment shown in FIG. 26, a prepreg 232 is used as the adhesive 214 that bonds the laminate structure 203 and the wiring board 211 as shown in FIG. 26(e), and the convex lens made of the light permeable resin 216 is formed right above the deflector portion 205 of the optical waveguide 204 as shown in FIG. 26(i).

Figure 27:
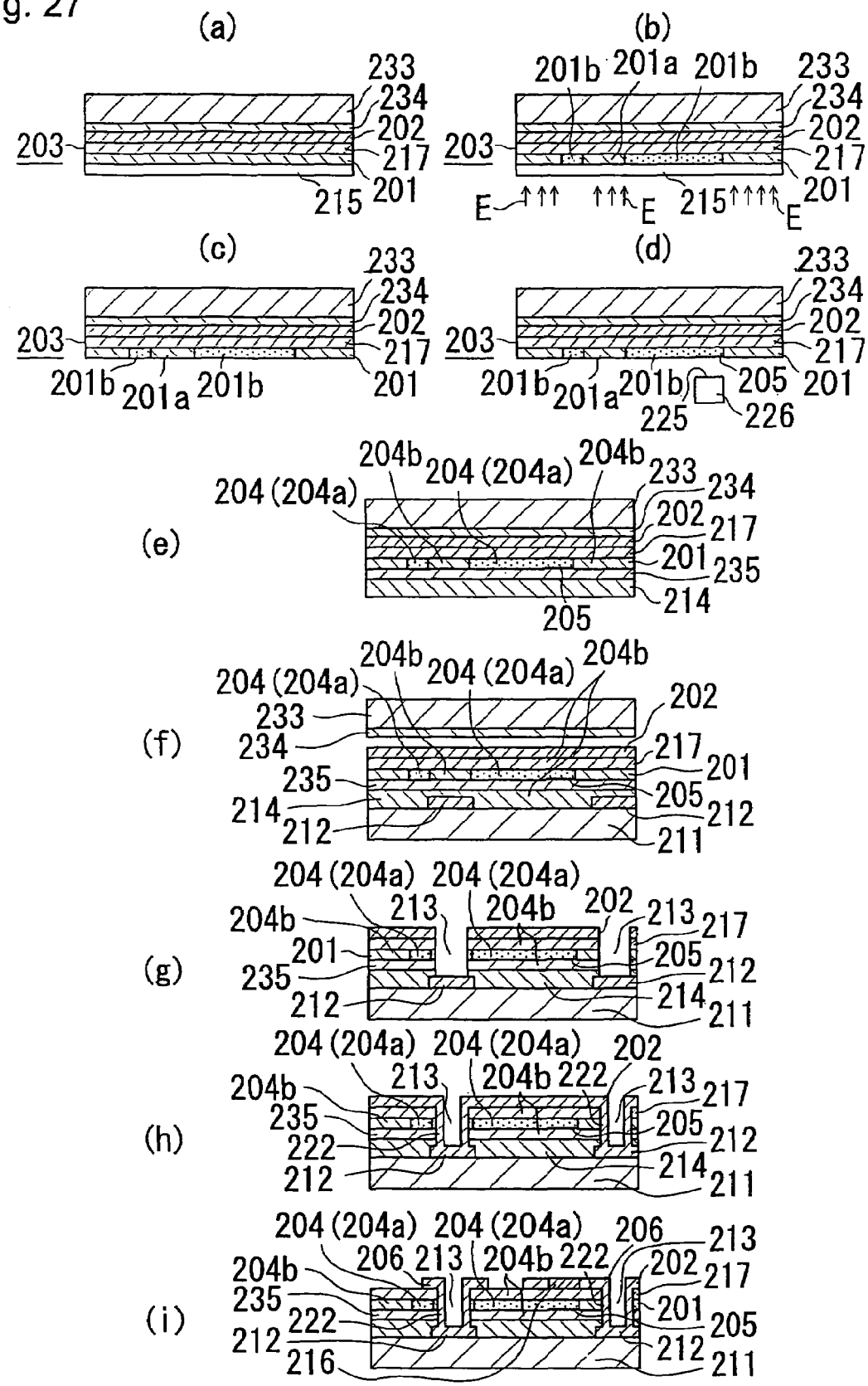
FIG. 27 shows the steps of one example of an embodiment of the method for manufacturing the optical circuit-electrical circuit mixedly mounting substrate according to the present invention.

FIG. 27 shows other embodiment of the present invention, wherein the optical circuit-electrical circuit mixedly mounting substrate is manufactured by a method similar to the embodiment shown in FIG. 23, except that the metal layer 202 is bonded releasably with a double-sided adhesive tape 234 onto one side of a supporting member 233, and the laminate structure 203 is formed by stacking the light permeable resin layer 217, the optical circuit forming layer 201 and the cover film 215 on the metal layer 202 in this listed order. It should be noted, however, that in the embodiment shown in FIG. 27, the deflector portion 205 is formed by the method shown in FIG. 24(a) by using the press die 226 as shown in FIG. 27(d), and the adhesive 214 is applied via the second light permeable resin 235 to the optical circuit forming layer 201 as shown in FIG. 27(e). In addition, the light permeable resin 216 is provided right above the deflector portion 205 of the optical waveguide 204 as shown in FIG. 27(i).

Figure 28:
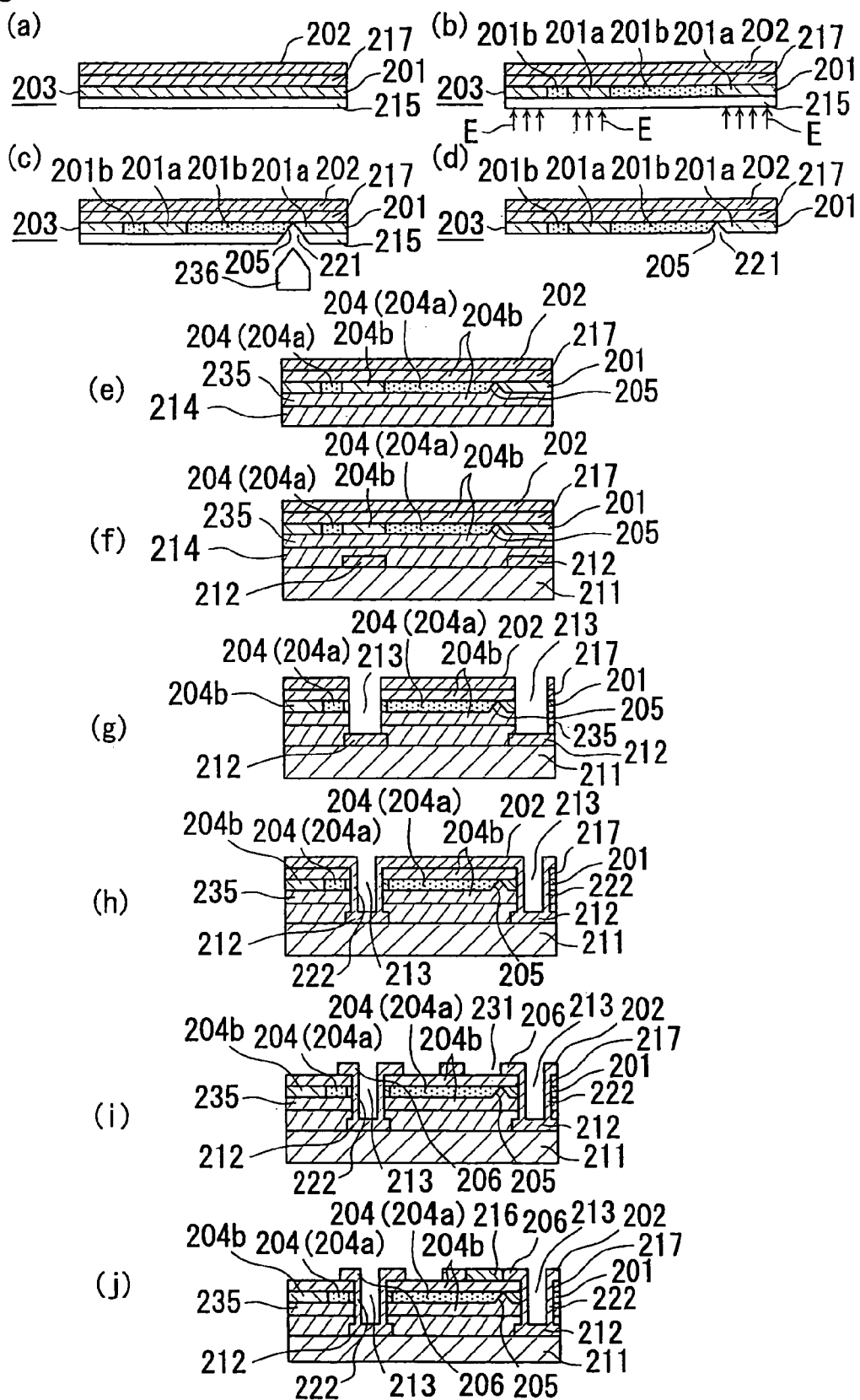
FIG. 28 shows the steps of one example of an embodiment of the method for manufacturing the optical circuit-electrical circuit mixedly mounting substrate according to the present invention.

FIG. 28 shows other embodiment of the present invention, wherein the optical circuit-electrical circuit mixedly mounting substrate is manufactured by a method similar to the embodiment shown in FIG. 23, except that the laminate structure 203 is formed by stacking the metal layer 202, the light permeable resin layer 217, the optical circuit forming layer 201 and the cover film 215 in this listed order. It should be noted, however, that in the embodiment shown in FIG. 28, the V-shaped groove 221 is formed by using a press die 236 as shown in FIG. 28(c), and the adhesive 214 is applied via the second light permeable resin layer 235 to the optical circuit forming layer 201 as shown in FIG. 28(e). In addition, the light permeable resin 216 is provided right above the deflector portion 205 of the optical waveguide 204 as shown in FIG. 28(j).

Figure 29:
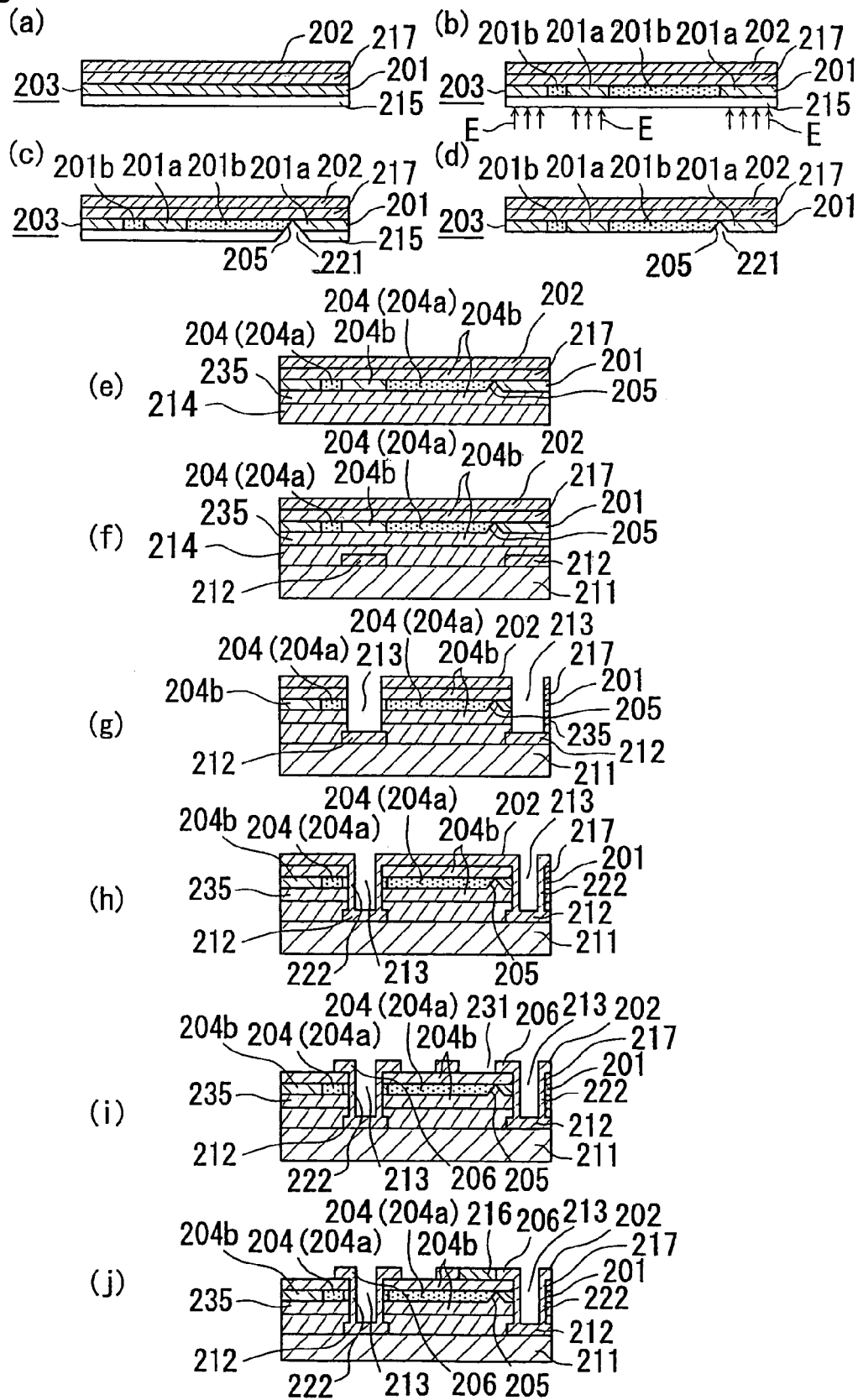
FIG. 29 shows the steps of one example of an embodiment of the method for manufacturing the optical circuit-electrical circuit mixedly mounting substrate according to the present invention.

FIG. 29 shows other embodiment of the present invention, wherein the optical circuit-electrical circuit mixedly mounting substrate is manufactured by a method similar to the embodiment shown in FIG. 23, except that the laminate structure 203 is formed by stacking the metal layer 202, the light permeable resin layer 217, the optical circuit forming layer 201 and the cover film 215 in this listed order. It should be noted, however, that in the embodiment shown in FIG. 29, the adhesive 214 is applied via the second light permeable resin layer 235 to the optical circuit forming layer 201 as shown in FIG. 29(e), and the light permeable resin 216 is provided right above the deflector portion 205 of the optical waveguide 204 as shown in FIG. 29(j).

Figure 25:
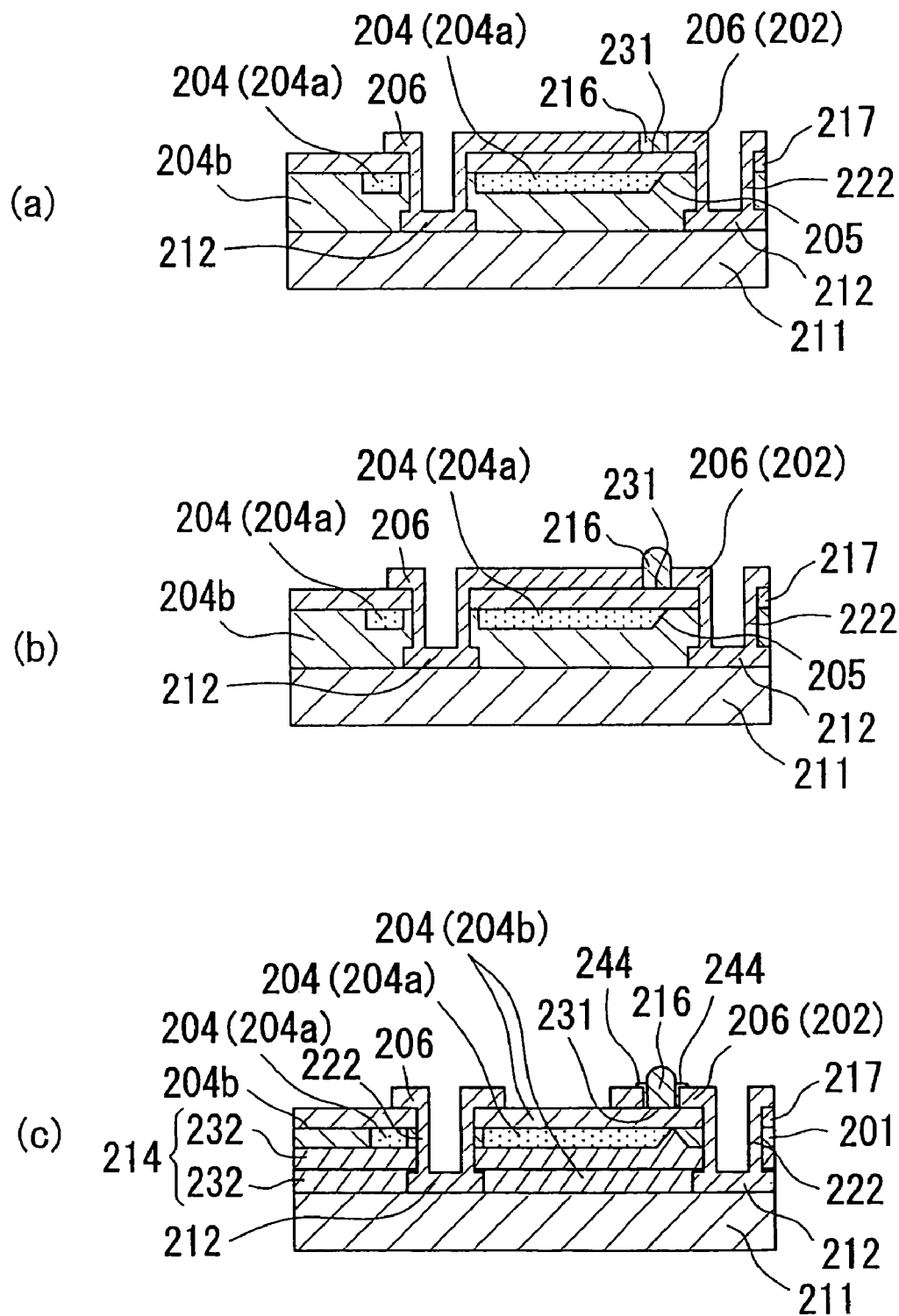
FIG. 25 shows one example for manufacturing the optical circuit-electrical circuit mixedly mounting substrate according to the present invention wherein means for efficiently transmitting light to the deflector portion or from the deflector portion is formed.
Figure 30:
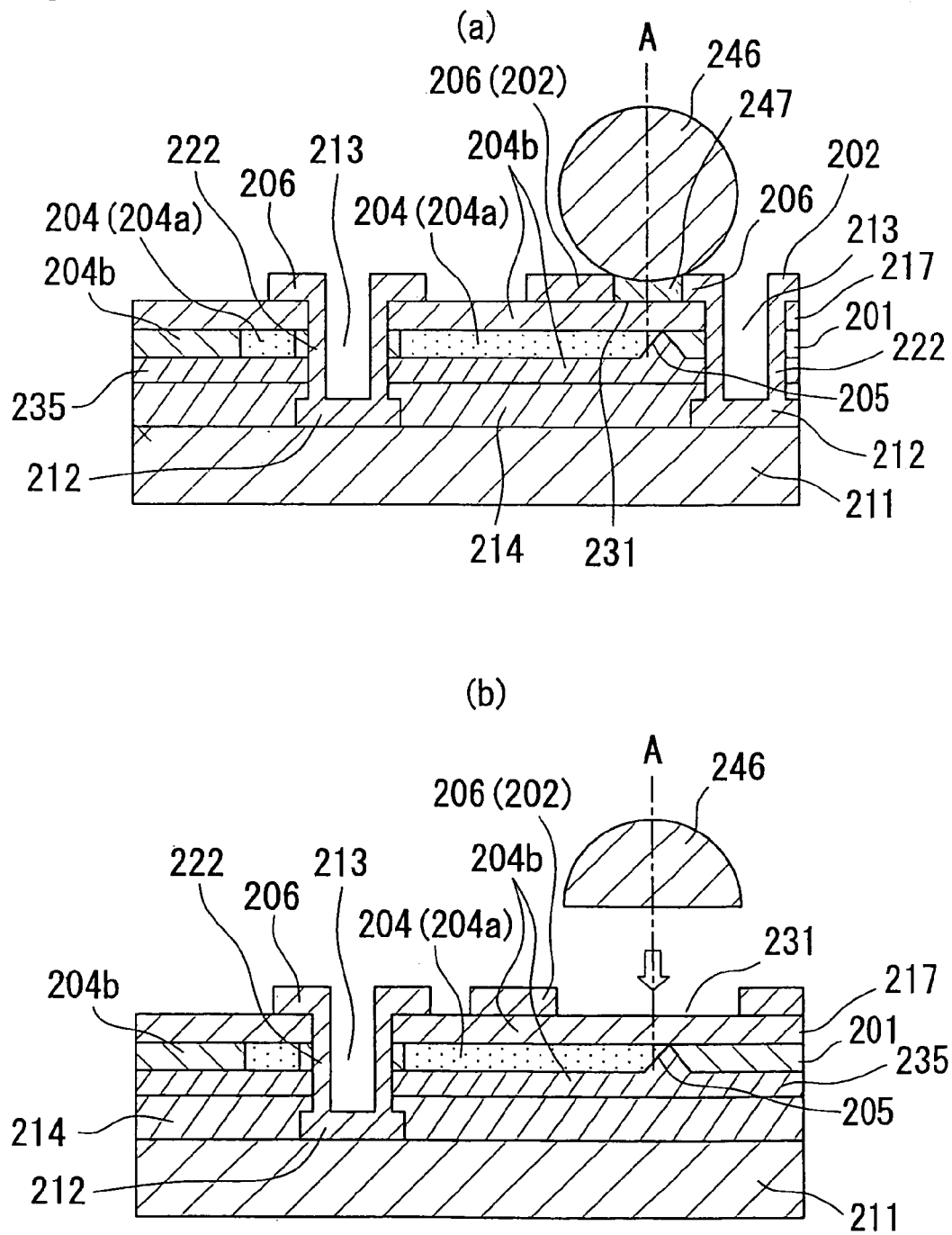
FIG. 30 shows one example of an embodiment for manufacturing the optical circuit-electrical circuit mixedly mounting substrate according to the present invention wherein means for efficiently transmitting light to the deflector portion or from the deflector portion is formed.

FIG. 30(a) and FIG. 30(b) show other embodiments of the optical circuit-electrical circuit mixedly mounting substrate, wherein the opening 231 is formed by etching to remove a portion of the metal layer 202 located right above and opposing to the deflector portion 205 provided in the core 204a of the optical waveguide 204, and the resin layer (the light permeable resin layer 217 or the optical circuit forming layer 201) is exposed through the opening 231, similarly to the embodiment of FIG. 25. A lens 246 is disposed in the opening 231 for optically connecting a light receiving or emitting portion and the deflector portion 205. The opening 231 is formed by etching at the same time as the electrical circuit 206 is formed from the metal layer 202. As mentioned previously, the opening 231 can be formed at the position determined with reference to the reference mark formed on the metal layer 202 in advance. Thus, with arranging the opening 231 having such a position, a shape and a dimension that the optical axis A of the lens 246 passes through the deflector portion 205 when lens 246 is fixed on the metal layer 202 remaining around the opening 231 such that its outer periphery is in contact with the metal layer 202, it becomes possible to dispose the lens 246 easily with high accuracy simply by fitting the lens 246 in place in or on the opening 231 formed by removing the metal layer 202.

As the lens 246, a sphere lens (ball lens) is preferably used. The "ball lens" here includes, in addition to that of a completely spherical shape as shown in FIG. 30(a), those having flat surface such as a half ball lens having a semispherical form, which may be used under consideration of the distance from the surface of the light emitting/receiving element (or a module including it mounted thereon) that is mounted right above thereof, and the shape accuracy of the opening 231.

It is preferable that a gap between the lens 246 and the exposed surface of the resin layer as the base (the light permeable resin layer 217 or the optical circuit forming layer 201) exposed through the opening 231 is filled with a light permeable resin 247 as shown in FIG. 30(a). By filling the gap with the light permeable resin 247, it is becomes possible to prevent reflection loss from occurring due to an air layer produced between the lens 246 and the resin layer as the base, and also to firmly fix the lens 246 by the adhesive action of the light permeable resin 247. The light permeable resin 247 preferably has a refractive index which is the same as or comparable to that of the resin layer as the base (the light permeable resin layer 217 or the optical circuit forming layer 201).

Figure 31:
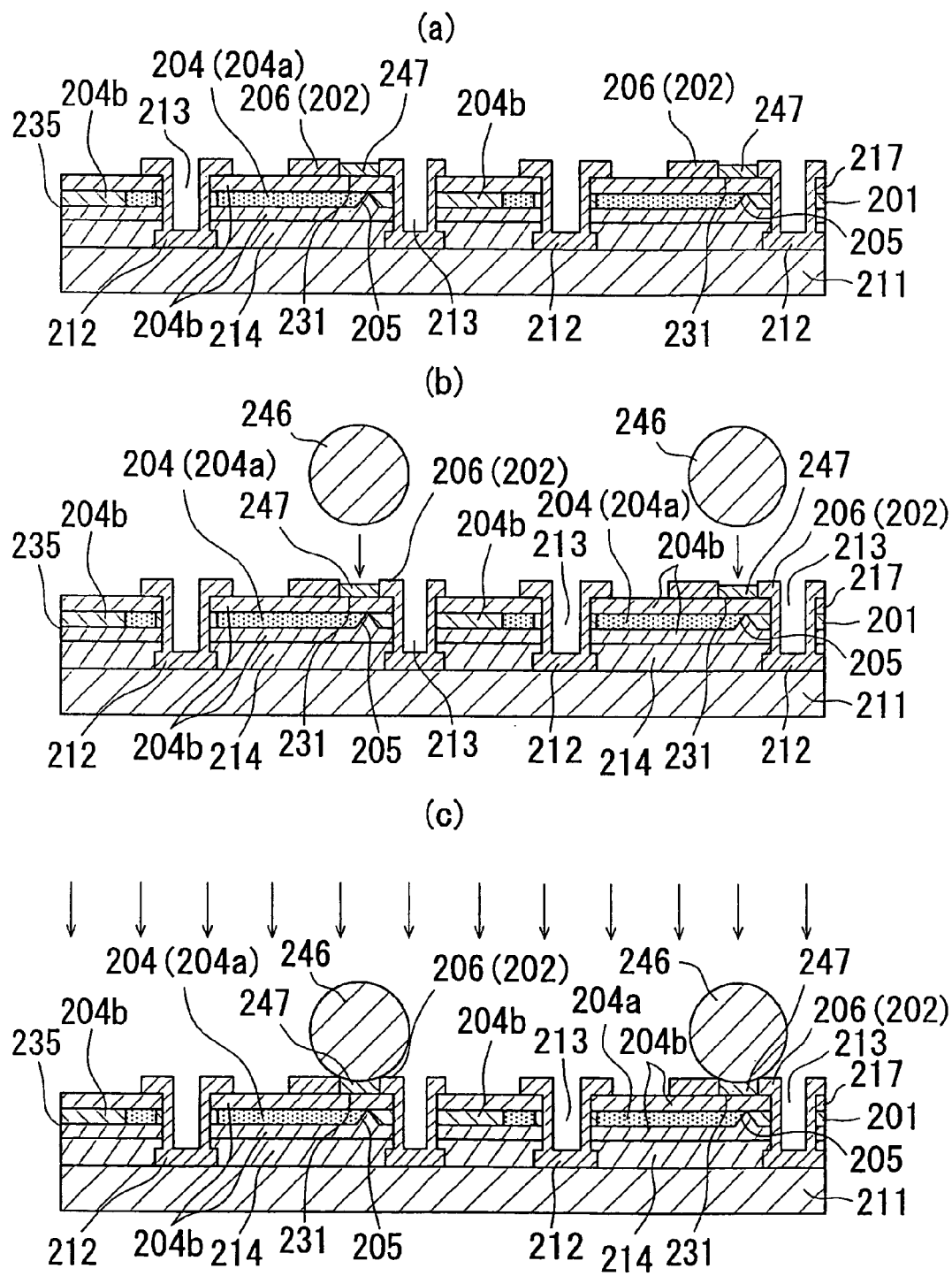
FIG. 31 shows one example of an embodiment for manufacturing the optical circuit-electrical circuit mixedly mounting substrate according to the present invention wherein a lens for efficiently transmitting light to the deflector portion or from the deflector portion is located.

The light permeable resin 247 used in fixing the lens 246 may be such a material that cures when irradiated with radiation such as ultraviolet ray. In this case, while the optical circuit-electrical circuit mixedly mounting substrate is made as shown in FIG. 31(a) similarly to the embodiment shown in FIG. 29, portions of the metal layer 202 located right above and opposing to the deflector portions 205 provided in the core 204a of the optical waveguide 204 are removed by etching so as to form a plurality of the openings 231 and, after applying the light permeable resin 247 that is photocurable in the openings 231, lenses 246 are placed on the liquid light permeable resin 247 as shown in FIG. 31(b) which are irradiated with ultraviolet ray L or the like as shown in FIG. 31(c) so as to cure the light permeable resin 247 in all openings 231, thereby to fix all the lenses 246 at the same time.

In the embodiments described above, the reference mark is formed on the metal layer 202 in advance, and the core 204a of the optical waveguide 204, the deflector portion 205 and the electrical circuit 206 are formed with reference to the reference mark, and the openings 231 are formed simultaneously with the electrical circuit 206. Alternatively, with an exposure pattern for the reference mark being formed in the photo mask that is used in the exposure of the core 204a and others, the reference mark may be formed on the optical circuit forming layer 201 in the step of forming the core 204a of the optical waveguide 204 in the optical circuit forming layer 201, so that the deflector section 205, the electrical circuit 206, etc. are formed in place as determined with reference to the reference mark, during the subsequent step of forming the deflector section 205, and the electrical circuit 206. In such manner, the need to form the reference mark on the metal layer 202 in advance is eliminated. Also, because the positional relationship between the core 204a of the optical waveguide 204 formed in the optical circuit forming layer 201 and the reference mark has been precisely determined in the photo mask, these members are in an accurate positional relationship with each other, and therefore accurate positional relationship can be achieved between the core 204a of the optical waveguide 204, the deflector section 205, the electrical circuit 206 and so on. In this case, it is necessary to partially remove an approximate portion of the metal layer 202 so as to make the reference mark of the optical circuit forming layer 201 visible before forming the electrical circuit 206 in the metal layer 202.

EXAMPLES

Examples of the present invention will now be described in detail.

Example 1

Using a copper foil having a thickness of 35 μm ("MPGT" manufactured by Furukawa Electric Co., Ltd.) as a metal layer 13, a light permeable resin A was applied to the metal layer 13 by roll transferring process to have a thickness of 50 μm, which was then cured by irradiating with light generated by a high-pressure mercury vapor lamp having an output power of 2.5 J/cm$^2$ to form a light permeable resin layer 1. Then, a varnish which contains a photosensitive resin A was applied to a thickness of 80 μm and heated to dry so as to form an optical circuit forming layer 2 having a thickness of 40±5 μm, thereby to obtain the material for the optical circuit-electrical circuit mixedly mounting substrate as shown in FIG. 1(a).

As the light permeable resin A, "Optodyne UV-3100" manufactured by Daikin Industries, Ltd. was used, which is a UV-curing epoxy resin that has a refractive index of 1.49 after being cured.

AS the vanish which contains the photosensitive resin A, a varnish was used which contained 100 parts by weight of "EHPE-3150" manufactured by Daicel Chemical Industries, Ltd., 70 parts by weight of methyl ethyl ketone, 30 parts by weight of toluene and 2 parts by weight of "RHODOSIL PHOTOINITIATOR 2074" manufactured by Rhodia Japan Co., Ltd. After drying the varnish to remove the solvents and curing by irradiating with light generated by the high-pressure mercury vapor lamp having an output power of 10 J/cm$^2$, post-curing was carried out at 150° C. for one hour, with the cured resin showing a refractive index of 1.53.

The material for the optical circuit-electrical circuit mixedly mounting substrate produced as described above was cut into a square sheets having a size of 6 cm×6 cm, and the optical circuit forming layer 2 was exposed to the irradiation with light generated by a high-pressure mercury vapor lamp having an output power of 10 J/cm$^2$ through a mask having a linear slit of which width is 40 μm through which light is allowed to pass, and was heated at 120° C. for 30 minutes (refer to FIG. 2(a)). Then, non-irradiated portion was removed by developing with toluene and Clean Through (aqueous cleaning agent used as substitute for Freon, manufactured by Kao Corp.), followed by washing with water and drying (refer to FIG. 2(b)). Then, the light permeable resin A was applied to a thickness of 80 μm to cover the linear optical circuit forming layer 2 and cured by irradiating with light generated by a high-pressure mercury vapor lamp having an output power of 2.5 J/cm$^2$ so as to form a light permeable resin layer 20 (refer to FIG. 2(c)), over which a varnish of adhesive A was applied to a thickness of 40 μm and was dried at 150° C. to form the adhesive layer 23. By stacking a printed wiring board 22 of type FR-5 via the adhesive layer 23 and pressing in vacuum at a temperature of 170° C., the optical circuit-electrical circuit mixedly mounting substrate having the core 26 of the optical waveguide formed with the linear optical circuit forming layer 2 was obtained (refer to FIGS. 2(d) and (e)).

As the varnish of adhesive A, a varnish was used which comprised 90 parts by weight of "YDB500" (a brominated epoxy resin) manufactured by Toto Kasei, 10 parts by weight of YDCN-1211 (a cresol novolak type epoxy resin) manufactured by Toto Kasei, 3 parts by weight of dicyandiamide, 0.1 parts by weight of "2E4MZ" (2-ethyl-4-methylimidazole) manufactured by Shikoku Kasei, 30 parts by weight of methyl ethyl ketone and 8 parts by weight of dimethylformamide.

As to the optical circuit-electrical circuit mixedly mounting substrate formed as described above, both end faces of the linear (or columnar) optical circuit forming layer 2 (namely the core 26) which are perpendicular its elongated direction were polished so as to expose the end faces of the optical circuit forming layer 2 (the faces of the cores 26 that is being seen in FIG. 2) that forms the core of the optical circuit. Near infrared light having a wavelength 850 μm was injected from a multimode optical fiber having a core diameter of 50 μm into the core through one end face thereof while observing the light emerging from the other end face of the core with a CCD camera. Propagation of light was observed, which proved that the optical circuit was functioning. Peel-off strength of the copper foil constituting the metal layer 13 was measured, and it was 6.9 N/cm (0.7 kg/cm).

Example 2

In Example 1, after forming the optical circuit forming layer 2, a cover film 15 made of a transparent PET having a thickness of 25 μm was laminated on the surface of the optical circuit forming layer 2 by pressing with a roller, to obtain the material for the optical circuit-electrical circuit mixedly mounting substrate as shown in FIG. 1(c), which showed good workability of handling because the optical circuit forming layer 2 was not exposed.

The material for the optical circuit-electrical circuit mixedly mounting substrate was processed similarly to Example 1, except that after exposing to irradiation through the cover film 15, developing was carried out while removing the cover film 15, so as to obtain the optical circuit-electrical circuit mixedly mounting substrate. Testing the obtained optical circuit-electrical circuit mixedly mounting substrate similarly to Example 1 showed that the optical circuit was functioning. Measurement of peel-off strength of the copper foil which constituted the metal layer 13 showed a strength of 6.9 N/cm (0.7 kg/cm).

Example 3

Using a copper foil as the metal layer 13 similarly to Example 1, the adhesive varnish A was applied on the metal layer 13 to a thickness of 40 μm and dried at 150° C., and thereby the adhesive layer 14 was formed. By forming the light permeable resin layer 1 and the optical circuit forming layer 2 on the adhesive layer 14 similarly to Example 1, the material for the optical circuit-electrical circuit mixedly mounting substrate shown in FIG. 1(b) was obtained.

The material for the optical circuit-electrical circuit mixedly mounting substrate was processed similarly to Example 1, thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 9.8 N/cm (1.0 kg/cm), proving that bonding strength of the metal layer 13 was improved by the adhesive layer 14.

Example 4

Using a stainless steel plate as the supporting member 16, a shiny surface of a copper foil was bonded with a double-sided adhesive tape onto the surface of the stainless steel plate, thereby attaching the metal layer 13 to the supporting member 16. By forming the light permeable resin layer 1 and the optical circuit forming layer 2 on the surface of the metal layer 13 similarly to Example 1, the material for the optical circuit-electrical circuit mixedly mounting substrate shown in FIG. 1(d) was obtained, which showed good workability of handling because the thin metal layer 13 was reinforced by the rigid supporting member 16.

The material for the optical circuit-electrical circuit mixedly mounting substrate was processed similarly to Example 1, and the supporting member 16 was finally removed thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 6.9 N/cm (0.7 kg/cm).

Example 5

Using the same copper film as in that of Example 1 as the metal layer 13, the metal layer 13 was coated with a varnish which contains photosensitive resin B to a thickness of 100 µm by the roll transfer process, and was heated to dry so as to form the optical circuit forming layer 5 having a thickness of 50±5 µm, thereby to obtain the material for the optical circuit-electrical circuit mixedly mounting substrate shown in FIG. 7(a).

As the photosensitive resin B, "Gracia (Gurashia) PS-SR103 manufactured by Nippon Paint Co., Ltd. was used, which is a polysilane resin and of which refractive index is 1.64 (at a thickness of 50 µm) after being cured (by the exposure to ultraviolet ray) and also changes to a refractive index of 1.58 to 1.62 after the exposure to ultraviolet ray of 10 J/cm$^2$.

The material for the optical circuit-electrical circuit mixedly mounting substrate obtained as described above was cut into a square sheet having a size of 6 cm×6 cm, and the optical circuit forming layer 5 was exposed to the irradiation with light generated by a high-pressure mercury vapor lamp of 10 J/cm$^2$ through a mask which blocked the light to form a non-irradiated portion in a linear form having a width of 40 µm (refer to FIG. 8(a)), so as to decrease the refractive index of the exposed portion in order to turn the exposed portion into a lower refractive index portion 5b and the non-irradiated portion into a higher refractive index portion 5a (refer to FIG. 8(b)). Then, the light permeable resin B was applied to a thickness of 40 µm so as to cover the optical circuit forming layer 5 and was cured by heating at 100° C. for 1 hour and then at 150° C. for 1 hour so as to form a light permeable resin 20 (refer to FIG. 8(c)), over which a varnish of adhesive A was applied to a thickness of 40 µm and was dried at 150° C. to form the adhesive layer 23. By stacking it on a printed wiring board 22 of type FR-5 via the adhesive layer 23 followed by pressing in vacuum at a temperature of 170° C., the optical circuit-electrical circuit mixedly mounting substrate was obtained wherein the core 26 of the optical waveguide was formed with the linear high refractive index portion 5a of the optical circuit forming layer 5 (refer to FIGS. 8(d) and (e)).

AS the light permeable resin B, a thermosetting epoxy resin was used which comprised 100 parts by weight of "BPAF-DGE" (a fluorinated bisphenol A type epoxy resin, having an epoxy equivalent weight (WPE) of 242) manufactured by Toto Kasei, 66 parts by weight of "B650" (methylhexahydrophthalate anhydride, having an equivalent weight of acid anhydride of 168) manufactured by Dainippon Ink & Chemicals, Inc. and 2 parts by weight of "SA-102" (an octoate (caprylate) of diazabicycloundecene) manufactured by SAN-APRO LTD. When the resin B is cured by heating at 100° C. for 1 hour and then at 150° C. for 1 hour, it shows a refractive index of 1.51.

The optical circuit-electrical circuit mixedly mounting substrate obtained as described above was tested similarly to Example 1, and propagation of light was observed, proving that the optical circuit was functioning. Measurement of peel-off strength of the copper foil constituting the metal layer 13 showed a strength of 4.9 N/cm (0.5 kg/cm).

Example 6

In Example 5, after forming the optical circuit forming layer 5, a cover film 15 made of a transparent PET having a thickness of 25 µm was laminated on the surface of the optical circuit forming layer 5 by pressing with a roller, to obtain the material for the optical circuit-electrical circuit mixedly mounting substrate as shown in FIG. 7(c), which showed good workability of handling because the optical circuit forming layer 5 was not exposed.

The material for the optical circuit-electrical circuit mixedly mounting substrate was processed similarly to Example 5, except for forming the light permeable resin layer 20 with removing the cover film 15 after exposing to the irradiation through the cover film 15, thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 4.9 N/cm (0.5 kg/cm).

Example 7

Using a copper foil as the metal layer 13 similarly to Example 5, adhesive varnish A was applied on the metal layer 13 to a thickness of 40 µm and dried at 150° C., thereby forming the adhesive layer 14. By forming the optical circuit forming layer 5 on the adhesive layer 14 similarly to Example 5, the material for the optical circuit-electrical circuit mixedly mounting substrate shown in FIG. 7(b) was made.

The material for the optical circuit-electrical circuit mixedly mounting substrate was processed similarly to Example 5, thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 8.8 N/cm (0.9 kg/cm), proving that bonding strength of the metal layer 13 was improved by the adhesive layer 14.

Example 8

Using a stainless steel plate as the supporting member 16, a shiny surface of a copper foil was bonded with a double-sided adhesive tape onto the surface of the stainless steel plate, thereby attaching the metal layer 13 to the supporting member 16. By forming the optical circuit forming layer 5 on the surface of the metal layer 13 similarly to Example 5, the material for the optical circuit-electrical circuit mixedly mounting substrate shown in FIG. 7(d) was made, which showed good workability of handling because the thin metal layer 13 was reinforced by the rigid supporting member 16.

The material for the optical circuit-electrical circuit mixedly mounting substrate was processed similarly to Example 1, and the supporting member 16 was finally removed thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 4.9 N/cm (0.5 kg/cm).

Example 9

Using the same copper film as that of Example 1 as the metal layer 13, the metal layer 13 was coated with a varnish of photosensitive resin B to a thickness of 100 μm by the roll transfer process, and was heated to dry so as to form the optical circuit forming layer 12 having a thickness of 50±5 μm, over which the light permeable resin B was applied to a thickness of 50 μm by the roll transfer process and was cured by heating at 100° C. for 1 hour and then at 150° C. for 1 hour thereby to form the light permeable resin 11, thus obtaining the material for the optical circuit-electrical circuit mixedly mounting substrate shown in FIG. 15(a).

The material for the optical circuit-electrical circuit mixedly mounting substrate obtained as described above was cut into a square sheet having a size of 6 cm S 6 cm, and the optical circuit forming layer 12 was exposed to the irradiation with light generated by a high-pressure mercury vapor lamp of 10 J/cm$^2$ through a mask having 40 μm wide linear slit through which light passed (refer to FIG. 16(a)), so as to decrease the refractive index of the exposed portion in order to turn the exposed portion into a lower refractive index portion 12b and the non-irradiated portion into a higher refractive index portion 12a (refer to FIG. 16(b)). Then, the varnish of adhesive A was applied to a thickness of 40 μm on the light permeable resin layer 11 and was dried at 150° C. so as to form the adhesive layer 23. By stacking it on a printed wiring board 22 of type FR-5 via the adhesive layer 23 and pressing in vacuum at a temperature of 170° C., the optical circuit-electrical circuit mixedly mounting substrate was obtained wherein the core 26 of the optical circuit was formed with the linear high refractive index portion 12a of the optical circuit forming layer 12 (refer to FIG. 16(c) and FIG. 16(d)).

The optical circuit-electrical circuit mixedly mounting substrate obtained as described above was tested similarly to Example 1, and propagation of light was observed, proving that the optical circuit was functioning. Measurement of peel-off strength of the copper foil constituting the metal layer 13 showed a strength of 4.9 N/cm (0.5 kg/cm).

Example 10

In Example 9, after forming the optical circuit forming layer 12 and the light permeable resin layer 11, the cover film 15 made of a transparent PET having a thickness of 25 μm was laminated on the surface of the light permeable resin layer 11 by pressing with a roller, to obtain the material for the optical circuit-electrical circuit mixedly mounting substrate shown in FIG. 15(c), which showed good workability of handling because the resin layer was not exposed.

The material for the optical circuit-electrical circuit mixedly mounting substrate was processed similarly to Example 9, except for forming the adhesive layer 23 with the cover film 15 removed after exposing to the irradiation through the cover film 15, thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 4.9 N/cm (0.5 kg/cm).

Example 11

Using a stainless steel plate as the supporting member 16, a shiny surface of a copper foil was bonded with a double-sided adhesive tape onto the surface of the stainless steel plate, thereby attaching the metal layer 13 to the supporting member 16. By forming the optical circuit forming layer 12 and the light permeable resin layer 11 on the surface of the metal layer 13 similarly to Example 9, the material for the optical circuit-electrical circuit mixedly mounting substrate shown in FIG. 15(d) was obtained, which showed good workability of handling because the thin metal layer 13 was reinforced by the rigid supporting member 16.

The material for the optical circuit-electrical circuit mixedly mounting substrate was processed similarly to Example 1, and the supporting member 16 was finally removed thereby to obtain the optical circuit-electrical circuit mixedly mounting substrate. Testing the optical circuit-electrical circuit mixedly mounting substrate similarly to Example 1 showed that the optical circuit was functioning. Measurement of peel-off strength of the copper foil constituting the metal layer 13 showed a strength of 4.9 N/cm (0.5 kg/cm).

Example 12

Using the same copper foil as that of Example 1 as the metal layer 13, the metal layer 13 was coated with the light transmitting resin A to a thickness of 50 μm by the roll transfer process, and was cured by irradiating with light generated by a high-pressure mercury vapor lamp of 2.5 J/cm$^2$ so as to form the first light permeable resin layer 1. Then, the varnish of photosensitive resin B was applied to a thickness of 80 μm and was heated to dry so as to form the optical circuit forming layer 8 having a thickness of 40±5 μm, over which the light transmitting resin B was applied to a thickness of 50 μm by the roll transfer process and was cured by heating at 100° C. for 1 hour and then at 150° C. for 1 hour thereby to form the second light permeable resin layer 9, thus obtaining the material for the optical circuit-electrical circuit mixedly mounting substrate as shown in FIG. 11(a).

The material for the optical circuit-electrical circuit mixedly mounting substrate obtained as described above was cut into a square sheet having a size of 6 cm×6 cm, and the optical circuit forming layer 8 was exposed to the irradiation with light generated by a high-pressure mercury vapor lamp of 10 J/cm$^2$ through a mask having a 40 μm wide linear slit through which light passed (refer to FIG. 12(a)), so as to decrease the refractive index of the exposed portion in order to turn the exposed portion into a lower refractive index portion 8b and the non-irradiated portion into a higher refractive index portion 8a (refer to FIG. 12(b)).

Then, the varnish of adhesive A was applied to a thickness of 40 μm on the second light permeable resin layer 9 and dried at 150° C. so as to form the adhesive layer 23. By stacking it on a printed wiring board 22 of type FR-5 via the adhesive layer 23 and pressing in vacuum at a temperature of 170° C., the optical circuit-electrical circuit mixedly mounting substrate was obtained wherein the core 26 of the optical circuit was formed with the linear high refractive index portion 8a of the optical circuit forming layer 8 (refer to FIG. 12(c) and FIG. 12(d)).

The optical circuit-electrical circuit mixedly mounting substrate obtained as described above was tested similarly to Example 1, and propagation of light was observed, proving that the optical circuit was functioning. Measurement of peel-off strength of the copper foil constituting the metal layer 13 showed a strength of 6.9 N/cm (0.7 kg/cm).

Example 13

Using the same copper foil as that of Example 1 as the metal layer 13, the metal layer 13 was coated with a light transmitting resin B to a thickness of 50 μm by the roll transfer process, and was cured by heating at 100° C. for 1 hour and then at 150° C. for 1 hour thereby to form the light permeable resin layer 1. Then, the cover film 15 made of a transparent PET having thickness of 25 μm was coated with the light transmitting resin B to a thickness of 50 μm by the roll transfer process, and was cured by heating at 100° C. for 1 hour and then at 150° C. for 1 hour thereby to form the second light permeable resin layer 9. Then, an optical circuit forming layer 8 formed into a film having a thickness of 40 μm by casting a photosensitive resin C was sandwiched to laminate between the light permeable resin layer 1 and the second light permeable resin layer 9 thereby to make the material for the optical circuit-electrical circuit mixedly mounting substrate shown in FIG. 11(c).

As the photosensitive resin C, a varnish was used which was prepared by dissolving, in tetrahydrofuran, 35 parts by weight of "Yupilon Z" (a polycarbonate resin, having a refractive index of 1.59) manufactured by Mitsubishi Gas Chemical Co., Ltd., 20 parts by weight of methyl acrylate, 1 part by weight of benzoin ethyl ether and 0.04 parts by weight of hydroquinone. A layer of the cured photosensitive resin C having a thickness of 40 μm showed a refractive index of 1.53. When irradiated with light generated by a high-pressure mercury vapor lamp of 3 J/cm$^2$ and heated at 95° C. in vacuum for 12 hours, the resin showed a refractive index of 1.55 to 1.58 in the exposed portion and 1.585 to 1.59 in the non-exposed portion.

The material for the optical circuit-electrical circuit mixedly mounting substrate obtained as described above was cut into a square sheet having a size of 6 cm×6 cm, and the optical circuit forming layer 8 was exposed to the irradiation with light generated by a high-pressure mercury vapor lamp having output power of 3 J/cm$^2$ through a mask having 40 μm wide linear slit through which light passed being placed on and in contact with the cover film 15 (refer to FIG. 12(a)). After being left to be allowed for 1 hour, the sample was heated at 95° C. in vacuum of 267 Pa (2 Torr) for 12 hours. Through the exposure and the heat treatment as described, the refractive index of the exposed portion became lower than that of the non-irradiated portion, turning the exposed portion into a lower refractive index portion 8b and the non-irradiated portion into a higher refractive index portion 8a (refer to FIG. 12(b)).

After removing the cover film 15, then varnish of adhesive A was applied to a thickness of 40 μm on the second light permeable resin layer 9 and dried at 150° C. so as to form the adhesive layer 23. By stacking it on the printed wiring board 22 of type FR-5 via the adhesive layer 23 and pressing in vacuum at a temperature of 170° C., the optical circuit-electrical circuit mixedly mounting substrate was obtained wherein the core 26 of the optical circuit formed with the linear higher refractive index portion 8a of the optical circuit forming layer 8 (refer to FIG. 12(c) and FIG. 12(d)).

The optical circuit-electrical circuit mixedly mounting substrate obtained as described above was tested similarly to Example 1, and propagation of light was observed, proving that the optical circuit was functioning. Measurement of peel-off strength of the copper foil constituting the metal layer 13 showed a strength of 7.8 N/cm (0.8 kg/cm).

Example 14

Using a copper foil having a thickness of 35 μm ("MPGT" manufactured by Furukawa Electric Co., Ltd.) as the metal layer 202, a light permeable resin B was applied to the metal layer 202 by the roll transferring process to a thickness of 50 μm, which was then cured by heating at 100° C. for 1 hour and then at 150° C. for 1 hour thereby to form the light permeable resin layer 217. Then, a varnish of a photosensitive resin A was applied to a thickness of 80 μm on the light permeable resin 217 and heated to dry so as to form an optical circuit forming layer 201 having a thickness of 40±5 μm, over which a cover film 215 made of a transparent PET having a thickness of 25 μm was laminated by pressing with a roll, thereby to obtain the laminate structure 203 (refer to FIG. 17(a)).

The laminate structure 203 obtained as described above was used while cutting into a square sheet having a size of 6 cm×6 cm, and a photo mask was used which had 20 linear light passing slits having a width of 40 μm formed in parallel to each other at 250 μm intervals. After aligning the photo mask with the sheet using a reference mark (in a cross shape of lines each having a width of 100 μm, which had a size as a whole of 500 μm square) formed beforehand on the metal layer 202, the photo mask was placed on the cover film 215 of the laminate structure 203 and was irradiated with light generated by a high-pressure mercury vapor lamp having output power of 10 J/cm$^2$ (refer to FIG. 17(b)) Then, the V-shaped groove 221 was formed with reference to the reference mark formed on the metal layer 202 by using the rotary blade 241 having a cutting edge 40 of which apex angle was of 90° (refer to FIG. 17(c)), wherein DISCO's #5000 blade (Model No. B1E863SD5000L100MT38) was used as the rotary blade 241, and it was rotated at a speed of 30000 rpm. The rotary blade 241 cut into the laminate structure 203 from its side of the cover film 215 with its lowering speed of 0.03 mm/s up to a depth of 80 μm, followed by moving over the laminate structure 203 at a speed of 0.1 mm/s to cross all of the twenty exposed portions 201a perpendicularly to them while keeping such cutting depth, before leaving the laminate structure 203 (refer to FIG. 19(b)). The V-shaped grooves 221 thus formed showed a satisfactory surface roughness of 60 nm in terms of rms.

A silver paste containing silver particles of which diameter is not larger than 10 nm dispersed therein was dropped into the V-shaped grooves 221, heated at 120° C. for 1 hour to remove the solvent, thereby forming the deflector portions 205 with the light reflectors 208 formed on the inclined surfaces 207 of the V-shape grooves 221 (refer to FIG. 18(a)).

Then, the cover film 215 was removed, followed by developing with toluene and Clean Through (aqueous cleaning agent used as substitute for Freon, manufactured by Kao Corp.) so as to remove the non-irradiated portion, followed by washing with water and drying (refer to FIG. 17(d)).

Then, the light permeable resin B was applied to a thickness of 50 μm on the optical circuit forming layer 201 of the laminate structure 203 and cured by heating at 100° C. for 1 hour and then at 150° C. for 1 hour, thereby to form the second light permeable resin, over which a varnish of adhesive A was applied to a thickness of 40 μm and was dried at 150° C. to form the adhesive layer 214.

Using a printed wiring board 211 of type FR-5 having an electrical circuit 212 formed thereon, the board was stacked on the laminate structure 203 and pressing in vacuum at a temperature of 170° C., both members were bonded together (refer to FIG. 17(e): where the second light permeable resin layer is not shown).

After forming a reference guide and conformal mask holes having a diameter of 100 μm at the positions on the metal layer 202 where the via holes 213 were to be formed, the via holes 213 having an opening diameter of 100 μm were formed using excimer laser (refer to FIG. 17(f)). The electrical conducting portions 222 were formed in the via holes 213 by applying surface treatment with permanganate desmear followed by soft etching with sulfuric an acid-hydrogen peroxide system and panel plating (refer to FIG. 17(g)). Then, the electrical circuit 206 was formed by patterning of the metal layer 202, thereby to obtain the optical circuit-electrical circuit mixedly mounting substrate (refer to FIG. 17(h)). 1 μg of the light permeable resin A which was the same resin (thus, having the same refractive index) as the light permeable resin layer 217 was dropped onto a portion the surface of the light permeable resin layer 217 which portion was located right above the deflector portion 205 and cured by heating at 100° C. for 1 hour and then at 150° C. for 1 hour thereby to form the light permeable resin layer 216 (refer to FIG. 25(a)).

In the optical circuit-electrical circuit mixedly mounting substrate obtained as described above, the deflector portion 205 and the opening 231 having the light permeable resin 216 provided therein which opening is right above the deflector portion 204 were formed in a pair at each end of the optical waveguide 204 having a width of 40 μm formed by using the photo mask. A bare surface-light emission laser chip (which emits light having a wavelength 850 nm with an emission spread angle of ±10° and a radiation intensity of 0 dBm) and a bare PIN photodiode chip (having a light receiving area of 38 μm) were mounted in the electrical circuit 206 by flip-chip mounting using solder balls. Then, it was confirmed that light emitted by the surface-light emission laser chip was received by the PIN photodiode chip at a level of −6.8 dBm through the pair of the deflector portions 205 and the optical waveguide 204.

Example 15

Using a copper foil 35 μm thick ("MPGT" manufactured by Furukawa Electric Co., Ltd.) as the metal layer 202, a light permable resin B was applied to the metal layer 202 by the roll transferring process to a thickness of 50 μm, which was then cured by heating at 100° C. for 1 hour and then at 150° C. for 1 hour thereby to form the light permeable resin layer 217. Then, a varnish of a photosensitive resin B was applied to a thickness of 100 μm on the light permeable resin 217 and heated to dry so as to form the optical circuit forming layer 201 having a thickness of 50±5 μm, over which a cover film 215 made of a transparent PET having thickness of 25 μm was laminated by pressing with a roll, thereby to obtain the stacked structure 203 (refer to FIG. 26(a)).

The laminate structure 203 obtained as described above was cut into a square sheet having a size of 6 cm×6 cm, and a photo mask was used which had 20 linear light blocking regions having a width of 40 μm were formed in parallel to each other at 250 μm intervals. After aligning the photo mask using the reference mark formed beforehand on the metal layer 202, the photo mask was placed on the cover film 215 of the laminate structure 203 and was irradiated with light generated by a high-pressure mercury vapor lamp having output power of 10 J/cm² (refer to FIG. 26(b)). The exposure in this way resulted in that the refractive index of the exposed portion 201a was lower than that of the non-exposed portion 201b.

Then, the V-shaped groove 221 was formed with reference to the reference mark formed on the metal layer 202 by using the rotary blade 241 having a cutting edge 40 of which apex angle was 90° (refer to FIG. 26(c)), wherein the formation of the V-shaped groove 221 was carried out by cutting the laminate structure with a first rotary blade 241, and cutting again the same part of the laminate structure with a second rotary blade 241. DISCO's #4000 blade (Model No. B1E863SD4000L100 MT38) was used as first the rotary blade 241, and it was rotated at a speed of 30000 rpm. The first rotary blade 241 cut into the laminate structure 203 from its side of the cover film 215 with its lowering speed of 0.03 mm/s up to a depth of 90 μm and, followed by moving over the laminate structure 203 at a speed of 0.1 mm/s to cross all of the twenty exposed portions 201a perpendicularly to them while maintaining such cutting depth, before leaving the laminate structure 203. Then, the same part was cut with the second rotary blade 241, which was DISCO's #6000 blade (Model No. B1E863SD6000L100 MT38), under the same conditions. The V-shaped groove 221 thus formed did not show strain distortion caused on its cut surface by insufficient cutting force of the blade having small abrasive particles, and satisfactory surface roughness of 50 nm in rms was achieved.

A gold film having a thickness of 2000 Å was deposited on the V-shaped groove 221 by the electron beam deposition at a rate of 8 Å/sec., thereby forming the light reflector 208 on the inclined surface 207 of the V-shaped groove 221 to form a deflector portion 205 (FIG. 18(a)). Then, the cover film 215 was removed (refer to FIG. 26(d)).

Then, two sheets of prepreg sheets 232 placed one on another were interposed between the laminate structure 203 and the printed wiring board 211 of type FR-5 having the electrical circuit 212 formed thereon, which were bonded together with the prepreg 232 as the adhesive 214 by heating at a temperature of 150° C. and applying pressure of 0.98 KPa (10 kgf/cm²) for 30 minutes (refer to FIG. 26(e)).

For the prepreg, an epoxy prepreg having a resin content of 56% by weight was used which produced was prepared by impregnating a glass cloth having a thickness of 0.1 mm with a varnish F prepared by dissolving 73.6 parts by weight of "DER-514" (an epoxy resin) manufactured by Dow Chemical, 18.4 parts by weight of "Epicron N613" (an epoxy resin) manufactured by Dainippon Ink & Chemicals, Inc., 8 parts by weight of "CTBN #13" (a rubber material) manufactured by Goodritte, 2.4 parts by weight of dicyandiamide and 0.05 parts by weight of "2E4MZ" (2-ethyl-4-methylimidazole) manufactured by Shikoku Kasei in a mixed solution of methyl ethyl ketone and dimethylformamide. The prepreg shows a refractive index of 1.585 when cured.

Then, the optical circuit-electrical circuit mixedly mounting substrate was obtained similarly to Example 14 (refer to FIG. 26(f) to FIG. 26(i)), wherein the opening 231 was formed by etching a portion of the metal foil 202 which portion was located right above the deflector portion 205, and water-repellent treatment was applied to the surface and side face of the metal foil 202 around the opening 231 by dropping 1 μg of CYTOP CTL-107M manufactured by Asahi Glass Co., Ltd. diluted (100 times) with Fluorinert FC-77 manufactured by Sumitomo 3M. Then, 3 μg of Aronix UV-3100 (a photocurable acrylic resin) manufactured by TOAGOSEI CO., LTD. having a refractive index which is almost the same as that of the light permeable resin 217 was dropped on the surface of the light permeable resin layer 217 exposed at the bottom of the opening 231, and irradiated with light generated by a high-pressure mercury vapor lamp having output power of 5 J/cm$^2$ so as to cure and form the light permeable resin layer 216a in the form of a convex lens (refer to FIG. 25(c)).

In the optical circuit-electrical circuit mixedly mounting substrate obtained as described above, a bare surface-light emission laser chip and a bare PIN photodiode chip were mounted similarly to Example 14. It was confirmed that light emitted by the surface-light emission laser chip was received by the PIN photodiode chip at a level of −4.5 dBm through the pair of the deflector portions 205 and the optical waveguide 204. Forming the convex lens from the light permeable resin 216 improved the efficiency of coupling light with the optical waveguide 204 by 1 to 2 dB.

Example 16

A double-sided adhesive tape 34 ("4591HL" with weak adhesiveness on one side, manufactured by Sumitomo 3M) was attached to a supporting member 33 made of a stainless steel plate having a thickness of 100 μm on the strong adhesiveness side. A copper foil having a thickness of 35 μm thick ("MPGT" manufactured by Furukawa Electric Co., Ltd.) used as the metal layer 202 was attached to the supporting member with a double-sided adhesive tape. The metal layer 202 was coated with the light permeable resin B to form a film having a thickness of 50 μm by the roll transfer process, which was heated at 100° C. for 1 hour and then at 150° C. for 1 hour thereby to form the light permeable resin layer 217. Then, the light permeable resin layer 217 was coated with the varnish of photosensitive resin B to form a film having a thickness of 100 μm by the roll transfer process and heated to dry so as to form the optical circuit forming layer 201 having a thickness of 50±5 μm.

Then, the light permeable resin B was applied on the the optical circuit forming layer 201 to form a film having a thickness of 50 μm by the roll transfer process, which was heated to cure at 100° C. for 1 hour and then at 150° C. for 1 hour thereby to form the second light permeable resin layer 223, over which a cover film 215 made of a transparent PET film 25 μm thick was laminated by pressing with a roll, thereby to obtain the laminate structure 203 (refer to FIG. 23(a) wherein the supporting member is not shown).

The laminate structure 203 obtained as described above was cut into a square sheet having a size of 6 cm×6 cm, and a photo mask was used which had twenty linear light blocking regions having a width of 40 μm formed in parallel to each other at 250 μm intervals. After aligning the photo mask with the sheet using a reference mark formed beforehand on the metal layer 202, the photo mask was placed on the cover film 215 of the laminate structure 203 and was irradiated with light generated by a high-pressure mercury vapor lamp having output power of 10 J/cm$^2$ (refer to FIG. 23(b)). The exposure resulted in that the refractive index of the exposed portion 201a was lower than that of the non-exposed portion 201b.

Then, an array 228 of a fine periodical structure was formed in the non-exposed portion 201b that is to become the core 204a of the optical waveguide 204 by converging irradiation with short pulse laser with reference to the reference mark formed on the metal layer 202, thereby forming a grating coupler. The used laser beam had a wavelength of 800 nm with a pulse width of 150 fs, a pulse energy of 50 nJ and a repetition rate of 1 kHz, and the beam was collected by an oil-immersed object lens having aperture number of 1.25 and directed while converged through the cover film 215 into the non-exposed portion 201b of the optical circuit forming layer 201. The laser beam was scanned linearly at a moving speed of 400 μm/s with a stroke of 40 μm so as to draw 200 lines at a pitch of 0.57 μm, so that the deflector portion 205 was formed from the array 28 of the fine periodical structure (refer to FIG. 24(b)).

Then, a varnish of adhesive A was applied to a thickness of 40 μm on the optical circuit forming layer 201 of the laminate structure 203 and was dried at 150° C. so as to form the adhesive layer 214. By stacking the stacked structure 203 on the printed wiring board 211 provided with an electric circuit 212 of type FR-5 and pressing them in vacuum at a temperature of 170° C., so as to bond them together (refer to FIG. 23(e)).

Then, the optical circuit-electrical circuit mixedly mounting substrate was obtained similarly to Example 14 (refer to FIG. 23(f) to FIG. 23(h)). 1 μg of the light permeable resin A of the same resin (thus, having the same refractive index) as the light permeable resin layer 217 was dropped onto a portion of the surface of the light permeable resin layer 217 which portion was located right above the deflector portion 205 and cured by heating at 100° C. for 1 hour and then at 150° C. for 1 hour thereby to form the light permeable resin layer 216 (refer to FIG. 25(a)).

In the optical circuit-electrical circuit mixedly mounting substrate obtained as described above, a bare surface-light emission laser chip and a bare PIN photodiode chip were mounted thereon similarly to Example 14, and it was confirmed that light emitted by the surface-light emission laser chip was received through the pair of the deflector section 205 and the optical waveguide 204 by the PIN photodiode chip at a level of −15 dBm.

Example 17

A double-sided adhesive tape 34 ("4591HL" with weak adhesiveness on one side, manufactured by Sumitomo 3M) was attached to a supporting member 33 made of a stainless steel plate having a thickness of 100 μm on the strong adhesiveness side. A copper foil a thickness of 35 μm ("MPGT" manufactured by Furukawa Electric Co., Ltd.) used as the metal layer 202 was attached to the supporting member 33 with a double-sided adhesive tape 34. After coating the metal layer 202 with the light transmitting resin B to form a film a thickness of 50 μm by the roll transfer process, which was heated at 100° C. for 1 hour and then at 150° C. for 1 hour thereby to form the light permeable resin layer 217. Then, the light permeable resin layer 217 was coated with the varnish of photosensitive resin C to form a film a thickness of 40 μm and heated to dry at the room temperature in a nitrogen atmosphere so as to form the optical circuit forming layer 201, over which the cover film 215 made of a transparent PET film a thickness of 25 μm was laminated by pressing with a roll, thereby to obtain the laminate structure 203 (refer to FIG. 27(a)).

The laminate structure 203 obtained as described above was cut into a square sheet having a size of 6 cm×6 cm, and a photo mask was used which had twenty linear light blocking regions having a width of 40 μm formed in parallel to each other at 250 μm intervals. After aligning the photo mask with the sheet using a reference mark formed beforehand on the metal layer 202, the photo mask was placed on the cover film 215 of the laminate structure 203 and was irradiated with light generated by a high-pressure mercury vapor lamp having output power of 3 J/cm$^2$ in a nitrogen atmosphere. After being left to stand for 1 hour, the laminate structure was heated at 95° C. in vacuum of 267 Pa (2 Torr) for 12 hours (refer to FIG. 27(b)). Through the exposure as described above, the refractive index of the region corresponding to the light transmittable portion of the photo mask (the exposed portion 201a) increased, but methyl methacrylate monomer in the non-exposed portion 201b diffused outwardly by the subsequent heating, so that the refractive index of the non-exposed portion 201b became higher than that of the exposed portion 201a.

Then, the cover film 215 was removed (refer to FIG. 27(c)). A press die 226 having fine projections 225 periodically arranged at pitch 0.57 μm, a projection/recess ratio of 50%, a depth of recess 1.5 μm, the number of protruding lines of 200 and a width of protruding line of 40 μm was used which die was produced by electroforming using a silicon master die followed by surface release treatment by means of a fluorinated resin coating. The press die 226 heated to 170° C. was pressed against the non-exposed portion 201b that was to become the core 204a of the optical waveguide 204 with reference to the reference mark on the metal layer 202, and was gradually cooled in such pressing condition. After cooling, the die was removed thereby forming the deflector portion 205 having the array 227 by transferring the periodical fine structure of a grating (refer to FIG. 27(d)).

Then, the optical circuit forming layer 201 of the stacked structure 203 was coated with the light permeable resin B to form a film having a thickness of 50 μm, and heated at 100° C. for 1 hour and then at 150° C. for 1 hour thereby to form a third the light permeable resin layer 235, over which a varnish of adhesive A was applied to a thickness of 40 μm and dried at 150° C. so as to form the adhesive layer 214. By stacking the laminate structure 203 on the printed wiring board 211 of type FR-5 having the electrical circuit 212 and pressing them in vacuum at a temperature of 170° C., both members were bonded together (refer to FIG. 27(e)).

Then, with the subsequent steps being carried out similarly to Example 14, the optical circuit-electrical circuit mixedly mounting substrate was obtained (refer to FIG. 27(f) to FIG. 27(i)). 1 μg of the light permeable resin A of the same resin (thus, having the same refractive index) as the light permeable resin layer 217 was dropped onto a portion of the surface right above the deflector section 205 and cured by heating at 100° C. for 1 hour and then at 150° C. for 1 hour thereby to form the light permeable resin layer 216 (refer to FIG. 25(a)).

In the optical circuit-electrical circuit mixedly mounting substrate obtained as described above, a bare surface-light emission laser chip and a bare PIN photodiode chip were mounted thereon similarly to Example 14, and it was confirmed that light emitted by the surface-light emission laser chip was received through the pair of the deflector section 205 and the optical waveguide 204 by the PIN photodiode chip at a level of −21 dBm.

Example 18

Using a copper foil 35 μm thick ("MPGT" manufactured by Furukawa Electric Co., Ltd.) as the metal layer 202, a light permeable resin B was applied to the metal layer 202 by the roll transferring process to a thickness of 50 μm, and then cured by heating at 100° C. for 1 hour and then at 150° C. for 1 hour thereby to form the light permeable resin layer 217. Then, a varnish of a photosensitive resin A was applied to a thickness of 80 μm on the light permeable resin layer 217 and heated to dry so as to form an optical circuit forming layer 201 having a thickness of 40±5 μm, over which a cover film 215 made of a transparent polypropylene having a thickness of 20 μm was laminated by pressing with a roll, thereby to obtain the laminate structure 203 (refer to FIG. 17(a)). The laminate structure 203 was used while cut into a square having a size of 6 cm×6 cm.

A silver paste containing silver particles of which diameter was not larger than 100 nm dispersed therein was molded into a reflector 210 beforehand which had an equilateral triangular prism form having a height of 50 μm and an apex angle of 90° and also having a 100 μm square bottom (i.e. an triangular prism form fell sidelong having an right-angled equilateral triangle as each side surface and having a right-angle portion as its ridge portion). The ridge portion of the reflector 210 was pressed into the laminate structure 203 with reference to the reference mark 203 on the metal layer 202 so that the reflector 210 was penetrated the cover film 215 and buried into the optical circuit forming layer 201, thereby forming the deflector portion 205 (refer to FIG. 21(a)).

Then, a photo mask having twenty linear light transmittable slits having a width of 40 μm formed in parallel to each other at 250 μm intervals was aligned with the laminate structure while using the reference mark formed beforehand on the metal layer 202, and the photo mask was placed on the cover film 215 of the laminate structure 203 and was irradiated with light generated by a high-pressure mercury vapor lamp having output power of 10 J/cm$^2$ (refer to FIG. 17(b)).

Then, the cover film 215 was removed, followed by developing with toluene and Clean Through (aqueous cleaning agent used as substitute for Freon, manufactured by Kao Corp.) so as to remove the non-irradiated portion, followed by washing with water and drying (refer to FIG. 17(d)).

With the subsequent steps being carried out similarly to Example 14, the optical circuit-electrical circuit mixedly mounting substrate was obtained (refer to FIG. 17(e) to FIG. 17(h)). A layer of a light permeable resin 216 of the same resin (thus, having the same refractive index) as the light permeable resin layer 217 was formed on a portion of the surface right above the deflector portion 205 (refer to FIG. 25(a)). In the optical circuit-electrical circuit mixedly mounting substrate obtained as described above, a bare surface-light emission laser chip and a bare PIN photodiode chip were mounted thereon similarly to Example 14, and it was confirmed that light emitted by the surface-light emission laser chip was received through the pair of the deflector section 205 and the optical waveguide 204 by the PIN photodiode chip at a level of −7.0 dBm.

Example 19

Using a copper foil 35 μm thick ("MPGT" manufactured by Furukawa Electric Co., Ltd.) as the metal layer 202, the light permeable resin B was applied to the metal layer 202 by the roll transferring process to a thickness of 50 μm, which was then cured by heating at 100° C. for 1 hour and then at 150° C. for 1 hour thereby to form the light permeable resin layer 217. Then, the photosensitive resin C was applied to a thickness of 40 μm on the light permeable resin layer 217 and heated at a room temperature in a nitrogen atmosphere to dry so as to form an optical circuit forming layer 201, over which a cover film 215 made of a transparent PET having a thickness of 25 μm was laminated by pressing with a roll, thereby to obtain the laminate structure 203 (refer to FIG. 28(a)).

The laminate structure 203 obtained as described above was cut into a square sheet having a size of 6 cm×6 cm, and a photo mask was used which had twenty linear light blocking regions having a width of 40 μm formed in parallel to each other at 250 μm intervals. After aligning the sheet with the photo mask using a reference mark formed beforehand on the metal layer 202, the photo mask was placed on the cover film 215 of the laminate structure 203 and was irradiated with light generated by a high-pressure mercury vapor lamp having output power of 3 J/cm² in a nitrogen atmosphere. After being left to stand still for 1 hour, the laminate structure was heated at 95° C. in vacuum of 267 Pa (2 Torr) for 12 hours (refer to FIG. 28(b)). Through the exposure as described above, the refractive index of the region corresponding to the light transmittable portion of the photo mask (the exposed portion 201a) increased, but methyl methacrylate monomer in the non-exposed portion 201b diffused outwardly by the subsequent heating, so that the refractive index of the non-exposed portion 201b became higher than that of the exposed portion 201a.

Using a press die 236 having the shape of triangular roof having apex angle of 90° (i.e. an equilateral triangular prism form having a height of 50 μm and an apex angle of 90° with a bottom surface of 100 μm square), it was pressed into the laminate structure 203 with its apex ahead thereby to form the V-shaped groove 221 (refer to FIG. 28(c)). In order to effectively transfer the shape to the V-shaped groove 221 by the press die 36, the press die was heated to 170° C., and the die was released after gradually cooling down. In order to ensure smooth release of the die, surface release treatment was applied to the surface of the press die 36 by means of a fluorinated resin coating. A silver paste containing silver particles of which diameter was not larger than 10 nm dispersed therein was dropped by a dispenser onto the V-shaped grooves 221, heated at 120° C. for 1 hour to remove the solvent and cure, thereby forming the deflector portion 205 having the light reflector 208 formed on the inclined surface 207 of the V-shaped groove 221 (refer to FIG. 18(a)). Then the cover 215 was removed (refer to FIG. 28(d)).

The optical circuit forming layer 201 of the laminate structure 203 was coated with a light transmitting resin B to form a film having a thickness of 50 μm, and heated at 100° C. for 1 hour and then at 150° C. for 1 hour thereby to form the third light permeable resin layer 235, over which a varnish of adhesive A was applied to a thickness of 40 μm and dried at 150° C. so as to form the adhesive layer 214 (refer to FIG. 28(e)). By stacking the stacked structure 203 on the printed wiring board 211 of type FR-5 having the electrical circuit 212 provided thereon and pressing them in vacuum at a temperature of 170° C., they were bonded together (refer to FIG. 28(f)).

With the subsequent steps being carried out similarly to Example 14, the optical circuit-electrical circuit mixedly mounting substrate was obtained (refer to FIG. 28(g) to FIG. 28(i)). 1 μg of a light permeable resin A which was the same (thus, having the same refractive index) as the light permeable resin layer 217 was dropped onto a portion of the surface right above the deflector portion 205 and cured by heating at 100° C. for 1 hour and then at 150° C. for 1 hour thereby to form the light permeable resin layer 216 (refer to FIG. 28(j)).

In the optical circuit-electrical circuit mixedly mounting substrate obtained as described above, a bare surface-light emission laser chip and a bare PIN photodiode chip were mounted thereon similarly to Example 14, and it was confirmed that light emitted by the surface-light emission laser chip was received through the pair of the deflector section 205 and the optical waveguide 204 by the PIN photodiode chip at a level of −7.1 dBm.

Example 20

Using a copper foil having a thickness of 35 μm thick ("MPGT" manufactured by Furukawa Electric Co., Ltd.) as the metal layer 202, the light permeable resin B was applied to the metal layer 202 by the roll transferring process to a thickness of 50 μm, which was then cured by heating at 100° C. for 1 hour and then at 150° C. for 1 hour thereby to form the light permeable resin layer 217. Then, the photosensitive resin C was applied to a thickness of 40 μm on the light permeable resin layer 217 and dried at a room temperature in nitrogen atmosphere so as to form the optical circuit forming layer 201, over which the cover film 215 made of a transparent PET having a thickness of 25 μm was laminated by pressing with a roll, thereby to obtain the laminate structure 203 (refer to FIG. 29(a)).

The laminate structure 203 obtained as described above was cut into a square sheet having a size of 6 cm×6 cm, and a photo mask was used which had twenty linear light blocking regions having a width of 40 formed in parallel to each other at 250 μm intervals. After aligning the photo mask with the sheet using a reference mark formed beforehand on the metal layer 202, the photo mask was placed on the cover film 215 of the laminate structure 203 and irradiated with light generated by a high-pressure mercury vapor lamp having output power of 3 J/cm² in a nitrogen atmosphere. After being left to stand still for 1 hour, the structure was heated at 95° C. in vacuum of 267 Pa (2 Torr) for 12 hours (refer to FIG. 29(b)). Through the exposure as described above, the refractive index of the region corresponding to the light transmittable portion of the photo mask (the exposed portion 201a) increased, but methyl methacrylate monomer in the non-exposed portion 201b diffused outwardly by the subsequent heating, so that the refractive index of the non-exposed portion 201b became higher than that of the exposed portion 201a.

Then, the V-shaped groove 221 was formed with reference to the reference mark formed on the metal layer 202 by using a rotary blade 241 having a cutting edge of which apex angle was 90° similarly to Example 14 (refer to FIG. 29(c)). Then, a gold film having a thickness of 2000 Å was deposited on the inclined surface 207 of the V-shaped groove 221 by the electron beam deposition at a rate of 8 Å/sec., thereby forming the light reflector 208 on the inclined surface 207 of the V-shaped groove 221 so as to form the deflector portion 205 (refer to FIG. 18(a)). Then, the cover film 215 was removed (refer to FIG. 29(d)).

Then, the optical circuit forming layer 201 of the laminate structure 203 was coated with a light transmitting resin B to form a film having a thickness of 50 μm, and heated at 100° C. for 1 hour and then at 150° C. for 1 hour thereby to form the third the light permeable resin layer 235, over which a varnish of adhesive A was applied to a thickness of 40 μm and dried at 150° C. so as to form the adhesive layer 214 (refer to FIG. 29(e)). By stacking the laminate structure 203 on the printed wiring board 211 of type FR-5 having the electrical circuit 212 provided thereon and pressing them in vacuum at a temperature of 170° C., they were bonded together (refer to FIG. 29(f)).

With the subsequent steps being carried out similarly to Example 14, the optical circuit-electrical circuit mixedly mounting substrate was obtained (refer to FIG. 29(g) to FIG. 29(i)). 1 μg of the light transmitting resin A which was the same (thus, having the same refractive index) as the light permeable resin layer 217 was dropped onto a portion of the surface right above the deflector section 205 and cured by heating at 100° C. for 1 hour and then at 150° C. for 1 hour thereby to form the light permeable resin layer 216 (refer to FIG. 29(j)).

In the optical circuit-electrical circuit mixedly mounting substrate obtained as described above, a bare surface-light emission laser chip and a bare PIN photodiode chip were mounted thereon similarly to Example 14, and it was confirmed that light emitted by the surface-light emission laser chip was received through the pair of the deflector section 205 and the optical waveguide 204 by the PIN photodiode chip at a level of −6.5 dBm.

Example 21

Using a copper foil 35 μm thick ("MPGT" manufactured by Furukawa Electric Co., Ltd.) as the metal layer 202, the varnish F described above was applied to the metal layer 202 and dried to form a flame resistant adhesive layer having thickness of 50 μm, over which the light transmitting resin B was applied by the roll transfer process to form a film having a thickness of 50 μm, which was then cured by heating at 100° C. for 1 hour and then at 150° C. for 1 hour thereby to form the light permeable resin layer 217. Then, a cover film 215 made of a transparent PET having a thickness of 25 μm was coated with the varnish of photosensitive resin A to a thickness of 100 μm, which was heated to dry thereby to form the optical circuit forming layer 201 having a thickness of 50±5 μm The light permeable resin layer 217 and the optical circuit forming layer 201 were stacked one on another to laminate them, and thereby the laminated structure 203 was obtained (refer to FIG. 17(a)).

The laminate structure 203 obtained as described above was cut into a square sheet having a size of 6 cm×6 cm, and a photo mask was used which had twenty linear light transmittable slits having a width of 40 μm formed in parallel to each other at 250 μm intervals. After aligning the photo mask with the sheet using a reference mark (in a cross shape of lines each having a width of 100 μm, which shape had a size as a whole of 500 μm square) formed beforehand on the metal layer 202, the photo mask was placed on the cover film 215 of the laminate structure 203 and irradiated with light generated by a high-pressure mercury vapor lamp having output power of 10 J/cm² (refer to FIG. 17(b)).

Then, the V-shaped groove 221 was formed with reference to the reference mark formed on the metal layer 202 by using a blade having a cutting edge of which apex angle was 90° similarly to Example 14 (refer to FIG. 17(c)). Then, a gold film having a thickness of 2000 Å was deposited on the inclined surface 207 of the V-shaped groove 221 by the electron beam deposition at a rate of 8 Å/sec., thereby forming the light reflector 208 on the inclined surface 207 of the V-shaped groove 221 so as to make the deflector section 205 (refer to FIG. 18(a)). Then, the cover film 215 was peeled of to be removed (refer to FIG. 17(d)).

With the subsequent steps being carried out similarly to Example 14, the optical circuit-electrical circuit mixedly mounting substrate was obtained (refer to FIG. 17(e) to FIG. 17(h)). Also, after applying the water-repellent treatment to a portion of the surface located right above the deflector portion 205 similarly to Example 2, 3 μg of "Aronix UV-3100" (a photocurable acrylic resin) manufactured by TOAGOSEI CO., LTD. was dropped onto such portion of the surface and irradiated with light generated by a high-pressure mercury vapor lamp having output power of 5 J/cm² so as to cure and form the light permeable resin layer 216 in the form of a convex lens from (refer to FIG. 25(b)). In the optical circuit-electrical circuit mixedly mounting substrate obtained as described above, a bare surface-light emission laser chip and a bare PIN photodiode chip were mounted similarly to Example 14, and it was confirmed that light emitted by the surface-light emission laser chip was received through the pair of the deflector section 205 and the optical waveguide 204 by the PIN photodiode chip at a level of −4.2 dBm.

Example 22

Using a copper foil 35 μm thick ("MPGT" manufactured by Furukawa Electric Co., Ltd.) as the metal layer 202, the light transmitting resin B was applied to the metal layer 202 by the roll transferring process to a thickness of 50 μm, which was then cured by heating at 100° C. for 1 hour and then at 150° C. for 1 hour thereby to form the light permeable resin layer 217. Then, a varnish of the photosensitive resin A was applied to a thickness of 80 μm on the light transmitting resin 217 and heated to dry so as to form the optical circuit forming layer 201 having a thickness of 40±5 μm, over which a cover film 215 made of a transparent PET having a thickness of 25 μm was laminated by pressing with a roll, thereby to obtain the laminated structure 203 (refer to FIG. 32(a)).

The laminated structure 203 obtained as described above was cut into a square sheet having a size of 6 cm×6 cm, and a photo mask was used which had twenty linear light transmittable slits having a width of 40 μm formed in parallel to each other at 250 μm intervals. After aligning the sheet with the photo mask using a reference mark (in a cross shape of lines each having a width of 100 μm, which shape had a size as a whole of 500 μm×500 μm) formed beforehand on the metal layer 202, the photo mask was placed on the cover film 215 of the laminate structure 203 and the surface of the cover film 215 of the laminate structure 203 was irradiated through the photo mask with light generated by a high-pressure mercury vapor lamp having output power of 10 J/cm² (refer to FIG. 32(b)).

Figure 32:
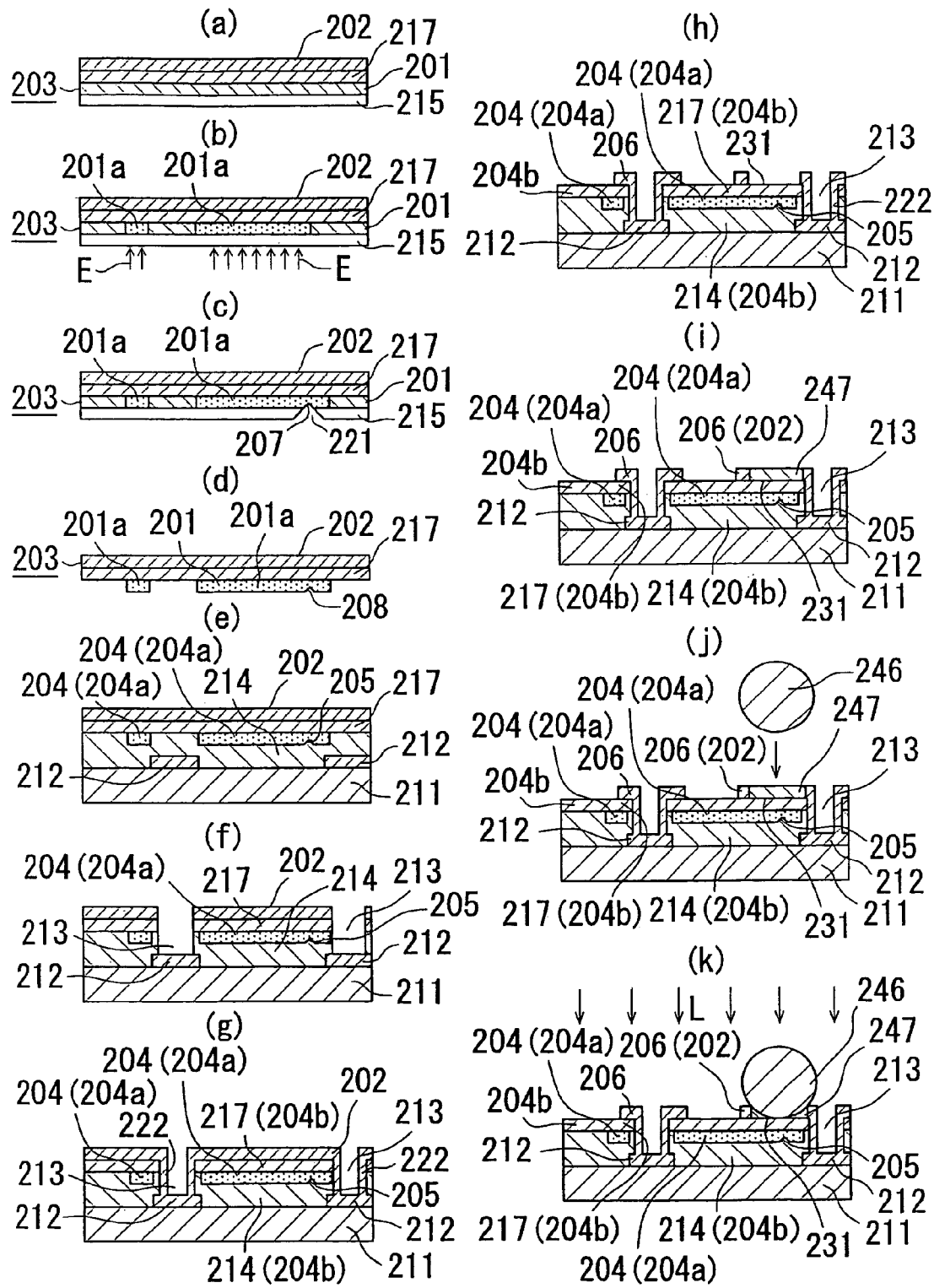

Then the V-shaped groove 21 was formed with reference to the reference mark formed on the metal layer 202 by using the rotary blade 241 having a cutting edge 240 of which cutting edge had an apex angle of 90° (refer to FIG. 32(c)). DISCO's #5000 blade (Model No. B1E863SD5000L100MT38) was used as the rotary blade 241, and it was rotated at a speed of 30000 rpm. The rotary blade 241 cut into the laminate structure 203 from its side of the cover film 215 with its lowering speed of 0.03 mm/s up to a depth of 45 μm, followed by moving over the laminate structure 203 at a speed of 0.1 mm/s to cross all of the twenty exposed portions 201a perpendicularly to them while keeping such cutting depth, before leaving the laminate structure 203 (refer to FIG. 19(b)). The V-shaped grooves 221 thus formed showed a satisfactory surface roughness of 60 nm in terms of rms.

A silver paste containing silver particles of which diameter is not larger than 10 nm dispersed therein was dropped into the V-shaped grooves 221, heated at 120° C. for 1 hour to remove the solvent, thereby forming the deflector portions 205 with the light reflectors 208 formed on the inclined surfaces 207 of the V-shape grooves 221 (refer to FIG. 18(a)). In the V-shaped groove 221, a portion of the exposed portion 1a along its thickness direction was left without the paste, so that a half mirror was formed that allowed a half of light propagating in the core 204a of the optical waveguide 204 formed by the exposed portion to emerge from the deflector portion 205 while another half of the light to pass.

Then, the cover film 215 was removed, followed by developing with toluene and Clean Through (aqueous cleaning agent used as substitute for Freon, manufactured by Kao Corp.) so as to remove the non-irradiated portion, followed by washing with water and drying (refer to FIG. 32(d)).

Then, the light permeable resin B was applied to a thickness of 50 μm on the optical circuit forming layer 201 of the laminate structure 203 and cured by heating at 100° C. for 1 hour and then at 150° C. for 1 hour, thereby to form the third light permeable resin, over which a varnish of adhesive A was applied to a thickness of 40 μm and dried at 150° C. to form the adhesive layer 214.

Using a printed wiring board 211 of type FR-5 having an electrical circuit 212 formed thereon, the board 211 was stacked on the laminate structure 203 and they were pressed in vacuum at a temperature of 170° C., so that both members were bonded together (refer to FIG. 32(e) in which the third light permeable resin layer is not shown).

After forming a reference guide and conformal mask holes having a diameter of 100 μm at the positions on the metal layer 202 where the via holes 213 were to be formed, the via holes 213 having an opening diameter of 100 μm were formed using excimer laser (refer to FIG. 32(f)). The electrical conducting portions 222 were formed in the via holes 213 by applying surface treatment with permanganate desmear followed by soft etching with sulfuric an acid-hydrogen peroxide system and panel plating (refer to FIG. 32(g)). Then, the electrical circuit 206 was formed by patterning of the metal layer 202, thereby to obtain the optical circuit-electrical circuit mixedly mounting substrate (refer to FIG. 32(h)).

Then, 2 μg of "Aronix UV-3100" (a photocurable acrylic resin, having a viscosity 3400 mPa·s, and a refractive index of 1.52) manufactured by TOAGOSEI CO., LTD. having a refractive index) of which refractive index was almost comparable to that of the light permeable resin layer 217 was dropped into the opening 231 having diameter of 255 μm which was formed in a portion of the surface right above the deflector portion 205 simultaneously with the above patterning of the electrical circuit 206, so that the opening 231 was filled with the light permeable resin 247 (refer to FIG. 32(i)). Then, a lens body 246 of a ball lens (material: BK7, refractive index: 1.51) was placed on the light permeable resin 247 (refer to FIG. 32(j)) and "Aronix UV-3100" was cured by the irradiation over the entire surface thereof with light generated by a high-pressure mercury vapor lamp having an output power of 5 J/cm², thereby attaching the lens 246 (refer to FIG. 32(k)).

In the optical circuit-electrical circuit mixedly mounting substrate obtained as described above, a surface-light emission laser chip (mounted in a lens-fitted package) and a bare PIN photodiode chip were mounted similarly to Example 14, and it was confirmed that light emitted by the surface-light emission laser chip was dividedly received through the pair of the deflector section 205 provided with the lens 246 and the optical waveguide 204 by the PIN photodiode chip at a level of −7.2 dBm.

Example 23

Using a copper foil 35 μm thick ("MPGT" manufactured by Furukawa Electric Co., Ltd.) as the metal layer 202, the light transmitting resin B was applied to the metal layer 202 by the roll transferring process to a thickness of 50 μm, which was then cured by heating at 100° C. for 1 hour and then at 150° C. for 1 hour thereby to form the light permeable resin layer 217. Then, the varnish of photosensitive resin A was applied to a thickness of 80 μm on the light permeable resin layer 217 and heated to dry so as to form the optical circuit forming layer 201 having a thickness of 40±5 μm over which a cover film 215 made of a transparent PET having a thickness of 25 μm was laminated by pressing with a roll, thereby to obtain the laminate structure 203 (FIG. 17(a)). The refractive index of the photosensitive resin A after curing was 1.53 as already mentioned.

The laminate structure 203 made as described above was cut into a square sheet having a size of 6 cm×6 cm, and a photo mask was used which had twenty linear light transmittable slits having a width of 40 μm formed in parallel to each other at 250 μm intervals, as well as a light transmittable region for forming a reference mark having a cross shape of lines each having a width of 100 μm, which shape had a size as a whole of 500 μm×500 μm. After aligning the laminate with the photo mask so that all of the light transmittable slits as well as the light transmittable region for forming the reference mark were located in the area of the laminate structure 203, the photo mask was placed on the cover film 215 of the laminate structure 203, and the cover film 215 of the laminated structure 203 was irradiated through the photo mask with light generated by a high-pressure mercury vapor lamp having an output power of 10 J/cm² (refer to FIG. 17(b)). Thus, the core 204a of the optical waveguide 204 and the reference mark (not shown) were formed in the optical circuit forming layer 201.

Then, the V-shaped groove 221 was formed with reference to the reference mark that was formed in the optical circuit forming layer 201 by using a rotary blade 241 having a cutting edge 240 of which cutting edge had an apex angle of 90° (refer to FIG. 17(c)). DISCO's #5000 blade (Model No. B1E863 SD5000L100MT38) was used as the rotary blade 241, and it was rotated at a speed of 30000 rpm. The rotary blade 241 cut into the laminate structure 203 from its side of the cover film 215 with its lowering speed of 0.03 mm/s up to a depth of 80 μm, followed by moving over the laminate structure 203 at a speed of 0.1 mm/s to cross all of the twenty exposed portions 201a perpendicularly to them while keeping such cutting depth, before leaving the laminate structure 203 (refer to FIG. 19(b)). The V-shaped grooves 221 thus formed showed a satisfactory surface roughness of 60 nm in terms of rms. Then, a silver paste containing silver particles not larger than 10 nm dispersed therein was dropped onto the V-shaped grooves 221, heated at 120° C. for 1 hour to remove the solvent, thereby forming the deflector section 205 having the light reflector 208 formed on the inclined surface 207 of the V-shaped groove 221 (refer to FIG. 18(a)).

Then, the cover film 215 was peeled off to be removed, and the non-irradiated portion was removed by developing with toluene and Clean Through (aqueous cleaning agent used as substitute for Freon, manufactured by Kao Corp.), followed by washing with water and drying (refer to FIG. 17(d)).

Then, the optical circuit forming layer 201 of the laminate structure 203 was coated with the light transmitting resin B to form a film having a thickness of 50 µm, and heated at 100° C. for 1 hour and then at 150° C. for 1 hour thereby to form the second the light permeable resin layer, over which a varnish of adhesive A was applied to a thickness of 40 µm and dried at 150° C. so as to form the adhesive layer 214.

By stacking the stacked structure 203 on the printed wiring board 211 of type FR-5 having the electrical circuit 212 provided thereon and pressing them in vacuum at a temperature of 170° C., both members were bonded (refer to FIG. 17(e) wherein the second light permeable resin layer is not shown).

Then, the metal layer 202 was selectively etched near the above described reference mark formed in the optical circuit forming layer 201 so as to form an opening having a diameter of 1.0 mm so that the reference mark could be recognized from the side of the metal layer 202, and the following steps were carried out while making reference to this reference mark. That is, after forming a reference guide and conformal mask holes having a diameter of 100 µm at the positions on the metal layer 202 where the via holes 213 were to be formed, the via holes 213 having an opening diameter of 100 µm were formed using excimer laser (refer to FIG. 17(f)). Then, the electrical conducting portions 222 were formed in the via holes 213 by applying surface treatment with permanganate desmear followed by soft etching with sulfuric an acid-hydrogen peroxide system and panel plating (refer to FIG. 17(g)). Then, the electrical circuit 206 was formed by patterning of the metal layer 202, thereby to obtain the optical circuit-electrical circuit mixedly mounting substrate (refer to FIG. 17(h)). 1 µg of the light permeable resin A which was the same resin (thus, having the same refractive index) as the light permeable resin layer 217 was dropped onto a portion the surface of the light permeable resin layer 217 which portion was located right above the deflector portion 205 and cured by heating at 100° C. for 1 hour and then at 150° C. for 1 hour thereby to form the light permeable resin layer 216 (refer to FIG. 25(a)).

In the optical circuit-electrical circuit mixedly mounting substrate obtained as described above, the deflector portion 205 and the opening 231 having the light permeable resin 216 provided therein which opening is right above the deflector portion 204 were formed in a pair at each end of the optical waveguide 204 having a width of 40 µm formed by using the photo mask. A bare surface-light emission laser chip (which emits light having a wavelength 850 nm with an emission spread angle of ±10° and a radiation intensity of 0 dBm) and a bare PIN photodiode chip (having a light receiving area of 38 µm) were mounted in the electrical circuit 206 by flip-chip mounting using solder balls. Then, it was confirmed that light emitted by the surface-light emission laser chip was received by the PIN photodiode chip at a level of −6.8 dBm through the pair of the deflector portions 205 and the optical waveguide 204.

Example 24

The supporting member 233 of a stainless steel subjected to the releasing treatment having a thickness of 100 µm was coated with the light permeable resin B by the roll transferring process to a thickness of 50 µm, which was cured by heating at 100° C. for 1 hour and then at 150° C. for 1 hour thereby to form the light permeable resin layer 217. The light permeable resin layer 217 was then coated with the varnish of photosensitive resin B to a thickness of 100 µm, which was heated to dry so as to form the optical circuit forming layer 201 having a thickness of 50±5 µm, over which the light permeable resin B was applied by the roll transferring process to a thickness of 50 µm and cured by heating at 100° C. for 1 hour and then at 150° C. for 1 hour thereby to form the second light permeable resin layer 223, over which a cover film 215 made of a transparent PET having a thickness of 25 µm was laminated by pressing with a roll, thereby to obtain the laminate structure 203 (FIG. 33(a)).

The laminated structure 203 obtained as described above was cut into a square sheet having a size of 6 cm×6 cm, and a photo mask was used which had twenty linear light transmittable slits having a width of 40 µm formed in parallel to each other at 250 µm intervals, as well as a light transmittable region for forming a reference mark having a cross shape of lines each having a width of 100 µm, which shape had a size as a whole of 500 µm×500 µm. After aligning the laminate with the photo mask so that all of the light transmittable slits as well as the light transmittable region for forming the reference mark were located in the area of the laminate structure 203, the photo mask was placed on the cover film 215 of the laminate structure 203 and the surface of the cover film 215 of the laminate structure 203 was irradiated through the photo mask with light generated by a high-pressure mercury vapor lamp having output power of 10 J/cm$^2$ (refer to FIG. 33(b) wherein the reference mark is not shown). Thus the core 204a of the optical waveguide 204 and the reference mark (not shown) were formed in the optical circuit forming layer 201.

Figure 33:
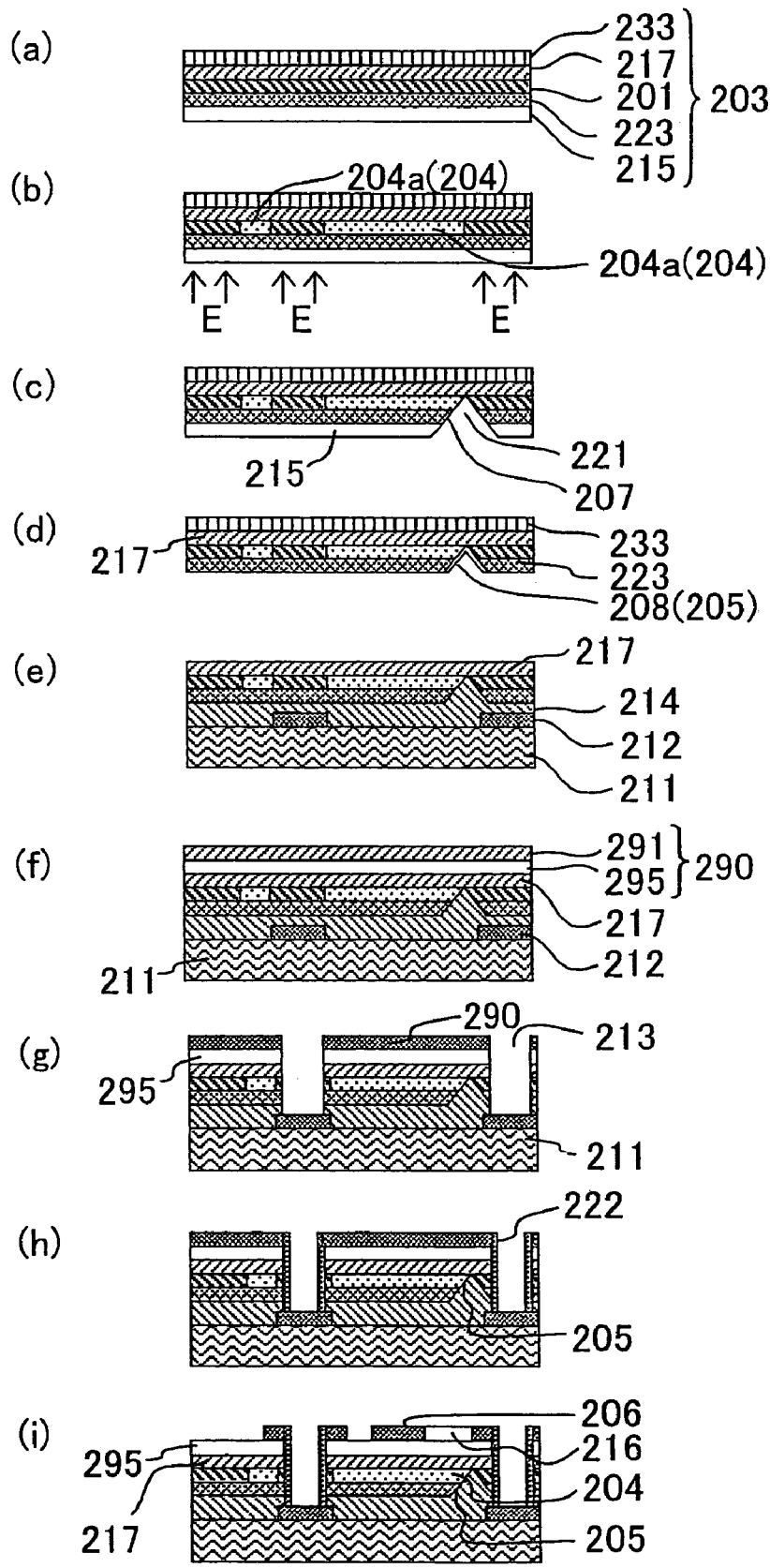

Then, the V-shaped groove 221 was formed with reference to the reference mark that was formed in the optical circuit forming layer 201 by using a blade having a cutting edge of which cutting edge had an apex angle of 90° (refer to FIG. 33(c)). DISCO's #5000 blade (Model No. B1E863 SD5000L100MT38) was used as the blade, and it was rotated at a speed of 30000 rpm. The blade 241 cut into the laminate structure 203 from its side of the cover film 215 with its lowering speed of 0.03 mm/s up to a depth of 100 µm, followed by moving over the laminate structure 203 at a speed of 0.1 mm/s to cross all of the twenty exposed portions 201a perpendicularly to them while keeping such cutting depth, before leaving the laminate structure 203.

The V-shaped grooves 221 thus formed showed a satisfactory surface roughness of 60 nm in terms of rms. Then a gold film having a thickness of 2000 Å deposited on the V-shaped groove 221 by the electron beam deposition at a rate of 8 Å/sec., thereby forming the light reflector 208 on the inclined surface 7 of the V-shaped groove 221 so as to form the deflector portion 205 (refer to FIG. 18(a)). Then, the cover film 215 was removed (refer to FIG. 33(d)).

Then, the second light permeable resin layer 223 of the laminate structure 203 was coated with the varnish of adhesive A to a thickness of 40 µm and dried at 150° C. to form the adhesive layer 214. By stacking the printed wiring board 211 of type FR-5 having the electrical circuit 212 provided thereon and the stacked structure 203 one on another and pressing them in vacuum at a temperature of 170° C., they were bonded together. Then, the supporting member 233 was removed (refer to FIG. 33(e)).

On the surface of the laminate structure 203 from which the supporting member 233 was removed, a copper foil 290 having a resin layer (that serves as an adhesive layer) 295 (ARCC R-0880 manufactured by Matsushita Electric Works, Ltd.) was pressed in vacuum at 170° C. for 1 hour (refer to FIG. 33(f)).

Then, after forming a reference guide and conformal mask holes having a diameter of 100 μm at the positions on this material 290 of the resin attached copper foil 291 where the via holes 213 were to be formed, the via holes 213 having an opening diameter of 100 μm were formed using excimer laser (refer to FIG. 33(g)). Then, the electrical conducting portions 222 were formed in the via holes 213 by applying the surface treatment with permanganate desmear followed by soft etching with sulfuric an acid-hydrogen peroxide system and panel plating (refer to FIG. 33(h)). Then, the electrical circuit 206 was formed by patterning of the cupper foil layer 291 of the resin layer 295 attached copper foil 290, thereby to obtain the optical circuit-electrical circuit mixedly mounting substrate (refer to FIG. 33(i)). 1 μg of the light permeable resin B was dropped onto a portion the surface of the adhesive 295 which portion was located right above the deflector portion 205 and cured by heating at 100° C. for 1 hour and then at 150° C. for 1 hour thereby to form the light permeable resin layer 216 (refer to FIG. 25(a)).

In the optical circuit-electrical circuit mixedly mounting substrate obtained as described above, the deflector portion 205 and the opening 231 having the light permeable resin 216 provided therein which opening is right above the deflector portion 204 were formed in a pair at each end of the optical waveguide 204 having a width of 40 μm formed by using the photo mask. A bare surface-light emission laser chip and a bare PIN photodiode chip were mounted as in Example 14. Then, it was confirmed that light emitted by the surface-light emission laser chip was received by the PIN photodiode chip at a level of −6.8 dBm through a pair of the pair of the deflector portion 205 and the optical waveguide 204.

This application claims priorities from Japanese Patent Application No. 2002-154809 (filed on May 28, 2002, Title of the Invention: Material for optical circuit-electrical circuit mixedly mounting substrate) and Japanese Patent Application No. 2002-154810 (filed on May 28, 2002, Title of the Invention: Method for manufacturing optical circuit-electrical circuit mixedly mounting substrate), the disclosures of which are incorporated by reference herein.

The invention claimed is:

1. A material for an optical circuit-electrical circuit mixedly mounting substrate comprising:

a light permeable resin layer, a metal layer which is to be formed into an electrical circuit, and an optical circuit forming layer that is made of a light permeable resin of which solubility to a solvent changes when irradiated with an activating energy beam and is disposed adjacent to the light permeable resin layer, wherein the light permeable resin layer is disposed between the metal layer and the optical circuit forming layer, wherein when the activating energy beam is applied to the material for the optical circuit-electrical circuit mixedly mounting substrate so that a portion of the optical circuit forming layer is irradiated with the activating energy beam, a refractive index of the optical circuit forming layer is higher than that of the light permeable resin layer;

said portion of the optical circuit forming layer irradiated with the activating energy beam changes from a state of being removable by dissolving into a solvent to a state of being insoluble; and the rest of the optical circuit forming layer that is not irradiated with the activating energy beam remains in the state of being removable by dissolving into the solvent.

2. The material for the optical circuit-electrical circuit mixedly mounting substrate according to claim 1 wherein an adhesive layer is provided adjacent to the metal layer and the adhesive layer is disposed between the metal layer and the optical circuit forming layer.

3. The material for the optical circuit-electrical circuit mixedly mounting substrate according to claim 1 further comprising a supporting member, wherein the supporting member constituting an exposed surface of the material for the optical circuit-electrical circuit mixedly mounting substrate on the side thereof nearer to the metal layer.

4. The material for the optical circuit-electrical circuit mixedly mounting substrate according to claim 1 further comprising a cover film, wherein the cover film constituting a surface of the material for the optical circuit-electrical circuit mixedly mounting substrate on the side thereof farther from the metal layer.

* * * * *